(12) United States Patent
Ha et al.

(10) Patent No.: US 9,627,202 B2
(45) Date of Patent: Apr. 18, 2017

(54) METHODS FOR FORMING FINE PATTERNS OF SEMICONDUCTOR DEVICE

(71) Applicants: SoonMok Ha, Hwaseong-si (KR); Sung-Wook Hwang, Seongnam-si (KR); Joonsoo Park, Seongnam-si (KR); Dae-Yong Kang, Suwon-si (KR); Byungjun Jeon, Anyang-si (KR)

(72) Inventors: SoonMok Ha, Hwaseong-si (KR); Sung-Wook Hwang, Seongnam-si (KR); Joonsoo Park, Seongnam-si (KR); Dae-Yong Kang, Suwon-si (KR); Byungjun Jeon, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/822,438

(22) Filed: Aug. 10, 2015

(65) Prior Publication Data
US 2016/0042965 A1    Feb. 11, 2016

(30) Foreign Application Priority Data
Aug. 11, 2014  (KR) .................. 10-2014-0103780

(51) Int. Cl.
*H01L 21/027* (2006.01)
*H01L 21/033* (2006.01)

(52) U.S. Cl.
CPC ...... *H01L 21/0271* (2013.01); *H01L 21/0334* (2013.01); *H01L 21/0337* (2013.01); *H01L 21/0338* (2013.01)

(58) Field of Classification Search
CPC ............... H01L 21/3086; H01L 21/266; H01L 21/0337; H01L 21/0338; H01L 21/3088; H01L 21/31144
See application file for complete search history.

(56) References Cited

U.S. PATENT DOCUMENTS

| 7,746,680 B2 | 6/2010 | Scheuerlein et al. |
| 8,101,261 B2 | 1/2012 | Millward et al. |
| 8,425,982 B2 | 4/2013 | Regner |
| 8,465,901 B2 | 6/2013 | Bae et al. |

(Continued)

FOREIGN PATENT DOCUMENTS

| JP | 2011071479 A | 4/2011 |
| JP | 5112500 B2 | 1/2013 |

(Continued)

*Primary Examiner* — Mohsen Ahmadi
(74) *Attorney, Agent, or Firm* — Myers Bigel, P.A.

(57) ABSTRACT

The inventive concept provides methods for forming fine patterns of a semiconductor device. The method includes forming a buffer mask layer having first holes on a hard mask layer including a first region and a second region around the first region, forming first pillars filling the first holes and disposed on the buffer mask layer in the first region and second pillars disposed on the buffer mask layer in the second region, forming a block copolymer layer covering the first and second pillars on the buffer mask layer, phase-separating the block copolymer layer to form first block patterns spaced apart from the first and second pillars and a second block pattern surrounding the first and second pillars and the first block patterns, removing the first block patterns, and forming second holes in the buffer mask layer under the first block patterns.

12 Claims, 65 Drawing Sheets

(56) References Cited

U.S. PATENT DOCUMENTS

| | | | |
|---|---|---|---|
| 8,481,429 B2 | 7/2013 | Kim et al. | |
| 8,486,512 B2 | 7/2013 | Black et al. | |
| 8,486,611 B2 | 7/2013 | Millward et al. | |
| 8,629,052 B2 * | 1/2014 | Park | H01L 21/0337 257/E21.158 |
| 8,778,598 B2 * | 7/2014 | Kang | G03F 7/0035 430/313 |
| 8,906,757 B2 * | 12/2014 | Kim | H01L 21/3081 257/E21.035 |
| 8,946,804 B2 * | 2/2015 | Sim | H01L 27/0207 257/315 |
| 8,986,554 B2 * | 3/2015 | Kim | 216/17 |
| 8,999,827 B2 * | 4/2015 | Hirota | H01L 21/76834 257/E21.579 |
| 9,093,378 B2 * | 7/2015 | Kim | H01L 21/283 |
| 9,093,454 B2 * | 7/2015 | Park | H01L 21/0337 |
| 9,099,470 B2 * | 8/2015 | Lee | H01L 21/0337 |
| 9,129,903 B2 * | 9/2015 | Seo | H01L 21/76816 |
| 9,159,560 B2 * | 10/2015 | Seo | H01L 21/0337 |
| 9,257,297 B2 * | 2/2016 | Gwak | H01L 21/0337 |
| 9,293,343 B2 * | 3/2016 | Lee | H01L 21/76816 |
| 9,385,134 B2 * | 7/2016 | Min | H01L 27/0203 |
| 2002/0051943 A1 * | 5/2002 | Tanaka | G03F 1/14 430/311 |
| 2012/0028476 A1 | 2/2012 | Li et al. | |
| 2012/0127454 A1 | 5/2012 | Nakamura et al. | |
| 2013/0256263 A1 | 10/2013 | Kihara et al. | |
| 2013/0273330 A1 | 10/2013 | Wang et al. | |
| 2013/0295772 A1 * | 11/2013 | Kim | H01L 21/308 438/694 |
| 2015/0104946 A1 * | 4/2015 | Park | H01L 21/0337 438/703 |
| 2016/0070838 A1 * | 3/2016 | Kang | G03F 1/00 438/703 |
| 2016/0070848 A1 * | 3/2016 | Kang | G06F 17/5081 716/52 |

FOREIGN PATENT DOCUMENTS

| | | |
|---|---|---|
| JP | 2013201356 A | 10/2013 |
| JP | 5528355 B2 | 6/2014 |
| KR | 20100127745 A | 12/2010 |
| KR | 20120126725 A | 11/2012 |
| KR | 101254389 B1 | 4/2013 |
| KR | 101262460 B1 | 5/2013 |
| KR | 20130124861 A | 11/2013 |

* cited by examiner

METHODS FOR FORMING FINE PATTERNS OF SEMICONDUCTOR DEVICE

CROSS-REFERENCE TO RELATED APPLICATION

This U.S. non-provisional patent application claims priority under 35 U.S.C. §119 to Korean Patent Application No. 10-2014-0103780, filed on Aug. 11, 2014, in the Korean Intellectual Property Office, the disclosure of which is hereby incorporated by reference in its entirety.

BACKGROUND

The inventive concepts relate to methods for forming a semiconductor device. More particularly, the inventive concepts relate to methods for forming fine patterns of a semiconductor device.

Semiconductor devices may include various patterns. Widths and spaces of the patterns may be reduced to manufacture a highly integrated semiconductor device. In addition, a pitch corresponding to a sum of a width of each of the patterns and a distance between patterns may be reduced to integrate a lot of patterns in a limited area. Recently, a design rule for semiconductor devices has been rapidly reduced. However, the formation of patterns having a fine pitch may be difficult by limitations of resolution of photolithography processes for defining patterns included in semiconductor devices.

SUMMARY

Embodiments of the inventive concepts may provide methods for forming fine patterns having a pitch smaller than the minimum pitch realized by a typical photolithography process.

In one aspect, a method for forming fine patterns may include: forming a buffer mask layer on a hard mask layer including a first region and a second region around the first region, the buffer mask layer having first holes in the first region; forming first pillars and second pillars, the first pillars filling the first holes and disposed on the buffer mask layer in the first region, the second pillars disposed on the buffer mask layer in the second region, the first pillars having a first width, and the second pillars having a second width smaller than the first width; forming a block copolymer layer covering the first and second pillars on the buffer mask layer; phase-separating the block copolymer layer to form first block patterns spaced apart from the first and second pillars and a second block pattern surrounding the first and second pillars and the first block patterns; and removing the first block patterns and forming second holes in the buffer mask layer under the first block patterns.

In some embodiments, each of the first pillars may include: a sacrificial pillar of which a lower portion fills each of the first holes of the buffer mask layer; and a spacer pattern surrounding an upper portion of the sacrificial pillar on the buffer mask layer.

In some embodiments, the first block pattern may be disposed among at least three of the first pillars, which are adjacent to each other.

In some embodiments, one of the second holes may be disposed at a first distance from one of the first holes adjacent thereto in a diagonal direction in the first region. One of the second holes disposed in an edge region of the second region may be disposed at a second distance from one of the second holes disposed in an edge region of the first region in the diagonal direction. The second distance may be greater than the first distance.

In some embodiments, widths of the first and second holes may be smaller than the first and second widths of the first and second pillars.

In some embodiments, forming the buffer mask layer having the first holes may include: forming a mask pattern on the buffer mask layer, the mask pattern including first openings having the first width in the first region; forming a spacer pattern having a gap region in each of the first openings, the gap region exposing a portion of the buffer mask layer; and etching the portions of the buffer mask layer exposed by the gap regions to form the first holes.

In some embodiments, the method may further include: forming a trimming mask pattern filling the second holes in the second region and covering the buffer mask layer second region, a sidewall of the trimming mask pattern being disposed between the second holes in the second region and the second holes disposed in an edge region of the first region when viewed from a plan view; and transferring the first and second holes of the buffer mask layer to the hard mask layer using the trimming mask pattern and the buffer mask layer as etch masks.

In another aspect, a method for forming fine patterns may include: forming a hard mask layer on a lower layer including a first region and a second region around the first region; forming a buffer mask pattern having first and second holes and dummy holes on the hard mask layer, the first and second holes arranged in lines at a first distance from each other in a diagonal direction in the first region, the dummy holes disposed in the second region being disposed at a second distance from the second holes disposed in an edge region of the first region, the first distance being smaller than the second distance; forming a trimming mask pattern filling the dummy holes and covering the buffer mask layer in the second region, a sidewall of the trimming mask pattern disposed between the dummy hole and the second hole disposed in the edge region of the first region when viewed from a plan view; and transferring the first and second holes of the buffer mask pattern to the hard mask layer using the trimming mask pattern and the buffer mask pattern as etch masks.

In some embodiments, widths of the dummy holes may be substantially equal to widths of the first and second holes.

In some embodiments, forming the buffer mask pattern may include: forming a buffer mask layer on the hard mask layer, the buffer mask layer having the first holes in the first region; forming first pillars and second pillars, the first pillars filling the first holes in the first region, the second pillars formed on the buffer mask layer in the second region, the first pillars having a first width greater than a width of the first holes, and the second pillars having a second width smaller than the first width; forming a block polymer layer covering the first and second pillars on the buffer mask layer; phase-separating the block polymer layer to form first block patterns spaced apart from the first and second pillars and a second block pattern surrounding the first block patterns and the first and second pillars, the first block patterns being aligned with the first and second pillars in the diagonal direction; and removing the first block patterns, wherein the second holes and the dummy holes are formed in the buffer mask layer using the second block pattern as an etch mask.

In some embodiments, each of the first pillars may include: a sacrificial pillar penetrating the buffer mask layer; and a spacer pattern surrounding the sacrificial pillar on the buffer mask layer.

In some embodiments, forming the buffer mask layer having the first holes may include: forming a mask pattern on the buffer mask layer, the mask pattern comprising: first openings having the first width in the first region; and second openings having the second width smaller than the first width in the second region; forming spacer patterns in the first openings and spacer pillars in the second openings, each of the spacer patterns having a gap region exposing a portion of the buffer mask layer; and etching portions of the buffer mask layer exposed by the gap regions to form the first holes.

In some embodiments, forming the spacer patterns and the spacer pillars may include: forming a spacer layer on the mask pattern, the spacer layer conformally covering inner surfaces of the first openings and filling the second openings; and anisotropically etching the spacer layer until a top surface of the mask pattern is exposed, thereby forming the spacer patterns and the spacer pillars.

In still another aspect, a method for forming fine patterns may include: sequentially forming a hard mask layer and a buffer mask layer on a lower layer including a first region and a second region around the first region; forming pillars and a dam pattern, the pillars arranged on the buffer mask layer of the first region, and the dam pattern disposed on the buffer mask layer of the second region to surround the first region; forming a block copolymer layer covering the pillars and the dam pattern on the buffer mask layer; and phase-separating the block copolymer layer to form first block patterns and a second block pattern surrounding the first block patterns, each of the first block patterns disposed among at least three pillars adjacent to each other. One of the pillars adjacent to the dam pattern may be disposed at a first distance from the dam pattern, and one of the first block patterns adjacent to the dam pattern may be disposed at a second distance from the dam pattern. The second distance may be greater than the first distance.

In some embodiments, the pillars may have a first width, and the dam pattern may have a second width not greater than the first width.

In some embodiments, forming the pillars may include: forming spacer patterns on the buffer mask layer, each of the spacer patterns having a gap region exposing a portion of the buffer mask layer; etching the buffer mask layer exposed by the gap regions to form first holes in the buffer mask layer of the first region; and forming sacrificial pillars filling the first holes and the gap regions.

In some embodiments, a width of at least one of the gap regions may be smaller than a width of the pillar and a width of the dam pattern.

In some embodiments, the method may further include: removing the first block patterns after forming the first and second block patterns; and etching portions of the buffer mask layer under the first block patterns to form second holes in the buffer mask layer of the first region.

In some embodiments, the method may further include: forming a trimming mask pattern covering the buffer mask layer in the second region after the formation of the second holes, a sidewall of the trimming mask pattern being disposed between the dam pattern and the second holes disposed in an edge region of the first region when viewed from a plan view; and transferring the first and second holes of the buffer mask layer to the hard mask layer using the trimming mask pattern and the buffer mask layer as etch masks.

In some embodiments, forming the pillars and the dam pattern may further include: forming dummy pillars on the buffer mask layer between the first region and the second region. Widths of the dummy pillars may be smaller than widths of the pillars and greater than widths of the first block patterns.

Other methods, systems, and/or devices according to embodiments of the inventive subject matter will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

The inventive concept will become more apparent in view of the attached drawings and accompanying detailed description.

FIGS. 1A to 9A are plan views illustrating a method for forming a fine pattern according to a first embodiment of the inventive concept;

FIGS. 1B to 9B are cross-sectional views taken along lines I-I' of FIGS. 1A to 9A, respectively;

FIGS. 10A to 17A are plan views illustrating a method for forming a fine pattern according to a second embodiment of the inventive concept;

FIGS. 10B to 17B are cross-sectional views taken along lines I-I' of FIGS. 10A to 17A, respectively;

FIGS. 18A to 23A are plan views illustrating a method for forming a fine pattern according to a third embodiment of the inventive concept;

FIGS. 18B to 23B are cross-sectional views taken along lines I-I' of FIGS. 18A to 23A, respectively;

FIGS. 24A to 29A are plan views illustrating a method for forming a fine pattern according to a fourth embodiment of the inventive concept;

FIGS. 24B to 29B are cross-sectional views taken along lines I-I' of FIGS. 24A to 29A, respectively;

DETAILED DESCRIPTION OF THE EMBODIMENTS

Figure 1A:
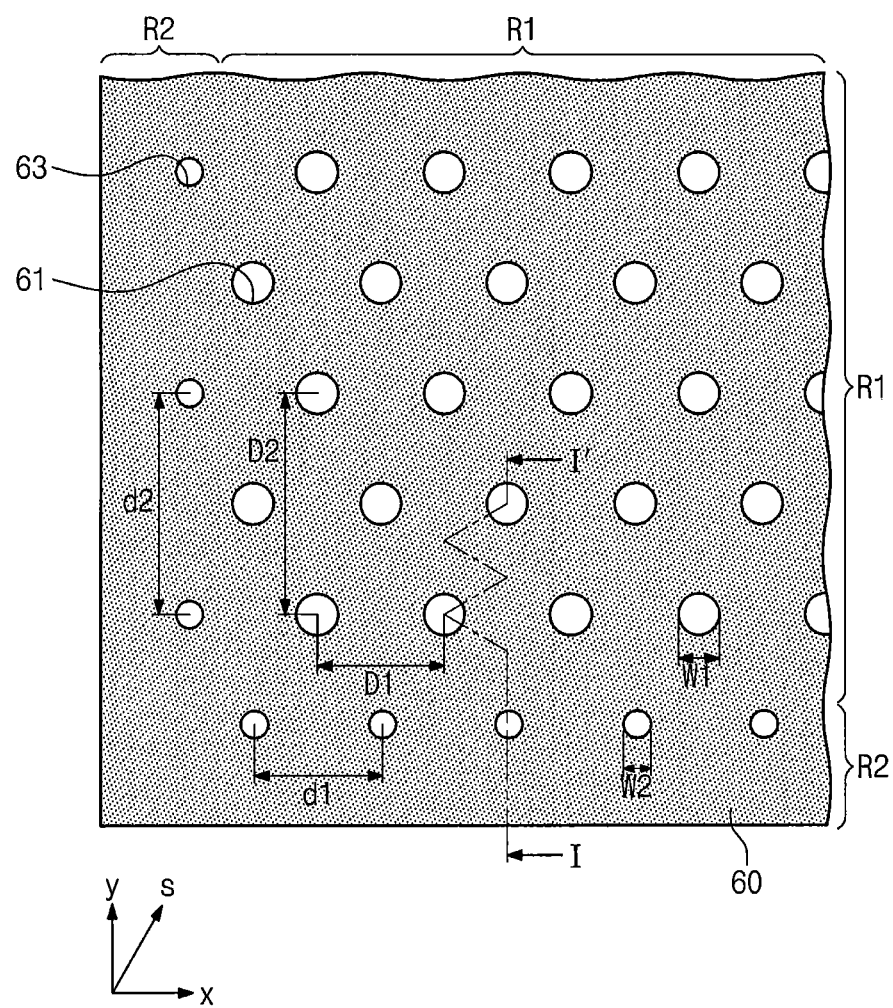

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. The term "directly" means that there are no intervening elements. It will be further understood that the terms "comprises", "comprising, ", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, fine pattern-forming methods according to embodiments of the inventive concept will be described in detail.

FIGS. 1A to 9A are plan views illustrating a method for forming a fine pattern according to a first embodiment of the inventive concept. FIGS. 1B to 9B are cross-sectional views taken along lines I-I' of FIGS. 1A to 9A, respectively.

Figure 1B:
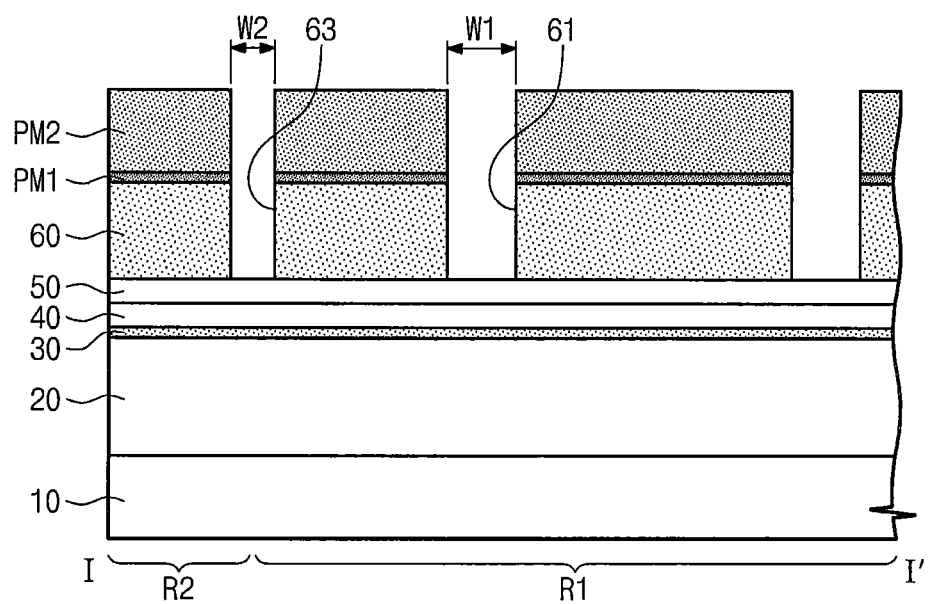

Referring to FIGS. 1A and 1B, a lower layer 20 may be provided on a substrate 10 including a first region R1 and a second region R2. Fine patterns will be formed in the first region R1, and the second region R2 may be around the first region R1.

According to embodiments of the inventive concept, the lower layer 20 may be formed of at least one of a semiconductor material, a conductive material, or an insulating material. If the lower layer 20 is formed of the semiconductor material, the lower layer 20 may be, for example, a portion of a semiconductor substrate 10 or an epitaxial layer formed on the semiconductor substrate 10. If the lower layer 20 is formed of the conductive material, the lower layer 20 may be formed of at least one of, but not limited to, doped poly-silicon, a metal silicide, a metal, or a metal nitride. If the lower layer 20 is formed of the insulating material, the lower layer 20 may be formed of at least one of silicon oxide, silicon nitride, silicon oxynitride, or a low-k material having a low dielectric constant. In other embodiments, the lower layer 20 may be formed of at least one of crystalline silicon, amorphous silicon, silicon doped with dopants, silicon-germanium, or a carbon-based material.

In some embodiments, the lower layer 20 may be a single layer, or a multi-layer including a plurality of stacked layers. For example, the lower layer 20 may include a plurality of stacked insulating layers and a conductive or semiconductor layer disposed between the stacked insulating layers. Alternatively, the lower layer 20 may include at least one of a semiconductor pattern, a conductive pattern, or an insulating pattern.

In some embodiments, a hard mask layer 40 and a buffer mask layer 50 may be sequentially stacked on the lower layer 20. In some embodiments, an etch stop layer 30 may also be formed between the lower layer 20 and the hard mask layer 40.

The etch stop layer 30 may be formed of a material having an etch selectivity with respect to the lower layer 20 and the hard mask layer 40. For example, the etch stop layer 30 may be formed of at least one of $SiO_2$, SiON, $Si_3N_4$, SiCN, or SiC.

The hard mask layer 40 may be formed of a material having an etch selectivity with respect to the lower layer 20 in a process of etching the lower layer 20. The hard mask layer 40 may be a single layer or a multi-layer including a plurality of stacked layers. A thickness of the hard mask layer 40 may be varied depending on a thickness and the material of the lower layer 20. For example, the hard mask layer 40 may include at least one silicon-containing material, such as poly-silicon, SiON, $Si_3N_4$, and SiCN. Alternatively, the hard mask layer 40 may include a spin-on-hardmask (SOH) layer or an amorphous carbon layer (ACL). The SOH layer may include a carbon-based SOH layer or a silicon-based SOH layer. In some embodiments, the hard mask layer 40 may be formed of poly-silicon.

The buffer mask layer 50 may be formed of a material having an etch selectivity with respect to the hard mask layer 40. For example, the buffer mask layer 50 may be formed of at least one of silicon, poly-silicon, $SiO_2$, SiON, $Si_3N_4$, SiCN, or SiC.

Referring still to FIGS. 1A and 1B, a mask pattern 60 may be formed on the buffer mask layer 50. The mask pattern 60 may have first openings 61 formed in the first region R1 and second openings 63 formed in the second region R2. The first and second openings 61 and 63 of the mask pattern 60 may expose portions of the buffer mask layer 50, respectively. Each of the first openings 61 may have a first width W1, and each of the second openings 63 may have a second width W2 smaller than the first width W1.

According to an embodiment, the mask pattern 60 may be formed using a photolithography process. In more detail, a mask layer may be formed on the buffer mask layer 50, and a photoresist pattern PM2 may be formed on the mask layer by the photolithography process. The mask layer may be etched using the photoresist pattern PM2 to form the mask pattern 60. In an embodiment, an anti-reflecting layer PM1 may be formed on the mask layer before the formation of the photoresist pattern PM2. In some embodiments, the widths and pitches of the first and second openings 61 and 63 of the mask pattern 60 may be determined depending on the limit of resolution (or the maximum resolution) of the photolithography process.

In an embodiment, the first openings 61 may be arranged in a honeycomb form or a zigzag form when viewed from a plan view. In more detail, the first openings 61 may be arranged along lines in a diagonal direction s with respect to first and second directions x and y perpendicular to each other when viewed from a plan view. A distance D1 between the first openings 61 in the first direction x may be smaller than a distance D2 between the first openings 61 in the second direction y. A distance between the first openings 61 in the diagonal direction s may be substantially equal to the distance D1 of the first openings 61. In addition, the minimum distance between the first openings 61 may be greater than the width W1 of the first openings 61. In embodiments of the inventive concept, the distances D1 and D2 of the first openings 61 mean distances between central points of the first openings 61, as illustrated in FIG. 1A.

In an embodiment, the second openings 63 may be aligned with the first openings 61 adjacent thereto in the diagonal direction s, respectively. A distance d1 between the second openings 63 in the first direction x may be substantially equal to the distance D1 between the first openings 61 in the first direction x. In addition, a distance d2 between the second openings 63 in the second direction y may be substantially equal to the distance D2 between the first openings 61 in the second direction y. In embodiments of the inventive concept, the distances d1 and d2 of the second openings 63 mean distances between central points of the second openings 63, as illustrated in FIG. 1A.

In an embodiment, a distance between the first and second openings 61 and 63 adjacent to each other in the diagonal direction s may be substantially equal to the distance d1 between the second openings 63 in the first direction x. Alternatively, the distance between the first and second openings 61 and 63 adjacent to each other in the diagonal direction s may be greater than the distance d1 between the second openings 63 in the first direction x Referring to FIGS. 2A and 2B, the photoresist pattern PM2 and the anti-reflecting layer PM1 are removed, and then a spacer layer 70 may be conformally formed on the mask pattern 60. The spacer layer 70 may be deposited on sidewalls and bottom surfaces of the first openings 61 with a generally uniform thickness t. In addition, the spacer layer 70 may fill the second openings 63. In an embodiment, the deposition thickness t of the spacer layer 70 may be greater than about half the width W2 of the second openings 63 and smaller than about half the width W1 of the first openings 61. In some embodiments, sizes of fine patterns to be formed in a subsequent process may be controlled depending on the deposition thickness t of the spacer layer 70. The spacer layer 70 may be formed of a material having an etch selectivity with respect to the mask pattern 60. In an embodiment, the spacer layer 70 may be formed of a material capable of inducing self-assembly of a block copolymer. For example, the spacer layer 70 may be formed of at least one of silicon, poly-silicon, $SiO_2$, SiON, $Si_3N_4$, SiCN, or SiC.

Figure 3A:
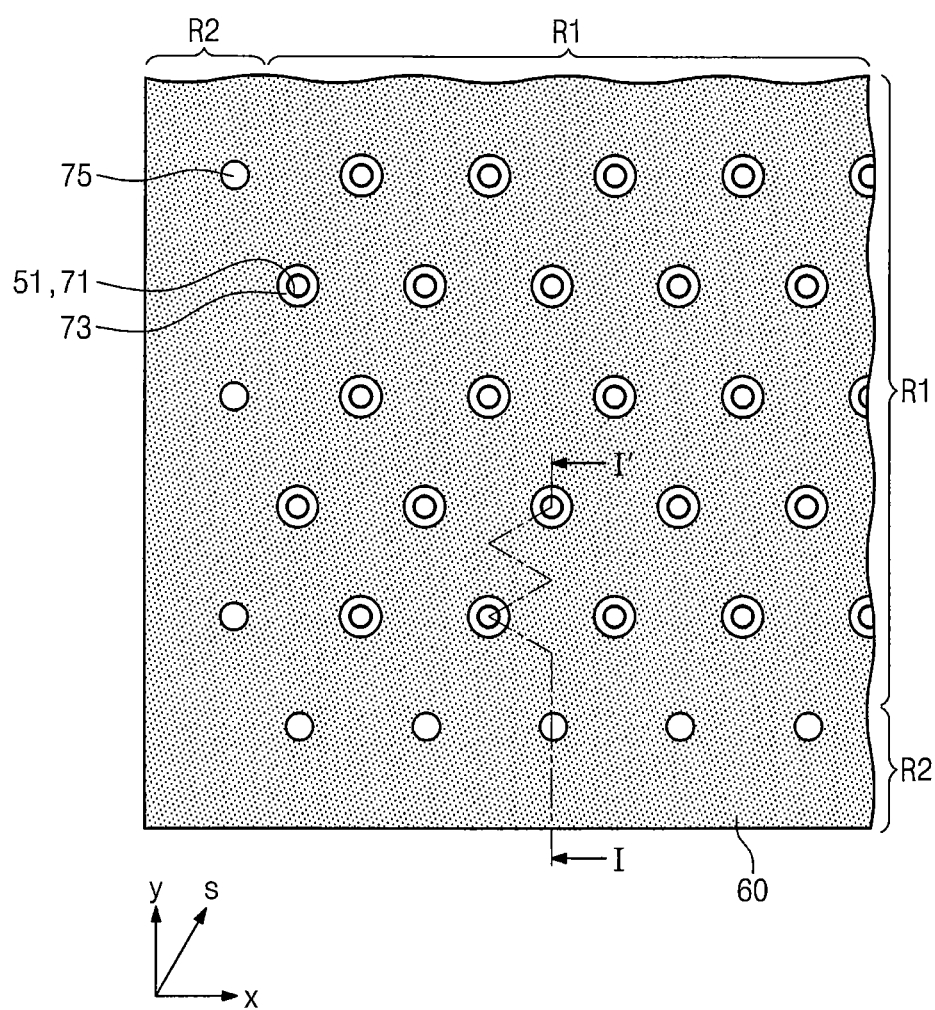
Figure 3B:
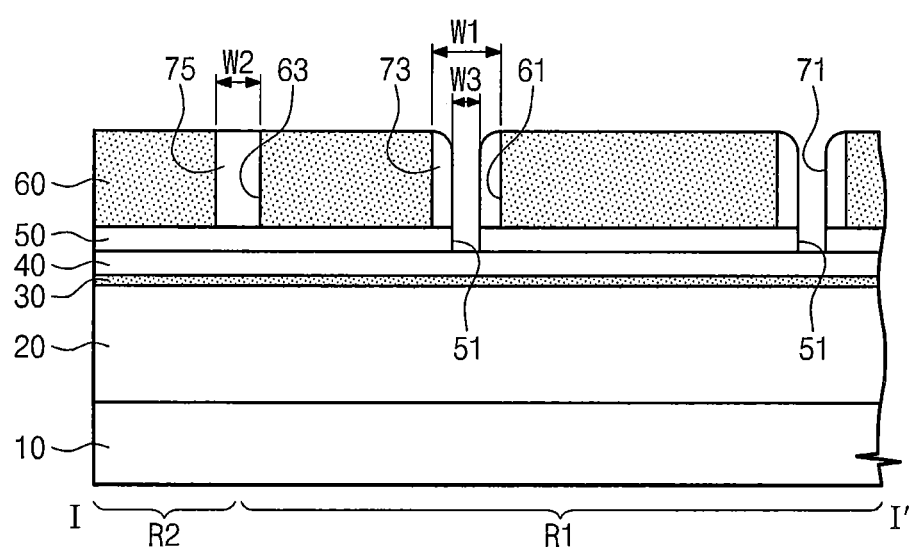

Referring to FIGS. 3A and 3B, a blanket anisotropic etching process (e.g., an etch-back process) may be performed on the spacer layer 70 until portions of the buffer mask layer 50 are exposed. At this time, the spacer layer 70 disposed on a top surface of the mask pattern 60 and the bottom surfaces of the first openings 61 may be substantially uniformly etched, so a spacer pattern 73 having a gap region 71 exposing the portion of the buffer mask layer 50 may be formed in each of the first openings 61. At the same time, a spacer pillar 75 may be formed in each of the second openings 63. Because the spacer pillars 75 fill the second openings 63, the buffer mask layer 50 in the second region R2 may not be exposed.

In an embodiment, a width W3 of the gap region 71 of the spacer pattern 73 may be smaller than the width W1 of the first opening 61. In addition, the width W3 of the gap region 71 may be smaller than the width W2 of the second opening 63. For example, the width W3 of the gap region 71 may be in the range of about one-third (⅓) to about one-fifth (⅕) of the width W1 of the first opening 61.

Referring still to FIGS. 3A and 3B, the buffer mask layer 50 exposed by the gap regions 71 of the spacer patterns 73 may be anisotropically etched to form first holes 51 exposing the hard mask layer 40 in the buffer mask layer 50 of the first region R1. Because the second openings 63 are filled with the spacer pillars 75 during the formation of the first holes 51, the buffer mask layer 50 of the second region R2 may not be exposed.

In an embodiment, a distance between the first holes 51 may be substantially equal to the distance between the first openings 61. In other words, the first holes 51 may be arranged along lines in the diagonal direction s with respect to the first and second directions x and y perpendicular to each other. That is, the first holes 51 may be arranged in the honeycomb form or the zigzag form when viewed from a plan view. The distance between the first holes 51 means a distance between central points of the first holes 51. Widths of the first holes 51 may be substantially equal to the width W3 of the gap region 71. In other words, the width of the first hole 51 may be in the range of about one-third to about one-fifth of the width W1 of the first opening 61.

Figure 4A:
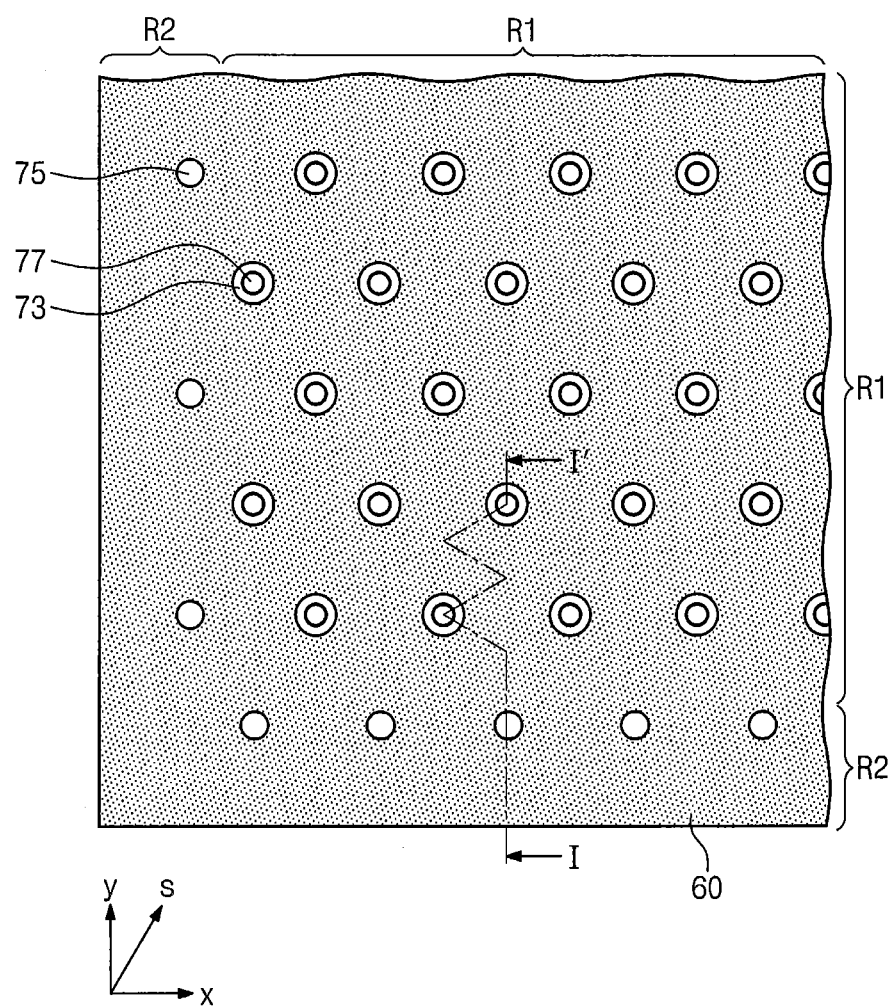
Figure 4B:
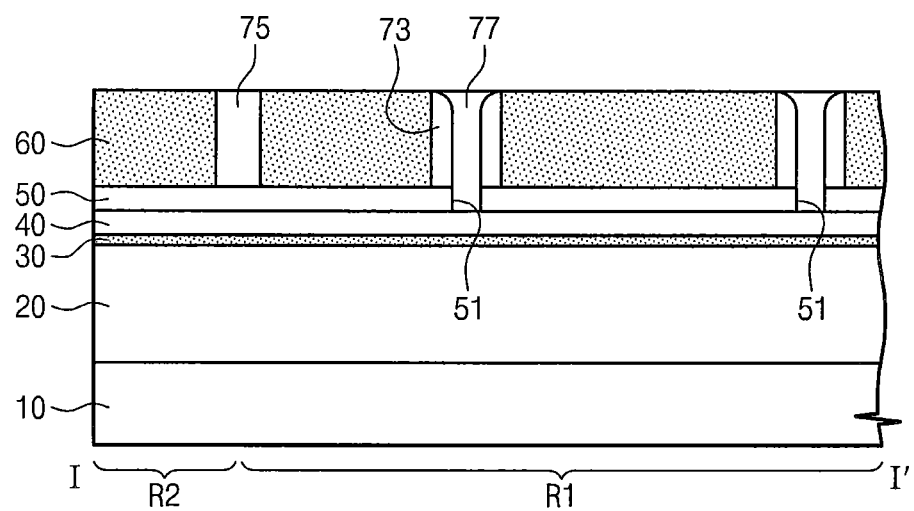

Referring to FIGS. 4A and 4B, sacrificial pillars 77 may be formed to fill the first holes 51 and the gap regions 71. For example, a sacrificial layer may be formed on the mask pattern 60 to fill the holes 51 and the gap regions 71, and a planarization process may be performed on the sacrificial layer until the top surface of the mask pattern 60 is exposed, thereby forming the sacrificial pillars 77.

In an embodiment, the sacrificial pillars 77 may be formed of a material having an etch selectivity with respect to the mask pattern 60. For example, the sacrificial pillars 77 may be formed of at least one of silicon, poly-silicon, $SiO_2$, SiON, $Si_3N_4$, SiCN, or SiC. In the present embodiment, the sacrificial pillars 77 may be formed of the same material as the spacer pattern 73.

Figure 5A:
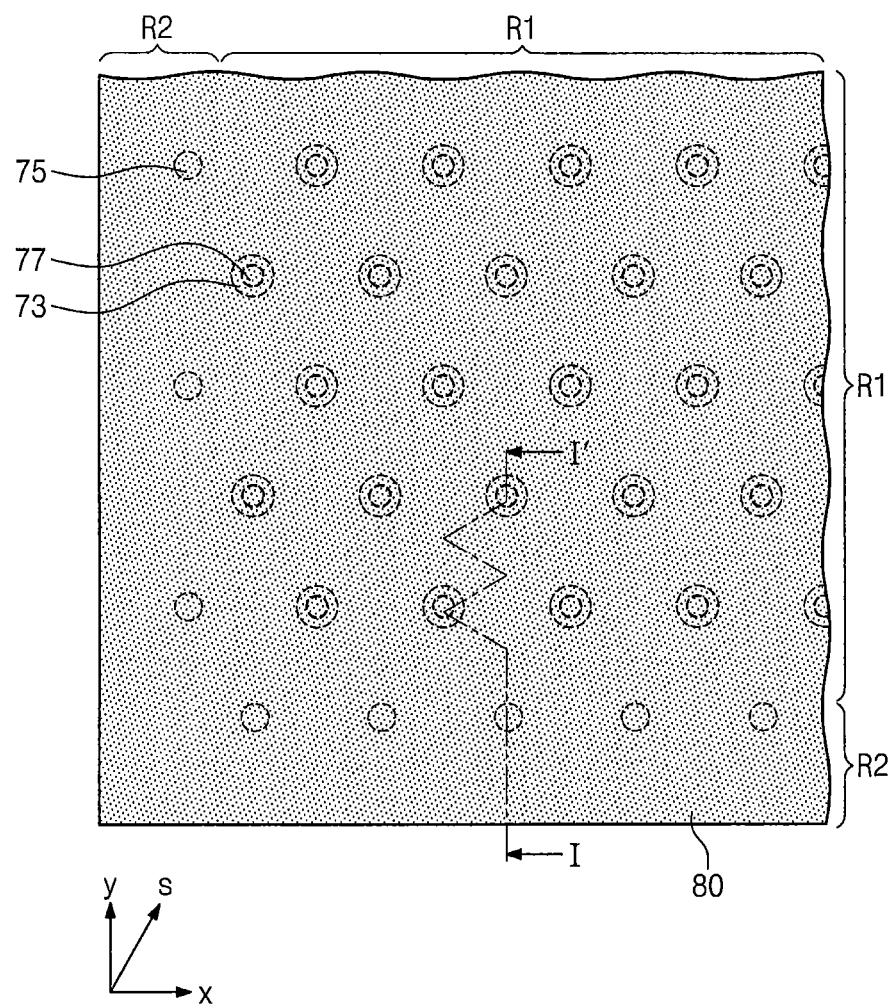
Figure 5B:
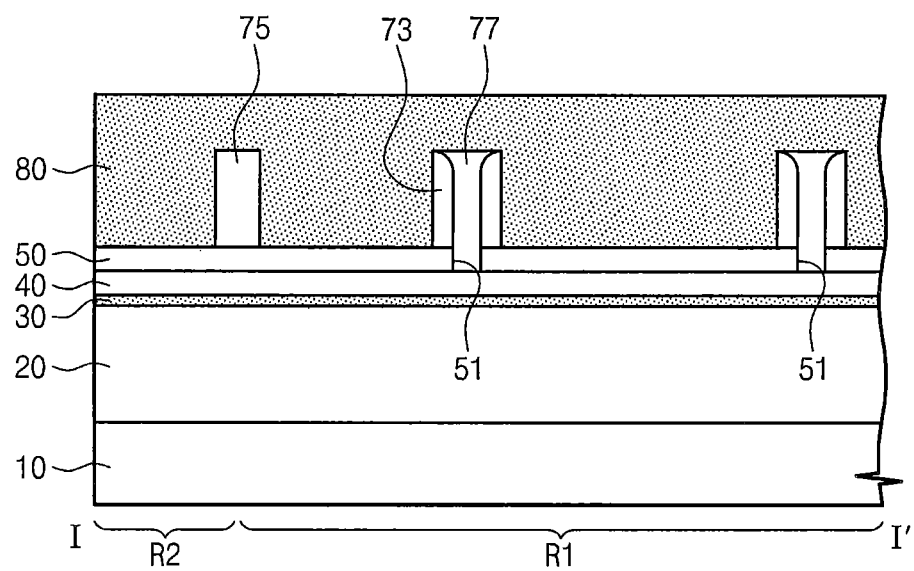

Referring to FIGS. 5A and 5B, the mask pattern 60 may be removed after the formation of the sacrificial pillars 77. The mask pattern 60 may be removed using an etch recipe having an etch selectivity with respect to the spacer patterns 73, the spacer pillars 75, and the sacrificial pillars 77, so the top surface of the buffer mask layer 50 may be exposed between the spacer patterns 73 and between the spacer pillars 75.

Subsequently, a block copolymer layer 80 may be formed on the buffer mask layer 50 to cover the spacer patterns 73, the spacer pillars 75, and the sacrificial pillars 77.

The block copolymer layer 80 may include two or more polymer blocks of which first ends are connected to each other by covalent bonding. Second ends of the polymer blocks may have repulsive forces to each other. In an embodiment, the block copolymer layer 80 may include a block copolymer having a first polymer block and a second polymer block that are covalently bonded to each other. The block copolymer layer 80 may be in a homogenous state that the first and second polymer blocks are randomly located. The first polymer block may have a hydrophile property, and the second polymer block may have a hydrophobic property. The first polymer block having the hydrophile property may have polarity. For example, the block copolymer may include polystyrene (PS)-polyimide (PI), polystyrene (PS)-polybutene (PB), polystyrene (PS)-poly(methyl methacrylate) (PMMA), poly(ethylenepropylene) (PEP)-poly(ethylethylene) (PEE), polyethylene (PE)-poly(ethylethylene) (PEE), or polystyrene (PS)-polydimethylsiloxane (PDMS).

In an embodiment, the block copolymer may be dissolved in a solvent. The solvent including the block copolymer may then be coated on the substrate 10 by a spin-coating method, thereby forming the block copolymer layer 80. The solvent may be mostly evaporated after the coating process.

Figure 6A:
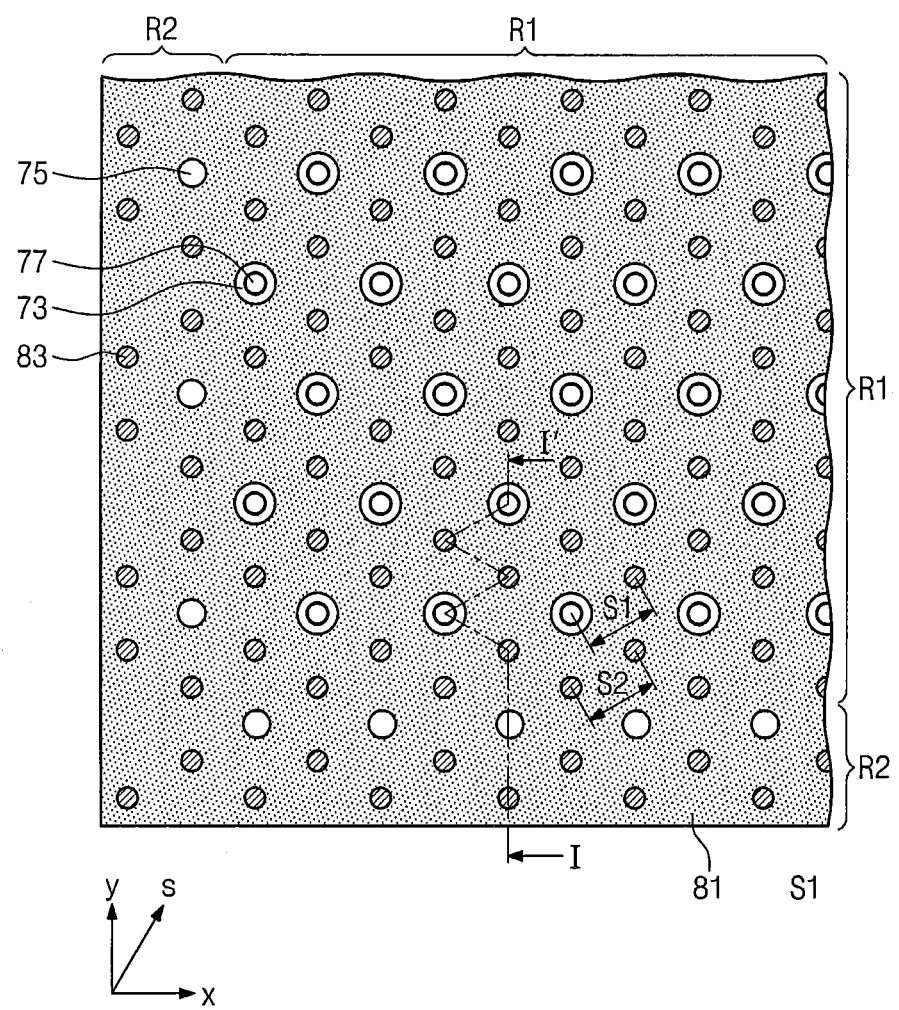
Figure 6B:
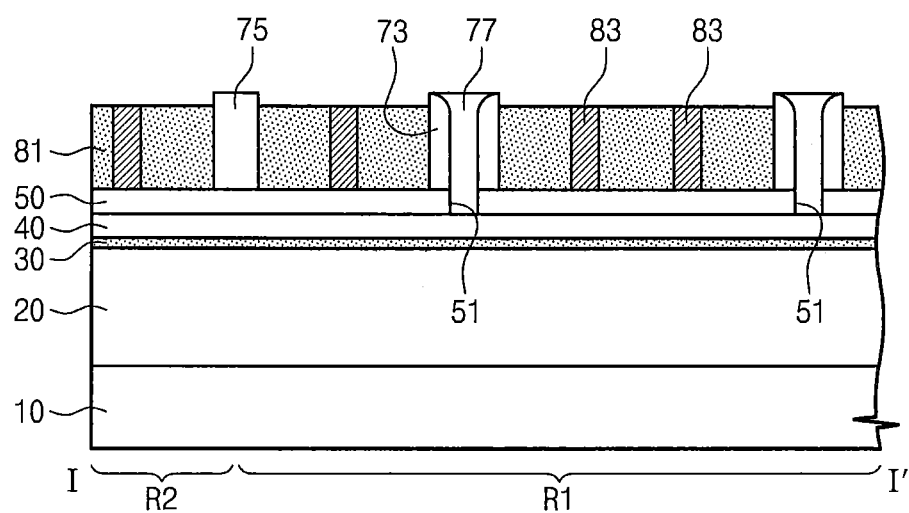

Referring to FIGS. 6A and 6B, the block copolymer layer 80 may be annealed to form first and second block patterns 81 and 83.

In more detail, the block copolymer layer 80 may be annealed by irradiating ultraviolet (UV) or applying heat to the block copolymer layer 80, so the state of block copolymer may be changed from the homogeneous state into a micro-phase separation state. The homogeneous state means that the first and second polymer blocks are randomly located, as described above. The micro-phase separation state means that the first and second polymer blocks are self-assembled to be divided into domains different from each other. As a result, the first and second block patterns 81 and 83 may be formed on the buffer mask layer 50. The first and second block patterns 81 and 83 may include polymer blocks having different properties from each other.

The first block pattern 81 may be in contact with sidewalls of the spacer patterns 73 and sidewalls of the spacer pillars 75, and the second block patterns 83 may be spaced apart from the sidewalls of the spacer patterns 73 and the sidewalls of the spacer pillars 75. The second block patterns 83 may have cylindrical shapes and may be spaced apart from each other by the first block pattern 81. A distance between the second block patterns 83 and distances between the second block patterns 83 and the sidewalls of the spacer patterns 73 and spacer pillars 75 may be controlled by a molecular weight of the polymer block of the second block patterns 83.

In an embodiment, the second block patterns 83 may be formed among three spacer patterns 73 adjacent to each other. A width of the second block pattern 83 may be substantially equal to a width of the sacrificial pillar 77 (i.e., the width of the first hole 51). A distance S1 between the sacrificial pillar 77 and the second block pattern 83 adjacent to each other in the diagonal direction s may be substantially equal to a distance S2 between the second block patterns 83 adjacent to each other in the diagonal direction s. In addition, a distance between the spacer pillar 75 and the second block pattern 83 adjacent to each other in the diagonal direction s may be substantially equal to the distance S2 between the second block patterns 83 adjacent to each other in the diagonal direction s. In embodiments of the inventive concept, the distance S1 between the sacrificial pillar 77 and the second block pattern 83 means a distance between a central point of the sacrificial pillar 77 and a central point of the second block pattern 83, as illustrated in FIG. 6A. The distance S2 of the second block patterns 83 means a distance between the central points of the second block patterns 83, as illustrated in FIG. 6A.

Figure 7A:
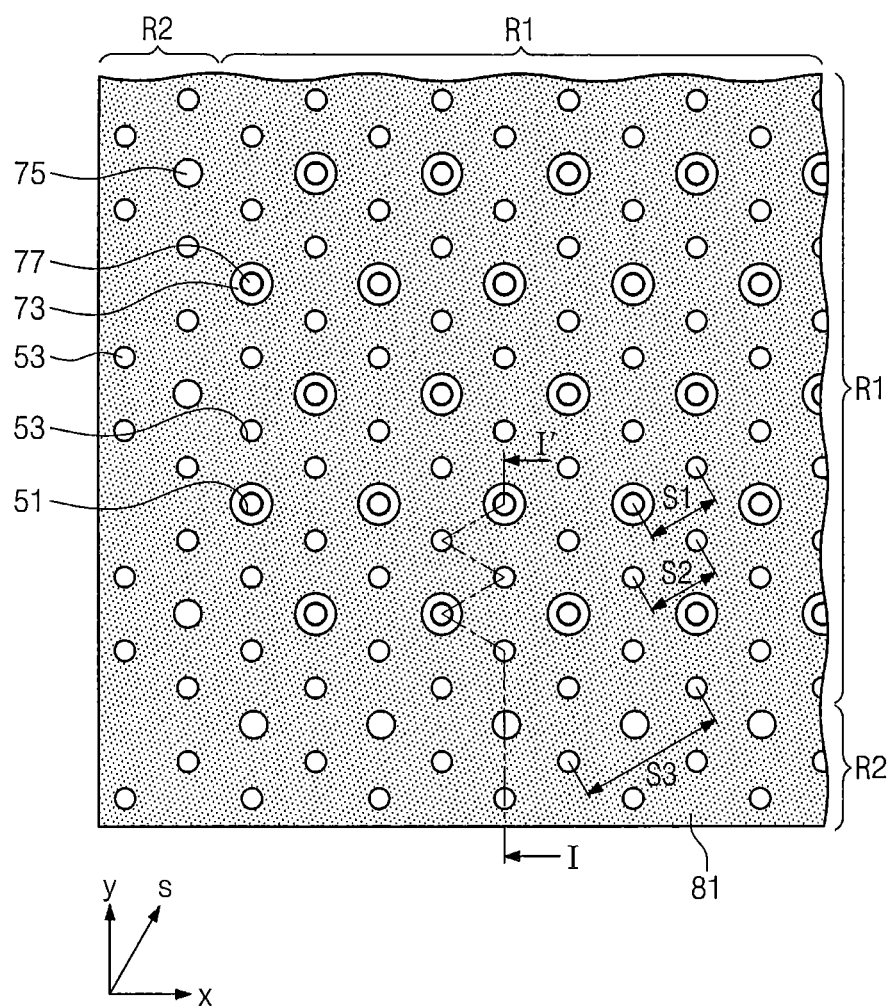
Figure 7B:
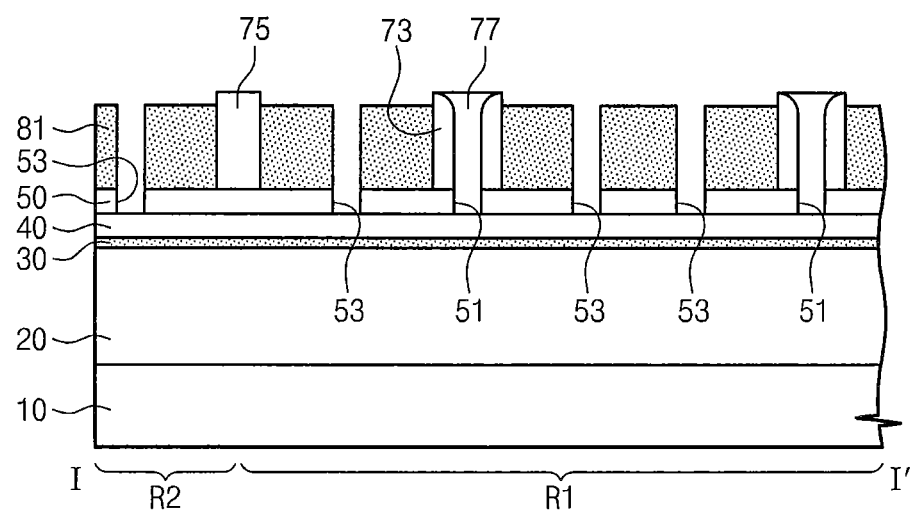

Referring to FIGS. 7A and 7B, the second block patterns 83 may be removed to expose portions of the buffer mask layer 50, and the exposed portions of the buffer mask layer 50 may be etched to form second holes 53. In some embodiments, the second block patterns 83 may be decomposed using ultraviolet (UV) or oxygen plasma, and the decomposed portions may be removed by a cleaning solution.

In some embodiments, the second holes 53 may be aligned with first holes 51 in the first region R1. Each of the second holes 53 may be disposed among three first holes 51 adjacent to each other in the first region R1. A width of the second holes 53 may be substantially equal to the width of the first holes 51.

In some embodiments, the second holes 53 may be disposed at a first distance S1 from the first holes 51 in the diagonal direction s in the first region R1. The second holes 53 adjacent to each other in the diagonal direction s may be spaced apart from each other by a second distance S2 in the first region R1. Here, the second distance S2 may be substantially equal to the first distance S1. On the other hand, at least one of the second holes 53 in the second region R2 may be spaced apart from the second holes 53 formed in an edge region of the first region R1 by a third distance S3 in the diagonal direction s. The third distance S3 may be greater than the first and second distances S1 and S2. In other words, a density of the first and second holes 51 and 53 disposed in a boundary region of the first and second regions R1 and R2 may be less than a density of the first and second holes 51 and 53 disposed within the first region R1. In embodiments of the inventive concept, the first distance S1 between the first hole 51 and the second hole 53 adjacent thereto means a distance between a central point of the first hole 51 and a central point of the second hole 53, as illustrated in FIG. 7A. Likewise, the second distance S2 between the second holes 53 adjacent to each other means a distance between the central points of the second holes 53 adjacent to each other. The third distance S3 between the second hole 53 of the first region R1 and the second hole 53 of the second region R2 means a distance between the central point of the second hole 53 of the first region R1 and the central point of the second hole 53 of the second region R2.

Figure 8A:
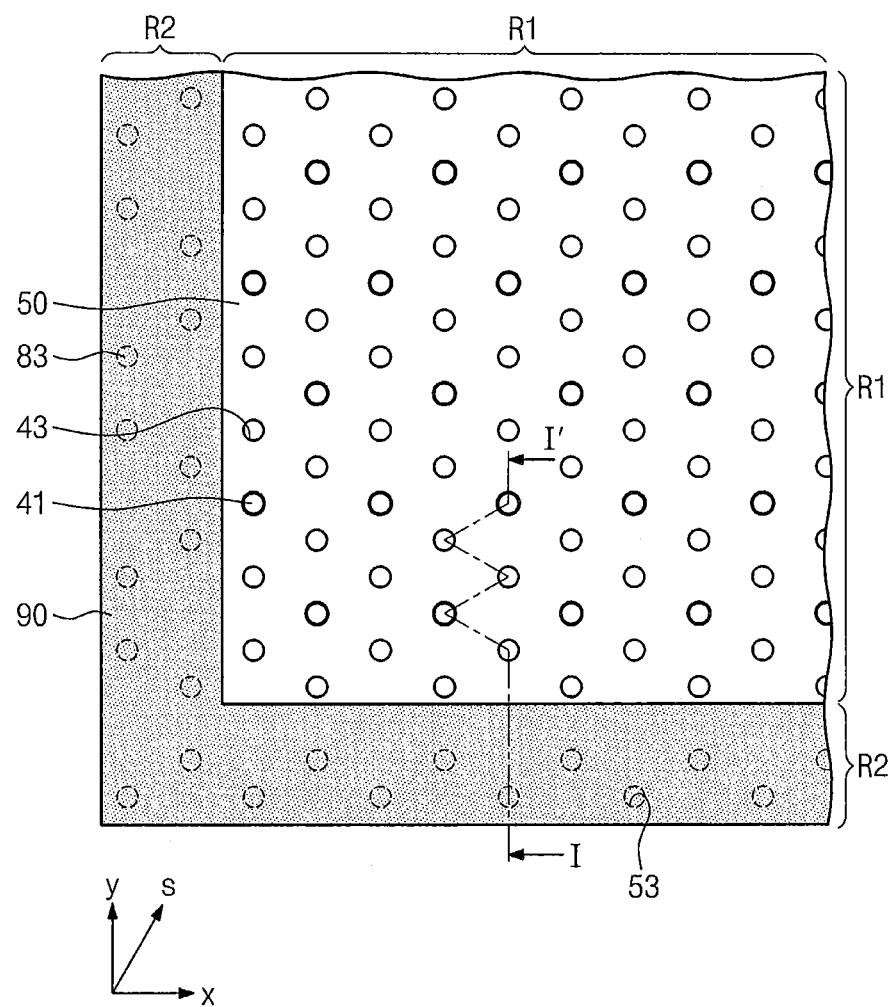
Figure 8B:
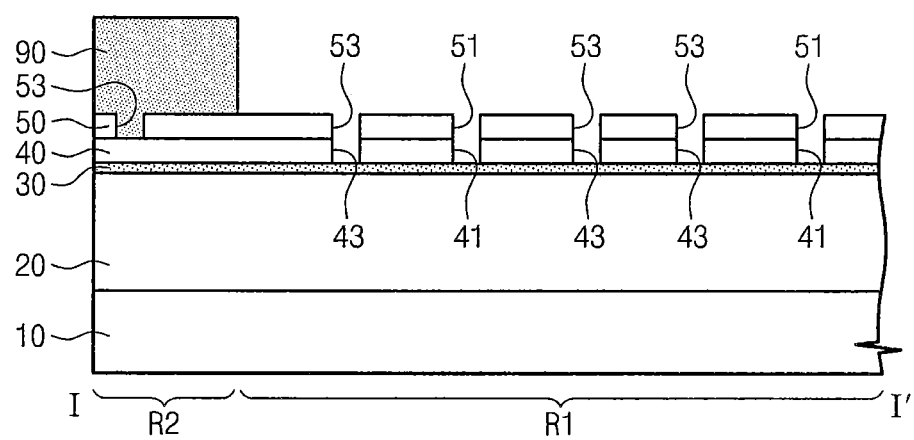

Referring to FIGS. 8A and 8B, the first block pattern 81, the spacer patterns 73, the spacer pillars 75, and the sacrificial pillars 77 may be removed after the second holes 53 are formed in the buffer mask layer 50. Thus, the first and second holes 51 and 53 of the buffer mask layer 50 may be exposed.

Next, a trimming mask pattern 90 may be formed on the buffer mask layer 50 having the first and second holes 51 and 53 to define a boundary of the first and second regions R1 and R2.

According to an embodiment, the trimming mask pattern 90 may fill the second holes 53 of the second region R2 and may cover the buffer mask layer 50 of the second region R2. In other words, the trimming mask pattern 90 may expose the first and second holes 51 and 53 formed in the first region R1. A sidewall of the trimming mask pattern 90 may be disposed between the second holes 53 of the second region R2 and the second holes 53 formed in the edge region of the first region R1.

According to an embodiment, the trimming mask pattern 90 may be formed using a photolithography process. In detail, forming the trimming mask pattern 90 may include forming a photoresist layer on the buffer mask layer 50 having the first and second holes 51 and 53, and performing the photolithography process on the photoresist layer to expose the buffer mask layer of the first region R1. According to embodiments of the inventive concept, the first holes 51 are not formed in the buffer mask layer 50 in the boundary region of the first and second regions R1 and R2. Thus, as described with reference to FIG. 7A, the distance between the second hole 53 formed in the edge region of the first region R1 and the adjacent second hole 53 formed in the second region R2 may be greater than the distance between the second holes 53 adjacent to each other within the first region R1. As a result, it is possible to increase an alignment margin of the sidewall of the trimming mask pattern 90 when the trimming mask pattern 90 is formed.

After the formation of the trimming mask pattern 90, the hard mask layer 40 exposed by the first and second holes 51 and 53 of the buffer mask layer 50 of the first region R1 may be anisotropically etched to form first and second fine holes 41 and 43 in the first region R1.

The first holes 51 of the buffer mask layer 50 may be transferred to the hard mask layer 40, thereby forming the first fine holes 41. The second holes 53 of the buffer mask layer 50 of the first region R1 may be transferred to the hard mask layer 40, thereby forming the second fine holes 43. Because the buffer mask layer 50 of the second region R2 is covered with the trimming mask pattern 90, the first and second fine holes 41 and 43 may be locally formed in the hard mask layer 40 of the first region R1.

In some embodiments, the first and second fine holes 41 and 43 may be arranged in a zigzag form or a honeycomb form in the first region R1. The first and second fine holes 41 and 43 may be arranged in lines along the diagonal direction s at regular intervals in the first region R1. In addition, widths of the first and second fine holes 41 and 43 may be substantially equal to the widths of the first and second holes 51 and 53. In other words, the widths of the first and second fine holes 41 and 43 may be smaller than a minimum width that can be realized by the photolithography process.

Figure 9A:
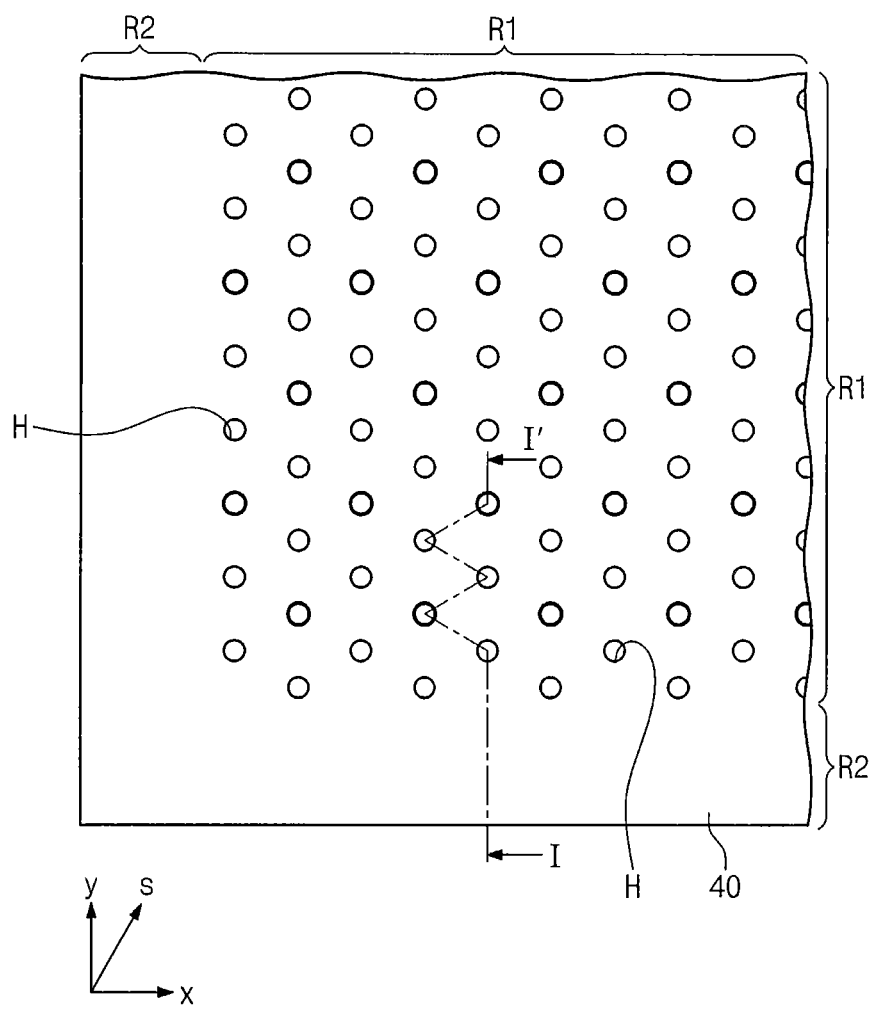
Figure 9B:
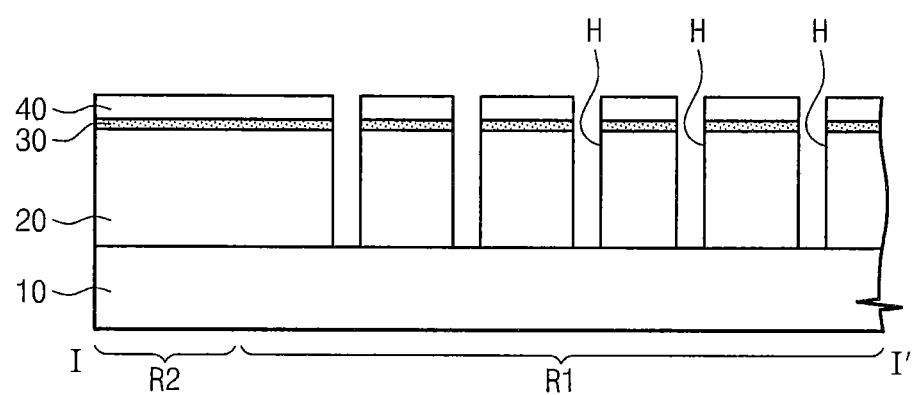

Referring to FIGS. 9A and 9B, the trimming mask pattern 90 and the buffer mask layer 50 may be removed using an etch recipe having an etch selectivity with respect to the hard mask layer 40 after the first and second fine holes 41 and 43 are formed in the hard mask layer 40 in the first region R1.

Next, the lower layer 20 may be anisotropically etched using the hard mask layer 40 having the first and second fine holes 41 and 43 of the first region R1 as an etch mask, so lower holes H may be formed in the lower layer 20 of the first region R1. In other words, the first and second fine holes 41 and 43 of the hard mask layer 40 may be transferred to the lower layer 20, thereby forming the lower holes H arranged in lines along the diagonal direction s at regular intervals. The lower holes H may be arranged in the zigzag form or the honeycomb form. In some embodiments, the lower holes H may correspond to fine patterns according to embodiments of the inventive concept. In some embodiments, the holes H formed in the lower layer 20 may expose the substrate 10. Widths of the lower holes H may be smaller than the minimum width realized by the photolithography process.

FIGS. 10A to 17A are plan views illustrating a method for forming a fine pattern according to a second embodiment of the inventive concept. FIGS. 10B to 17B are cross-sectional views taken along lines I-I' of FIGS. 10A to 17A, respectively.

Figure 10A:
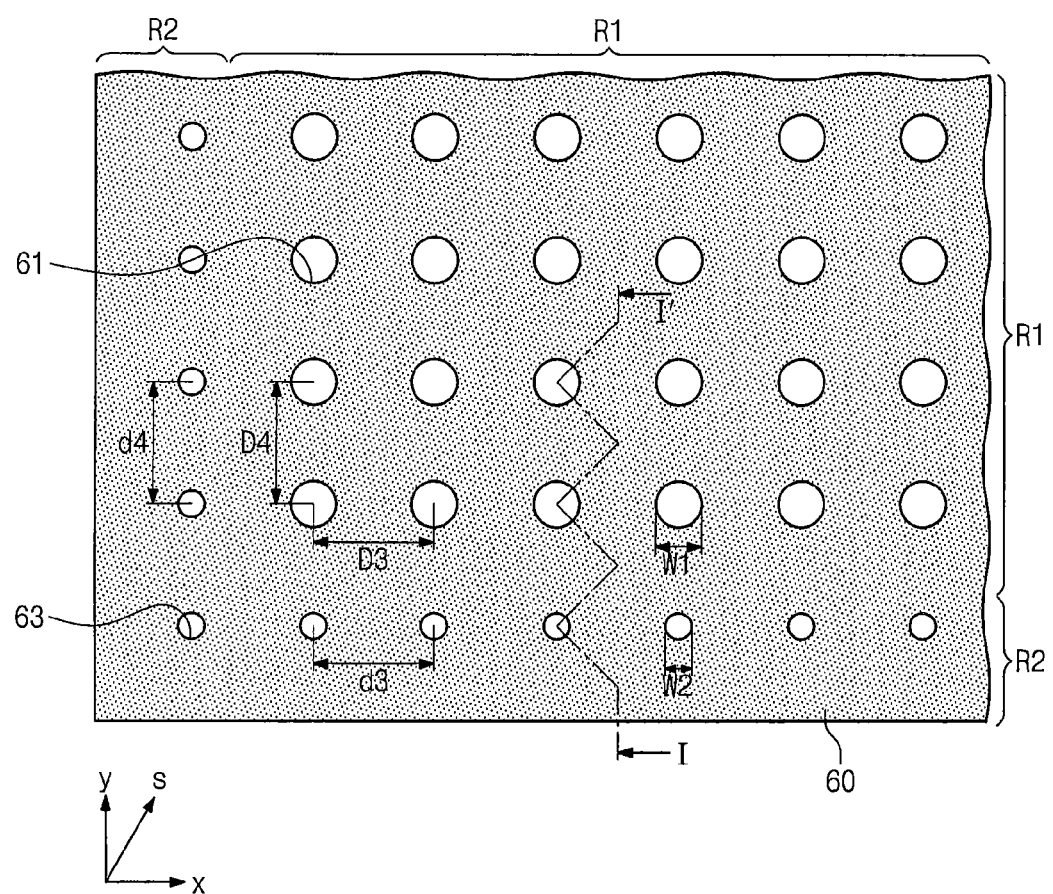
Figure 10B:
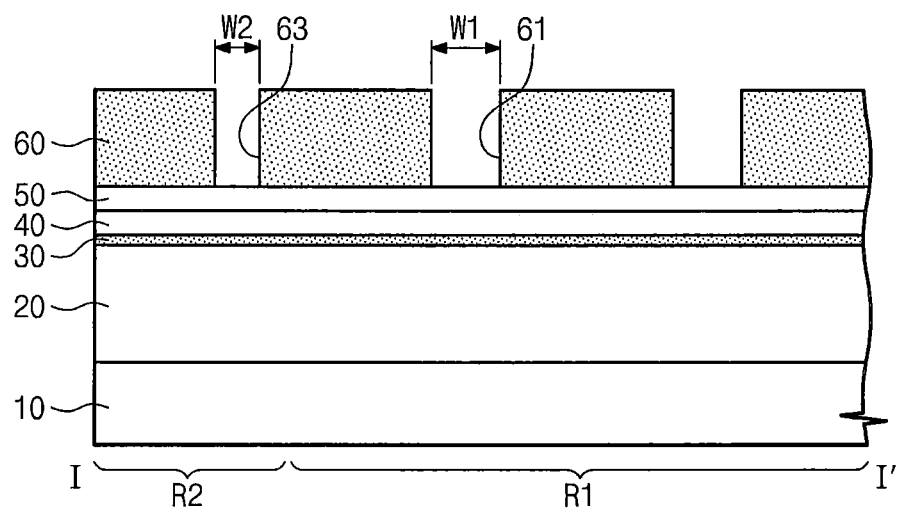

Referring to FIGS. 10A and 10B, a lower layer 20, an etch stop layer 30, a hard mask layer 40, and a buffer mask layer 50 may be sequentially formed on a substrate 10 including a first region R1 and a second region R2. Fine patterns will be formed in the first region R1, and the second region R2 may be around the first region R1.

A mask pattern 60 having first openings 61 and second openings 63 may be formed on the buffer mask layer 50. The first openings 61 may be formed in the first region R1, and the second openings 63 may be formed in the second region R2. As described with reference to FIGS. 1A and 1B, each of the first openings 61 may have a first width W1, and each of the second openings 63 may have a second width W2 smaller than the first width W1. The first and second openings 61 and 63 may expose portions of the buffer mask layer 50, respectively.

According to the present embodiment, the first openings 61 may be arranged along a first direction x and a second direction y perpendicular to each other. A distance D3 between the first openings 61 in the first direction x may be substantially equal to a distance D4 between the first openings 61 in the second direction y. In other words, the first openings 61 may be arranged in a square form in the first region R1. The second openings 63 may be arranged in the first and second directions x and y in the second region R2. A distance d3 between the second openings 63 adjacent to each other in the first direction x may be substantially equal to the distance D3 between the first openings 61 adjacent to each other in the first direction x. A distance d4 between the second openings 63 adjacent to each other in the second direction y may be substantially equal to the distance D4 between the first openings 61 adjacent to each other in the second direction y. In addition, a distance between the first opening 61 and the second opening 63 adjacent to each other in the first direction x may be substantially equal to the distance D3 between the first openings 61 adjacent to each other in the first direction x. A distance between the first opening 61 and the second opening 63 adjacent to each other in the second direction y may be substantially equal to the distance D4 between the first openings 61 adjacent to each other in the second direction y.

Figure 11A:
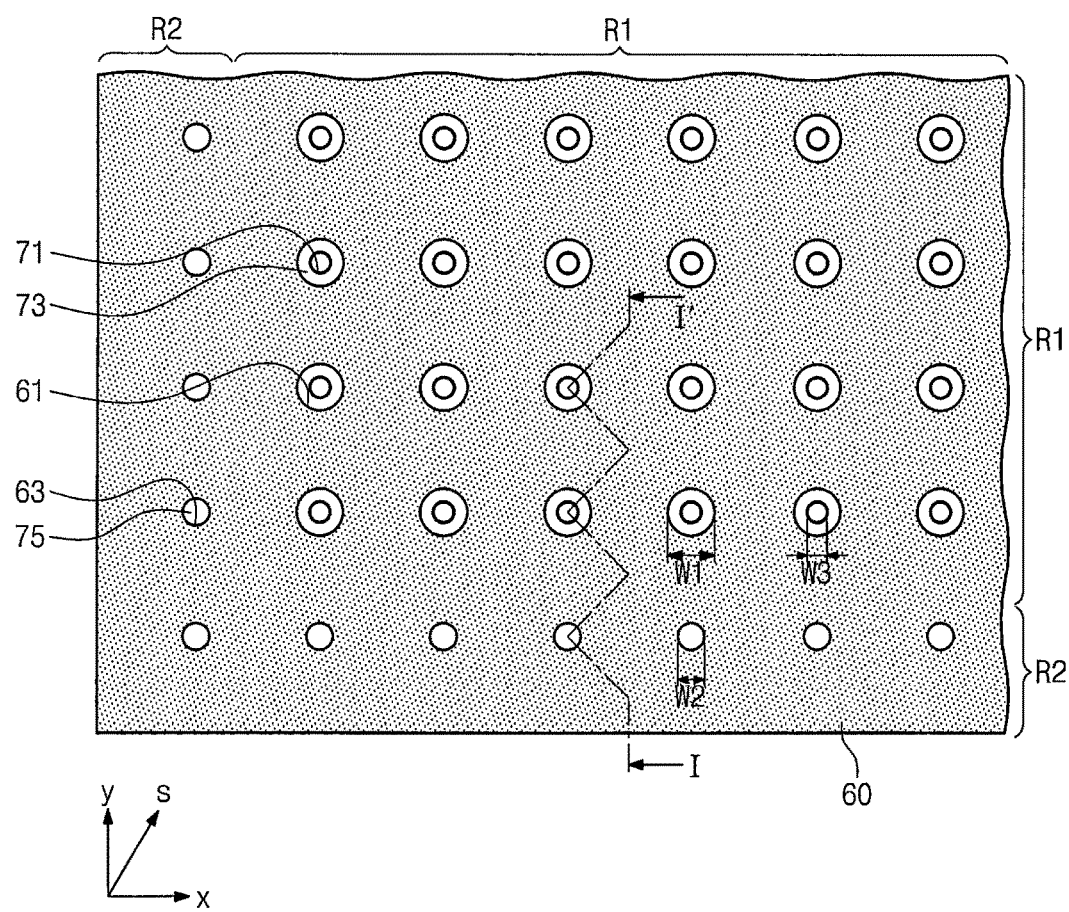
Figure 11B:
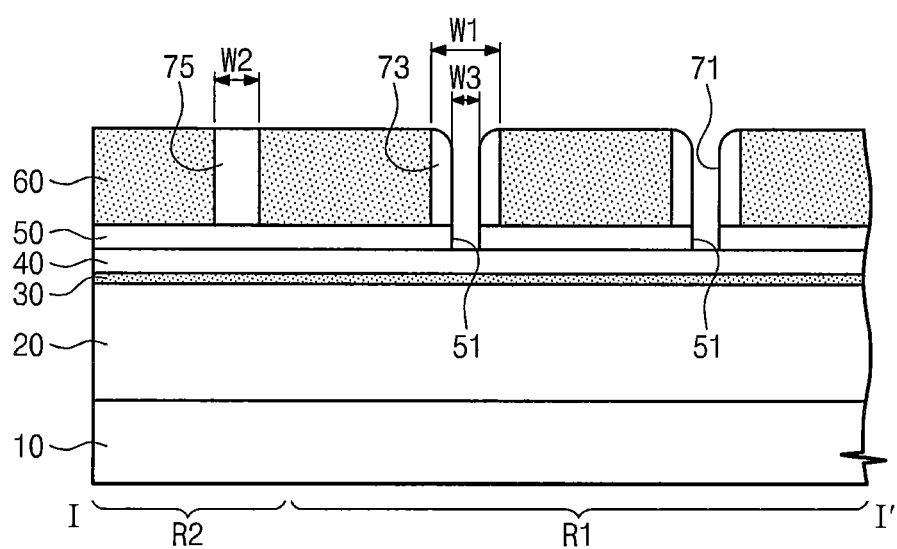

Referring to FIGS. 11A and 11B, a spacer pattern 73 having a gap region 71 may be formed in each of the first openings 61, and a spacer pillar 75 may be formed to fill each of the second openings 63. The gap region 71 may expose a portion of the buffer mask layer 50. A width W3 of the gap region 71 may be smaller than the widths W1 and W2 of the first and second openings 61 and 63.

Figure 2A:
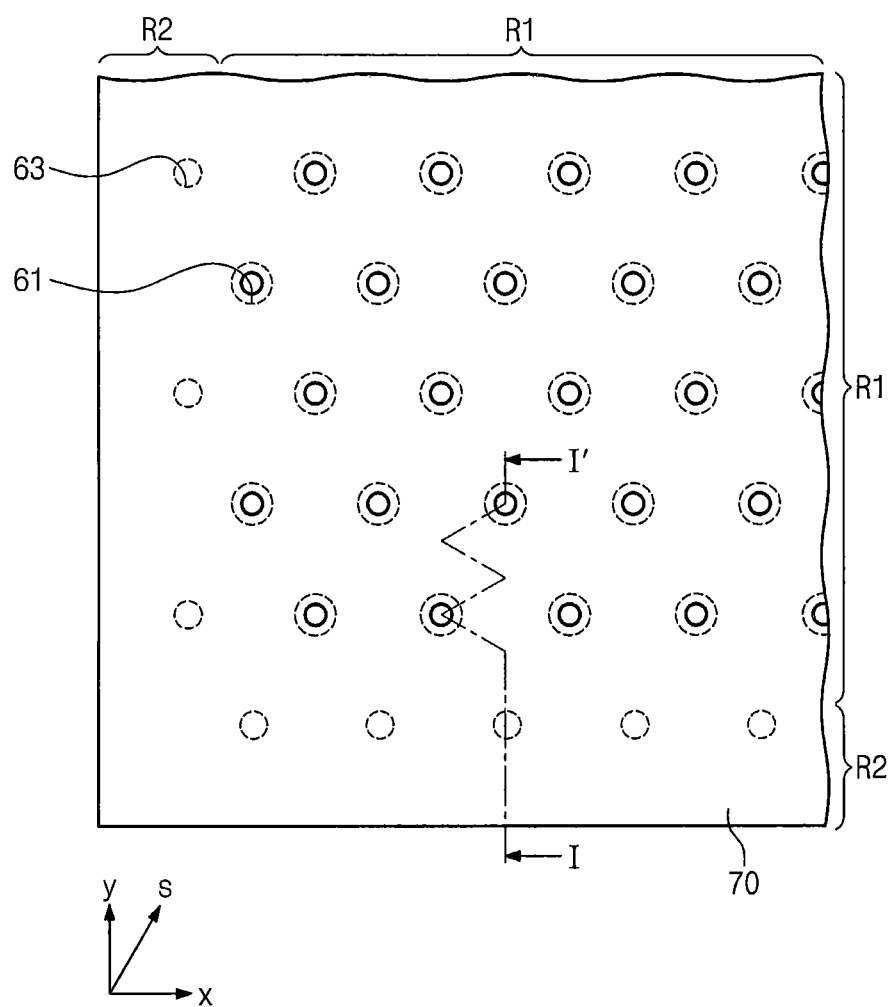
Figure 2B:
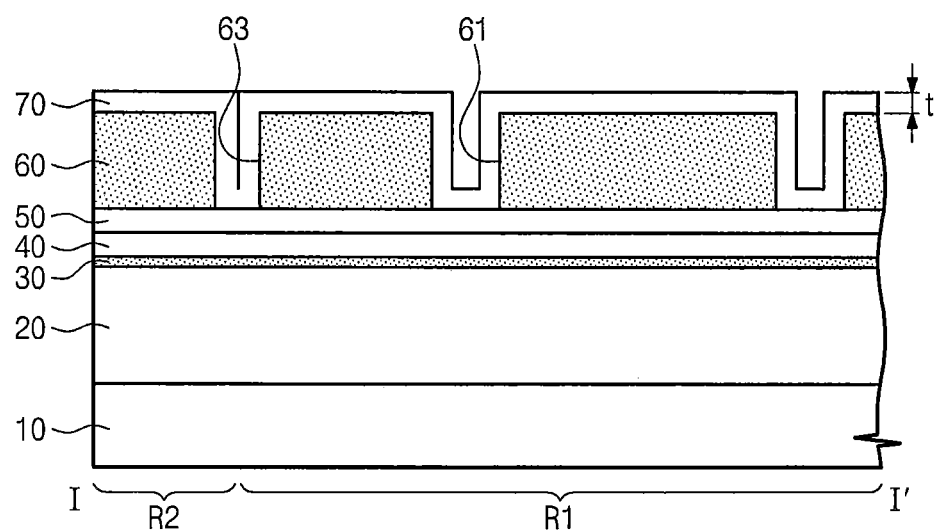

As described with reference to FIGS. 2A and 2B, the spacer layer 70 may be conformally deposited on the mask pattern 60 having the first and second openings 61 and 63, and the deposited spacer layer 70 may be anisotropically etched by a blanket etching process until the top surface of the mask pattern 60 is exposed, thereby forming the spacer patterns 73 and the spacer pillars 75. Here, the spacer layer 70 may completely fill the second openings 63 and may be conformally deposited on inner sidewalls and bottom surfaces of the first openings 61 with a substantially uniform thickness.

Subsequently, the buffer mask layer 50 exposed by the gap regions 71 of the spacer patterns 73 may be anisotropically etched to form first holes 51 exposing the buffer mask layer 50 of the first region R1. Because the second openings 63 are filled with the spacer pillars 75, the buffer mask layer 50 of the second region R2 may not be exposed during the formation of the first holes 51. The first holes 51 may be arranged in the first direction x and the second direction y. In the first and second directions x and y, distances between the first holes 51 may be substantially equal to the distances between the first openings 61. In other words, the first holes 51 may be arranged in a square form, and the distance between the first holes 51 in the first direction x may be substantially equal to the distance between the first holes 51 in the second direction y.

After the formation of the first holes 51, sacrificial pillars 77 may be formed to fill the first holes 51 and the gap regions 71, as described with reference to FIGS. 4A and 4B. The mask pattern 60 may be removed after the formation of the sacrificial pillars 77.

Figure 12A:
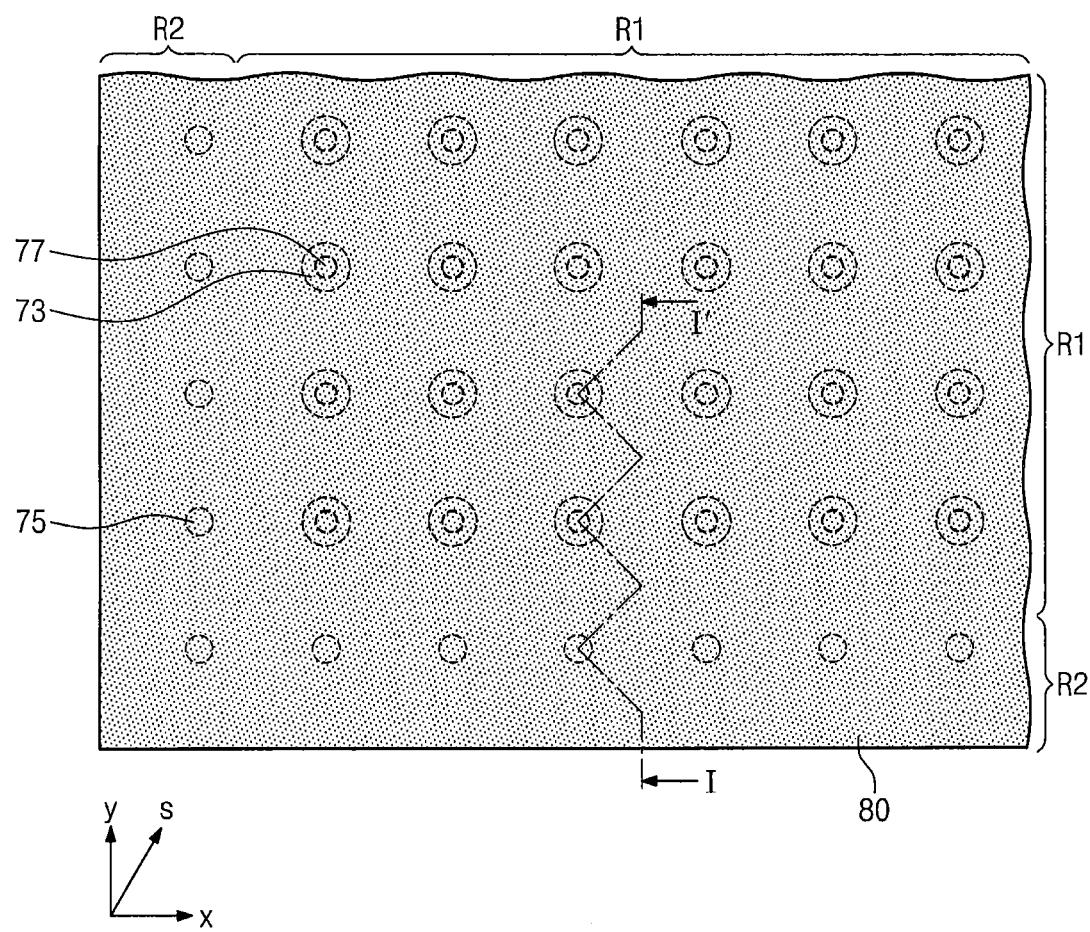
Figure 12B:
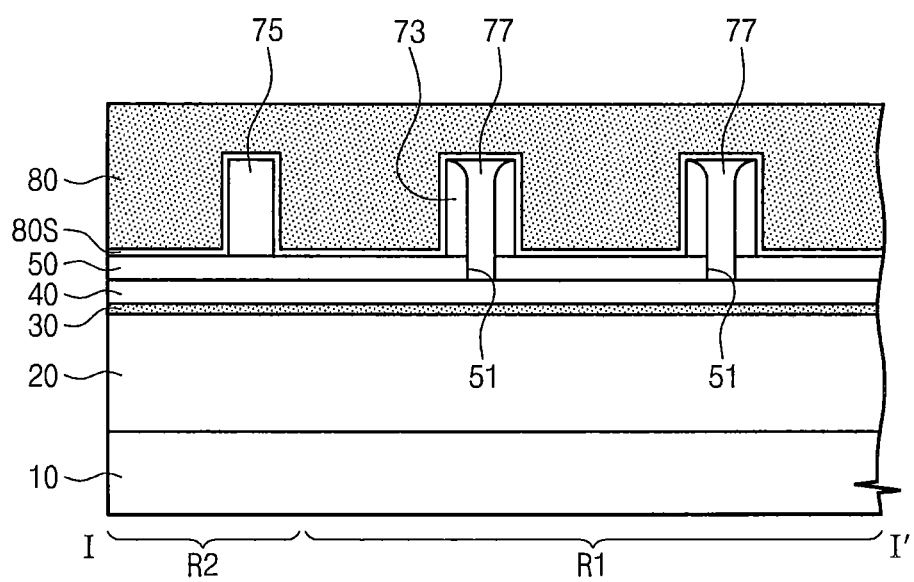

Referring to FIGS. 12A and 12B, a block copolymer layer 80 may be formed on the buffer mask layer 50 to cover the spacer patterns 73, the spacer pillars 75, and the sacrificial pillars 77. As described with reference to FIGS. 5A and 5B, the block copolymer layer 80 may include two or more polymer blocks of which first ends are connected to each other by covalent bonding. Second ends of the polymer blocks may have repulsive forces to each other. In an embodiment, the block copolymer layer 80 may include the block copolymer having the first polymer block and the second polymer block, which are covalently bonded to each other. Here, the first polymer block may have a hydrophile property, and the second polymer block may have a hydrophobic property.

According to the present embodiment, a buffer layer 80S may be formed to conformally cover the buffer mask layer 50, the spacer patterns 73, the spacer pillars 75, and the sacrificial pillars 77 before the formation of the block copolymer layer 80. The buffer layer 80S may be used to induce self-assembly of the polymer blocks. To achieve this, the buffer layer 80S may provide a surface having polarity. For example, the buffer layer 80S may have the hydrophile property and may include a polymer material.

Figure 13A:
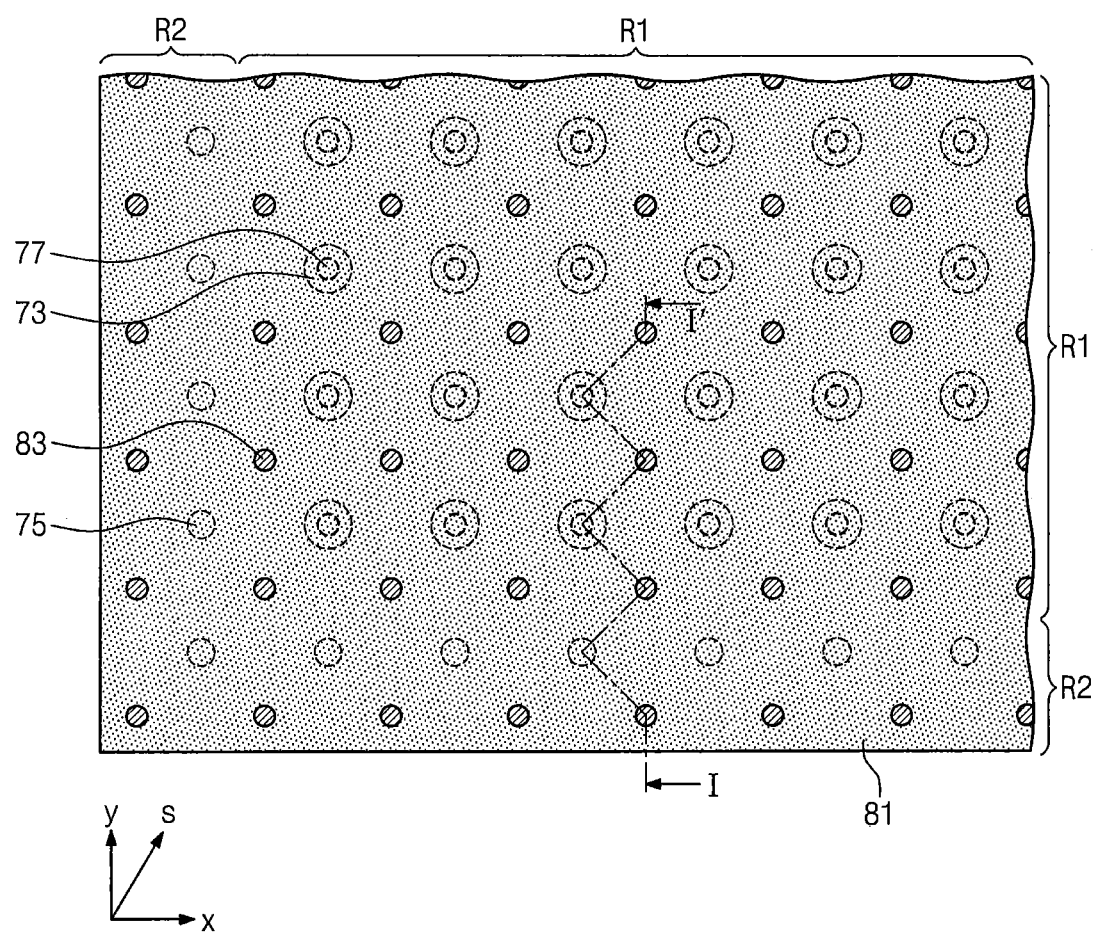
Figure 13B:
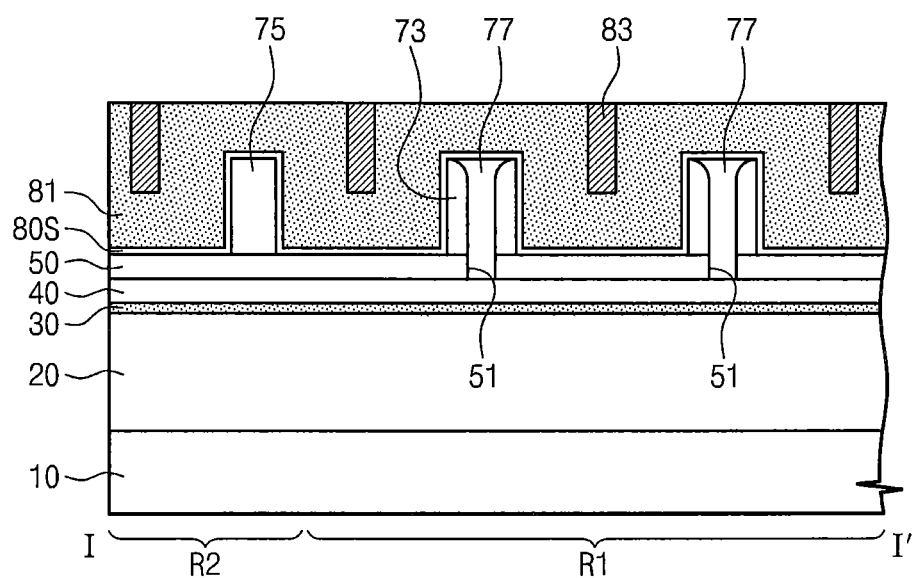

Referring to FIGS. 13A and 13B, the block copolymer layer 80 may be phase-separated to form a first block pattern 81 and second block patterns 83, as described with reference to FIGS. 6A and 6B.

The first block pattern 81 may include polymer blocks having a high affinity for the buffer layer 80S. Thus, the first block pattern 81 may be formed with a generally uniform thickness on the surface of the buffer layer 80S. The second block patterns 83 may be formed on the first block pattern 81 between the spacer patterns 73, between the spacer pillars 75, and between the spacer pattern 73 and the spacer pillar 75. The second block patterns 83 may have cylindrical shapes and may be spaced apart from each other by the first block pattern 81. Widths of the second block patterns 83 may be controlled according to a thickness of the buffer layer 80S and a molecular weight of the polymer block of the second block patterns 83.

In some embodiments, each of the second block patterns 83 may be formed among four spacer patterns 73 adjacent to each other. The width of the second block patterns 83 may be substantially equal to the width of the sacrificial pillars 77 (i.e., the width of the first holes 51). The second block patterns 83 may be arranged in the first direction x and the second direction y. A distance between the second block patterns 83 in the first direction x may be substantially equal to a distance between the second block patterns 83 in the second direction y.

Figure 14A:
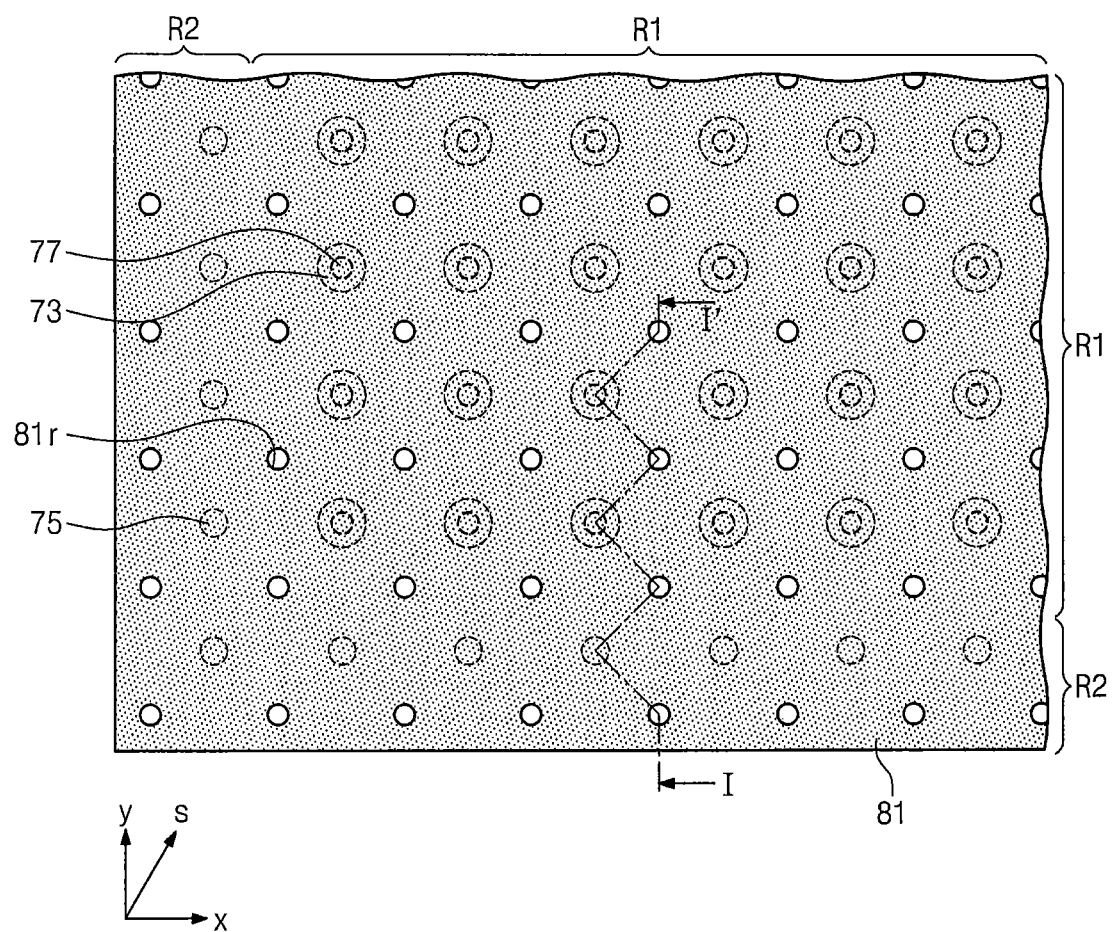
Figure 14B:
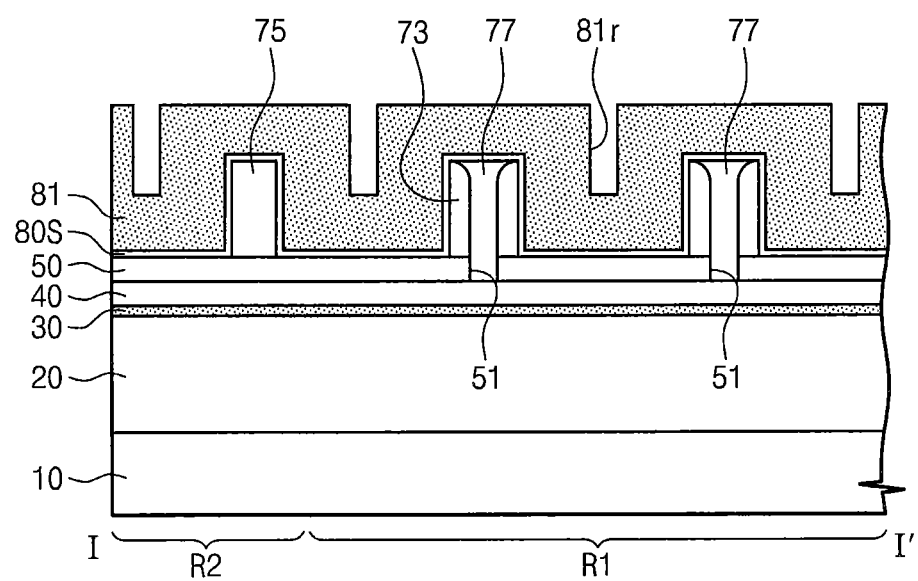

Referring to FIGS. 14A and 14B, the second block patterns 83 may be removed to expose the first block pattern 81 disposed under the second block patterns 83. In some embodiments, ultraviolet (UV) may be irradiated to the second block patterns 83 or the second block patterns 83 may be exposed in oxygen plasma, so the second block patterns 83 may be decomposed. The decomposed portions of the second block patterns 83 may be removed by a strip process using a cleaning solution, thereby removing the second block patterns 83. The first block pattern 81 may have recess regions 81r between the spacer patterns 73 after the removal of the second block patterns 83.

Figure 15A:
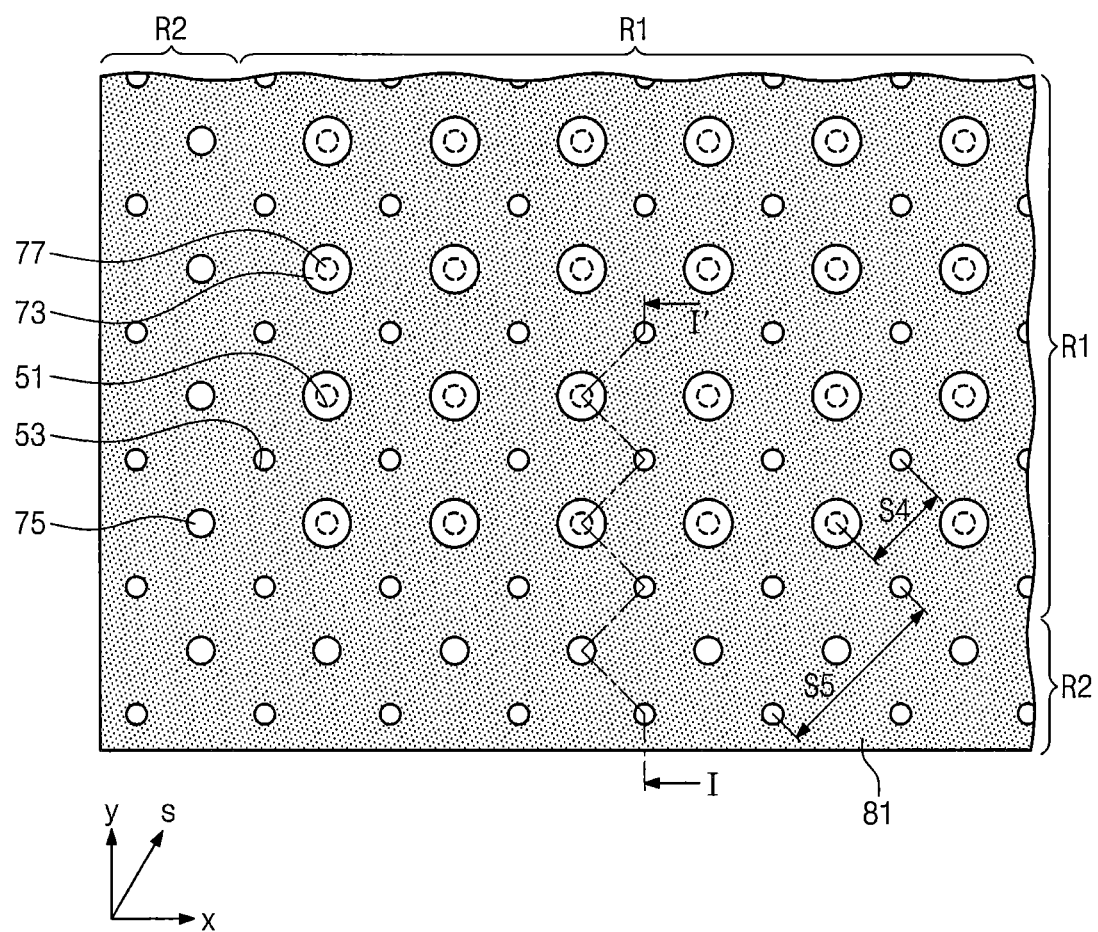
Figure 15B:
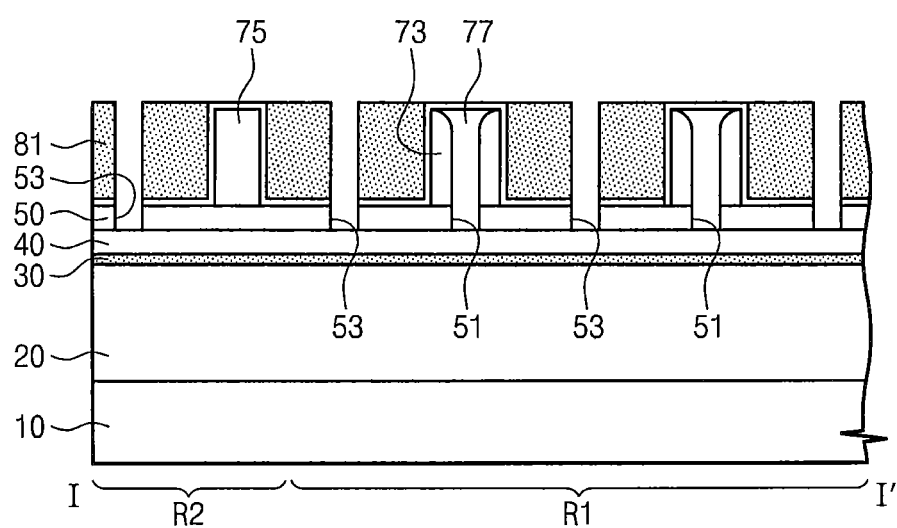

Referring to FIGS. 15A and 15B, a blanket anisotropic etching process may be performed on the first block pattern 81 having the recess regions 81r to expose portions of the buffer mask layer 50 under the recess regions 81r.

Next, the portions of the buffer mask layer 50, which are exposed by the first block pattern 81, may be etched to form second holes 53 in the buffer mask layer 50. According to the present embodiment, the second holes 53 may be arranged in the first and second directions x and y perpendicular to each other and may be spaced apart from the first holes 51 in the diagonal direction s. In other words, the first holes 51 and the second holes 53 may be alternately arranged along the diagonal direction s. A distance between the second holes 53 in the first direction x may be substantially equal to a distance between the second holes 53 in the second direction y.

The second hole 53 may be formed at a first distance S4 from the first hole 51 in the diagonal direction s in the first region R1. The second hole 53 of the second region R2 may be formed at a second distance S5 from the second hole 53 formed in an edge region of the first region R1 in the diagonal direction s. The second distance S5 may be greater than the first distance S4.

Figure 16A:
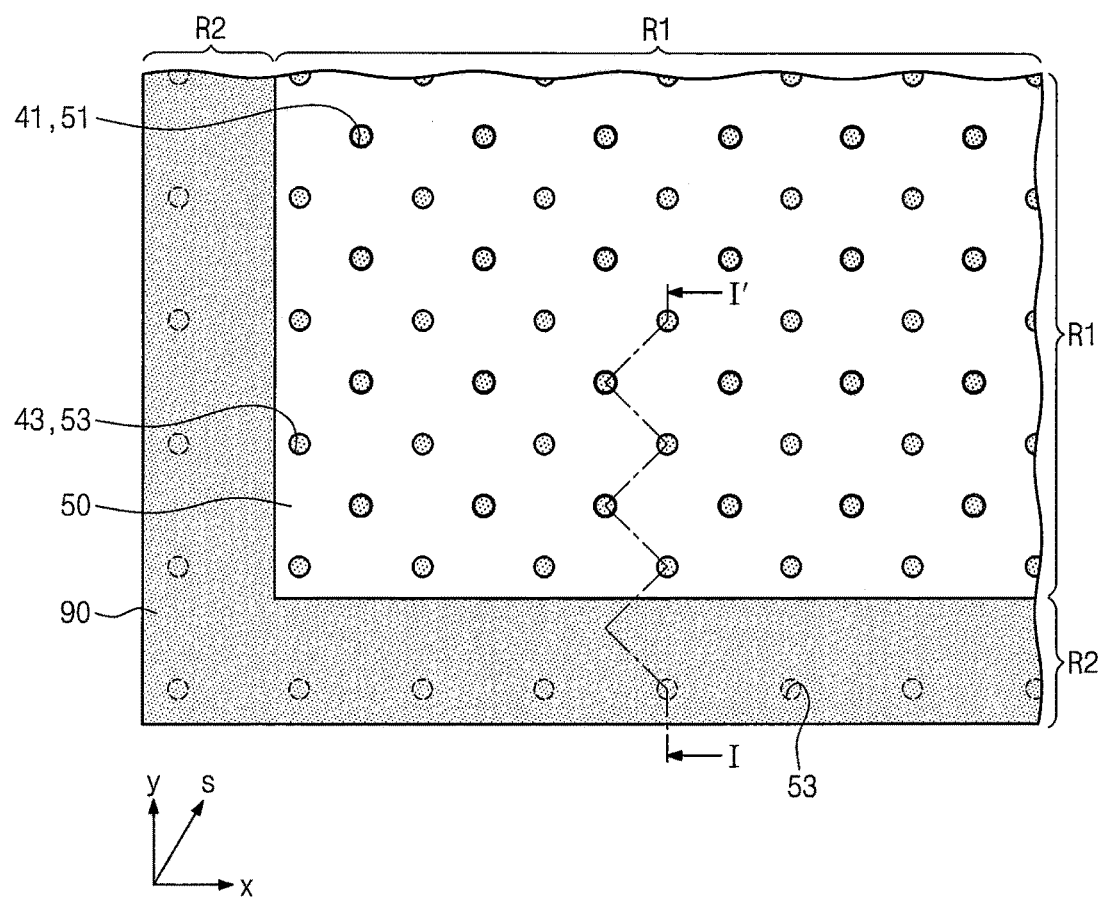
Figure 16B:
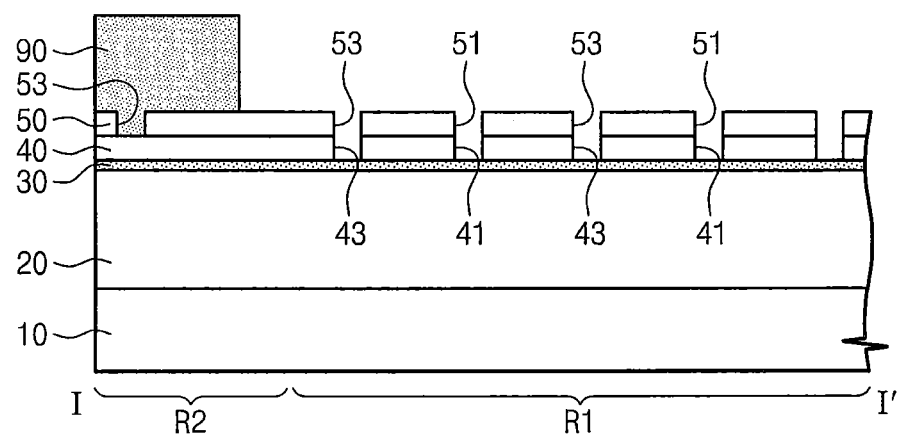

Referring to FIGS. 16A and 16B, a trimming mask pattern 90 defining a boundary of the first and second regions R1 and R2 may be formed on the buffer mask layer 50 having the first and second holes 51 and 53. The first block pattern 81, the buffer layer 80S, the spacer patterns 73, the spacer pillars 75, and the sacrificial patterns 77 may be removed before the formation of the trimming mask pattern 90 and after the formation of the second holes 53. The trimming mask pattern 90 may fill the second holes 53 formed in the second region R2 and may cover the buffer mask layer 50 of the second region R2, as described with reference to FIGS. 8A and 8B. In other words, the first and second holes 51 and 53 formed in the first region R1 may be exposed by the trimming mask pattern 90. That is, the sidewall of the trimming mask pattern 90 may be disposed between the second holes 53 formed in the edge region of the first region R1 and second holes 53 formed in the second region R2.

After the formation of the trimming mask pattern 90, the hard mask layer 60 exposed by the first and second holes 51 and 53 of the first region R1 may be anisotropically etched to form first and second fine holes 41 and 43 in the hard mask layer 40 of the first region R1. The first and second fine holes 41 and 43 may be arranged in a zigzag form. A distance between the fine holes 41 and 43 in the diagonal direction s may be smaller than a distance between the fine holes in the first direction x and a distance between the fine holes 41 and 43 in the second direction y.

Figure 17A:
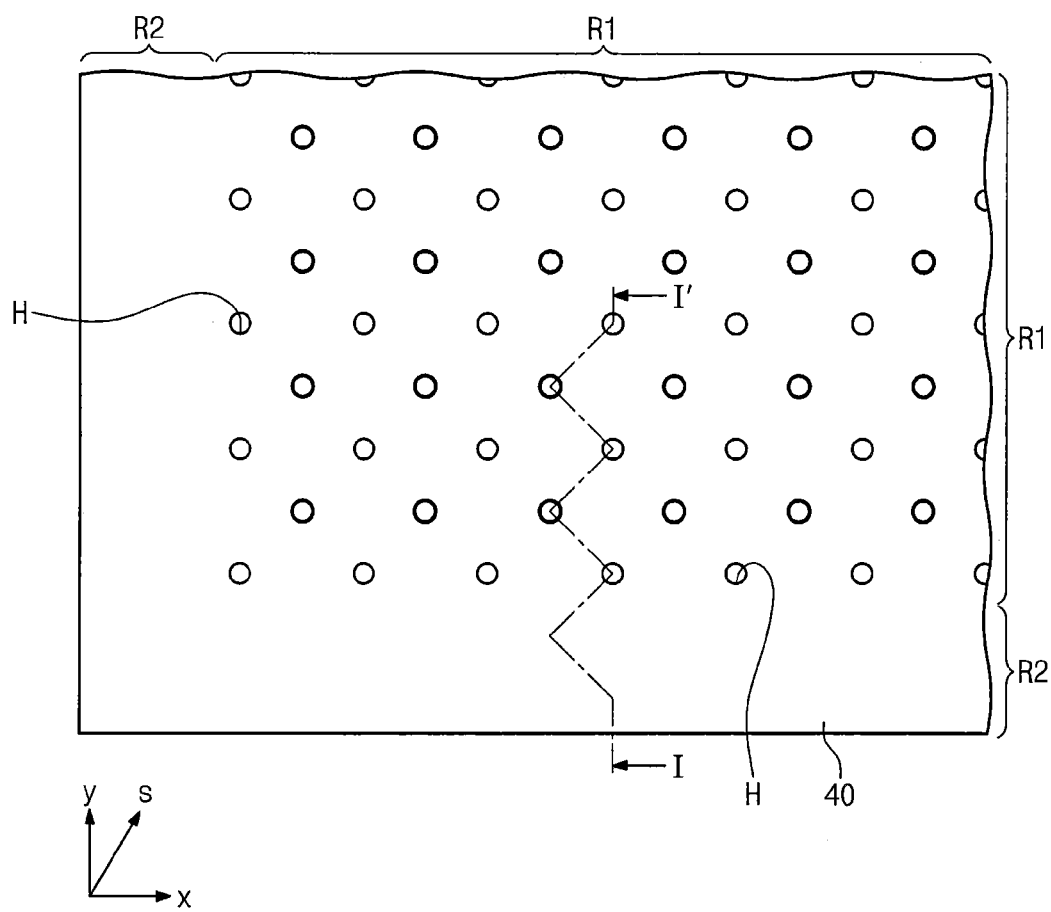
Figure 17B:
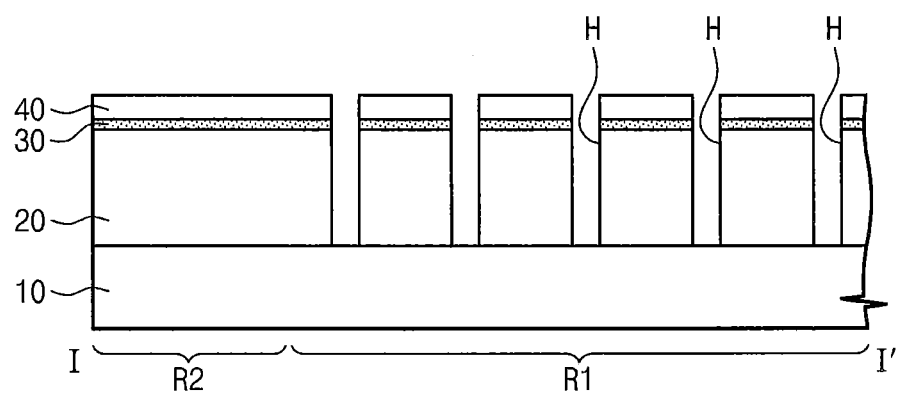

Referring to FIGS. 17A and 17B, after the formation of the first and second fine holes 41 and 43 in the hard mask layer 40, the trimming mask pattern 90 and the buffer mask layer 50 may be removed using an etch recipe having an etch selectivity with respect to the hard mask layer 40.

Next, the lower layer 20 may be anisotropically etched using the hard mask layer 40 having the first and second fine holes 41 and 43 as an etch mask, thereby forming lower holes H in the lower layer 20 of the first region R1.

According to the present embodiment, the lower holes H may be arranged in the first direction x, the second direction y, and the diagonal direction s. Here, a distance between the lower holes H in the first direction x may be substantially equal to a distance between the lower holes H in the second direction y, and a distance between the lower holes H in the diagonal direction s may be smaller than the distances between the lower holes H in the first and second directions x and y. Widths of the lower holes H may be smaller than the minimum width realized by the photolithography process (i.e., the limit of the resolution of the photolithography process).

FIGS. 18A to 23A are plan views illustrating a method for forming a fine pattern according to a third embodiment of the inventive concept. FIGS. 18B to 23B are cross-sectional views taken along lines I-I' of FIGS. 18A to 23A, respectively.

Figure 18A:
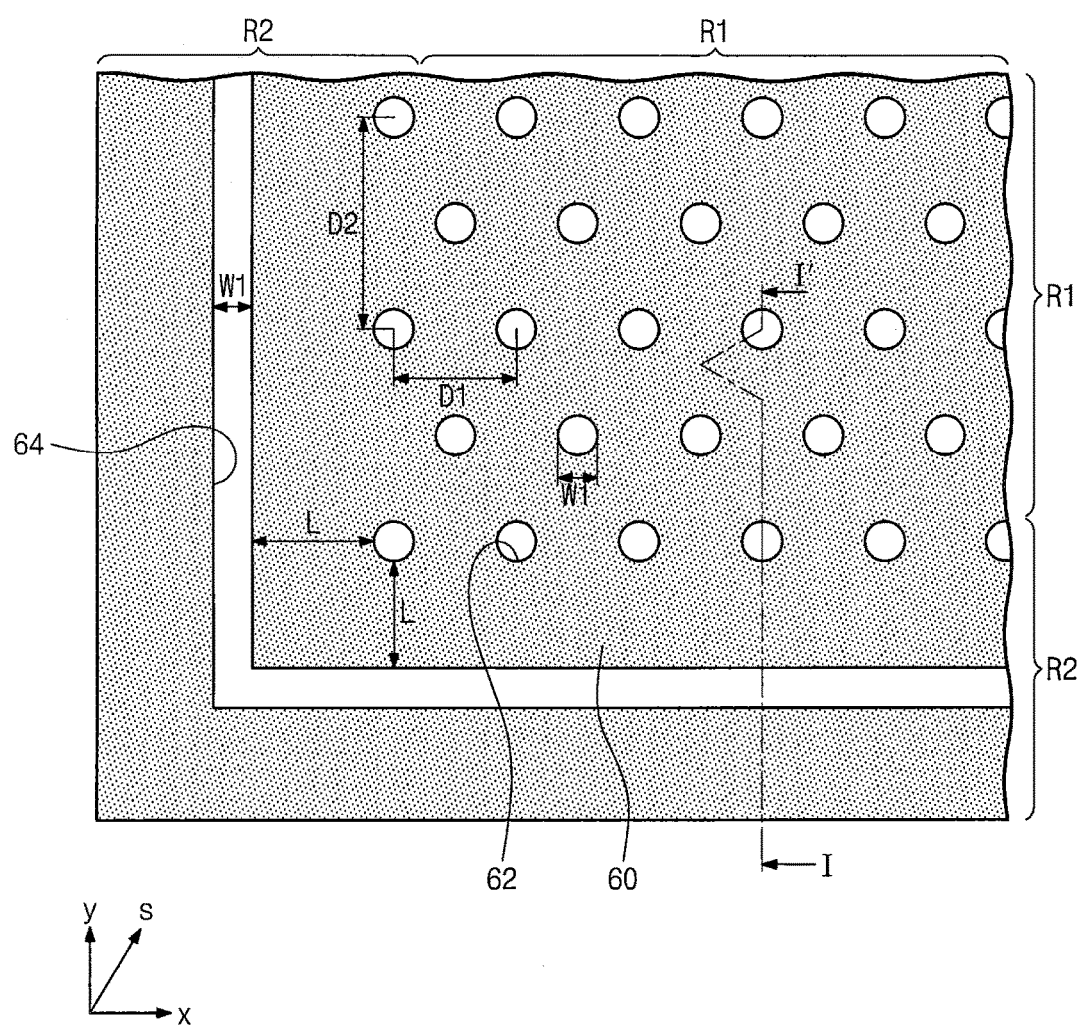
Figure 18B:
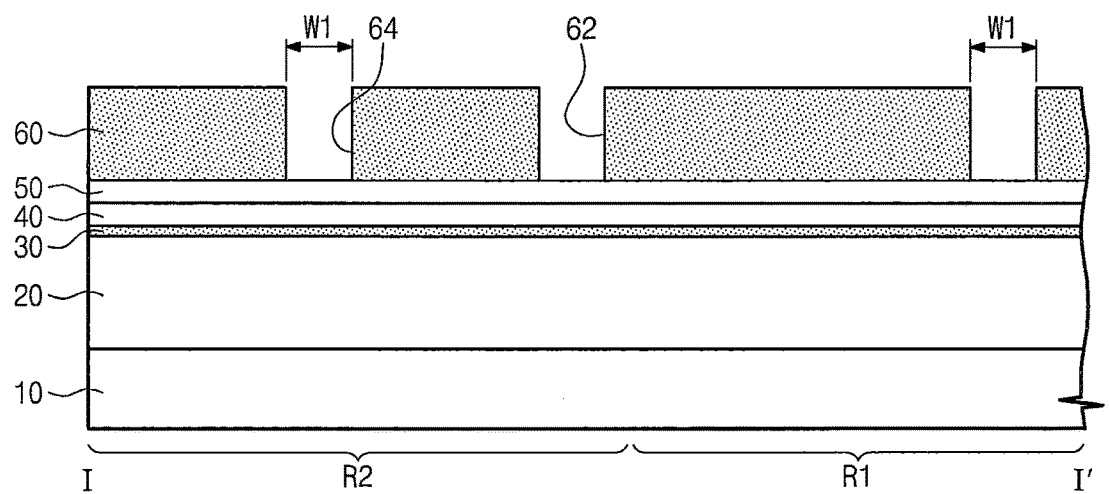

Referring to FIGS. 18A and 18B, a lower layer 20, an etch stop layer 30, a hard mask layer 40, and a buffer mask layer 50 may be sequentially formed on a substrate 10 including a first region R1, in which fine patterns will be formed, and a second region R2 around the first region R1.

A mask pattern 60 may be formed on the buffer mask layer 50. The mask pattern 60 may include openings 62 formed in the first region R1 and a trench 64 formed in the second region R2. The trench 64 may surround the first region R1 when viewed from a plan view. In the present embodiment, a width W1 of the trench 64 may be substantially equal to or smaller than widths W1 of the openings 62. The openings 62 and the trench 64 of the mask pattern 60 may expose portions of the buffer mask layer 50, respectively.

The openings 62 of the first region R1 may be arranged in lines along a diagonal direction s to first and second directions x and y perpendicular to each other. A distance D1 between the openings 62 in the first direction x may be smaller than a distance D2 between the openings 62 in the second direction y. A distance between the openings 62 in the diagonal direction s may be substantially equal to the distance D1 between the openings 62 in the first direction x. In addition, the minimum distance between the openings 62 may be greater than the width W1 of the openings 62. In other words, the openings 62 may be arranged in a honeycomb form or a zigzag form when viewed from a plan view.

In another embodiment, the openings 62 of the first region R1 may be arranged along the first and second directions x and y, and a distance between the openings 62 in the first direction x may be substantially equal to a distance between the openings 62 in the second direction y, like the first openings 61 illustrated in FIG. 10A. In other words, the openings 62 may be arranged in a square form in the first region R1.

A distance L between the trench 64 of the second region R2 and an outermost opening 62 of the first region R1 may be controlled according to a molecular weight of a polymer block included in a block copolymer layer 80 to be formed in a subsequent process. In addition, the distance L between the trench 64 of the second region R2 and the outermost opening 62 of the first region R1 may be controlled according to a density (or the number) of the openings 62 of the first region R1. Furthermore, the distance L between the outermost opening 62 and the trench 64 in the first direction x may be substantially equal to the distance L between the outermost opening 62 and the trench 64 in the second direction y.

Figure 19A:
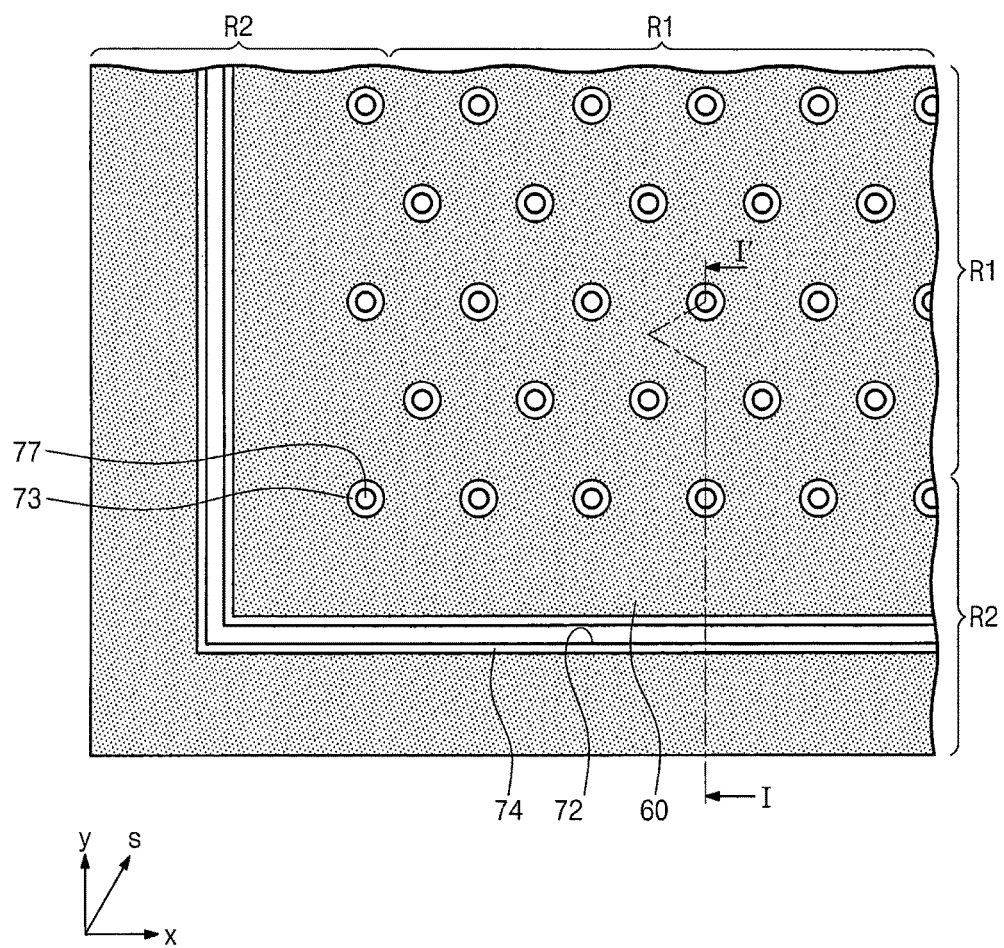
Figure 19B:
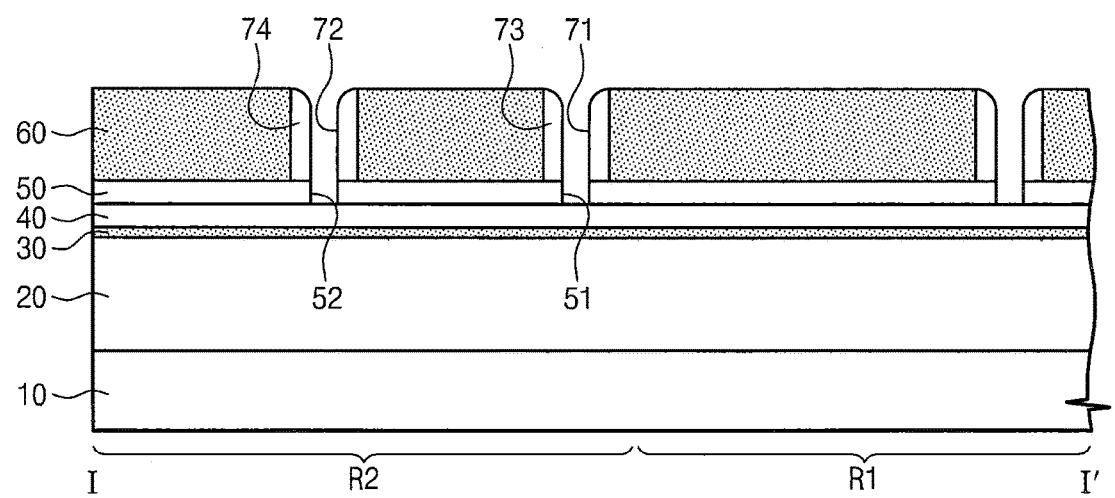

Referring to FIGS. 19A and 19B, a first spacer pattern 73 which has a first gap region 71 exposing a portion of the buffer mask layer 50 may be formed in each of the openings 62. A second spacer pattern 74 having a second gap region 72 may be formed in the trench 64. The second gap region 72 exposes a portion of the buffer mask layer 50.

In an embodiment, a width of the first gap region 71 of the first spacer pattern 73 may be smaller than the width of the openings 62, and a width of the second gap region 72 of the second spacer pattern 74 may be smaller than the width of the trench 64. For example, the widths of the first and second gap regions 71 and 72 may be in the range of about one-third to about one-fifth of the width of the openings 62.

In the present embodiment, a spacer layer may be conformally deposited on the mask pattern 60 having the openings 62 and the trench 64, and the deposited spacer layer may be anisotropically etched by a blanket anisotropic etching process until the top surface of the mask pattern 60 is exposed, thereby forming the first and second spacer patterns 73 and 74, as described with reference to FIGS. 2A, 2B, 3A, and 3B. Here, a thickness of the deposited spacer layer may be smaller than half the width of the openings 62 and half the width of the trench 64. In other words, the spacer layer may be deposited with a generally uniform thickness on inner sidewalls and bottom surfaces of the trench 64 and the openings 62.

Subsequently, the buffer mask layer 50 exposed by the first and second gap regions 71 and 72 may be anisotropically etched, and thus first holes 51 may be formed in the buffer mask layer 50 of the first region R1 and a fine trench 52 may be formed in the buffer mask layer 50 of the second region R2.

Figure 20A:
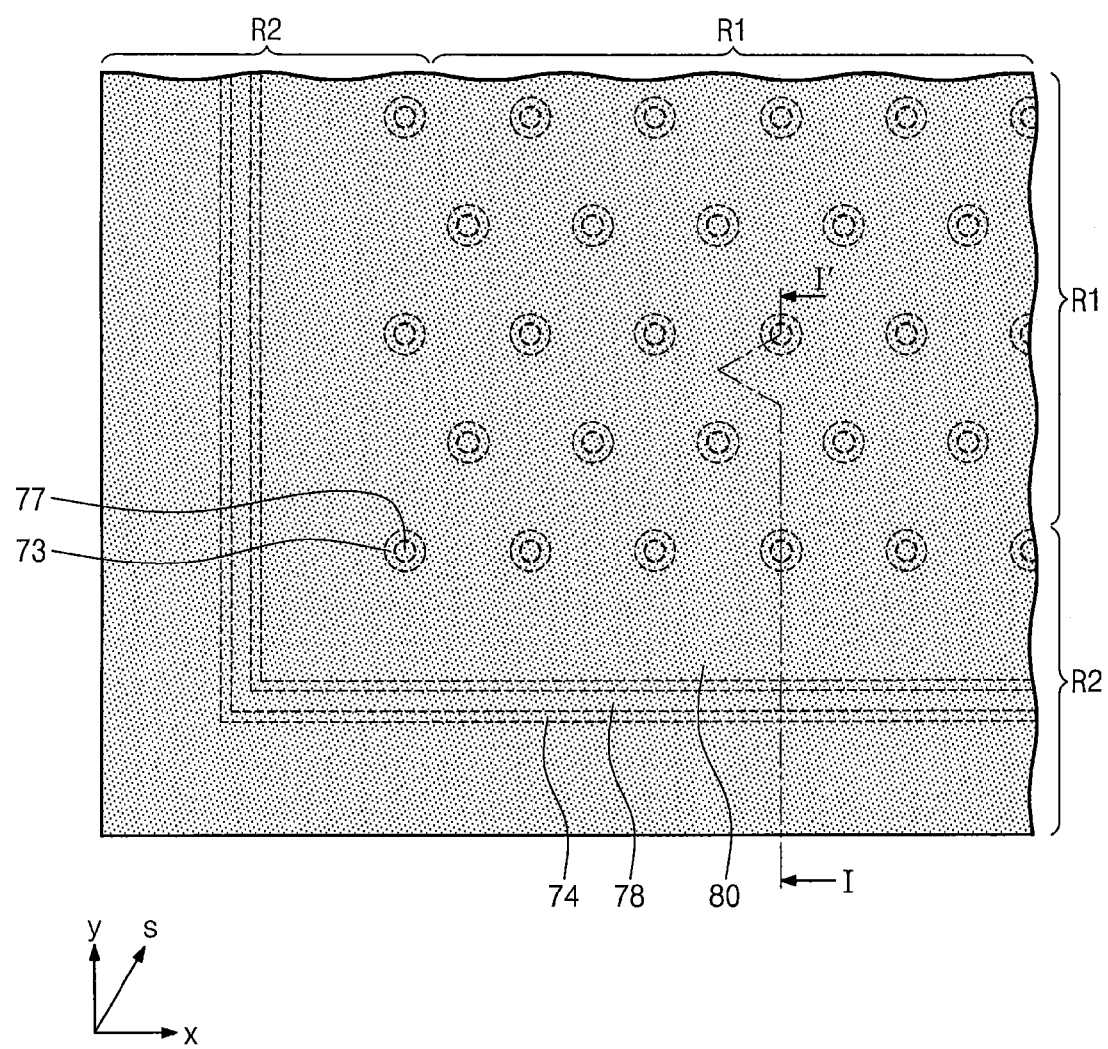
Figure 20B:
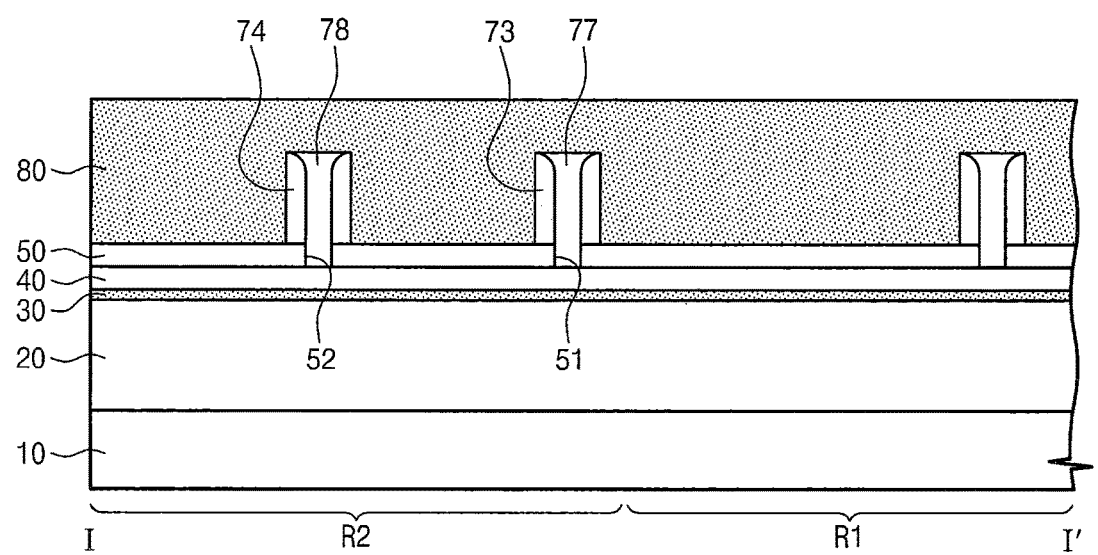

After the formation of the first holes 51 and the fine trench 52, sacrificial pillars 77 may be formed to fill the first holes 51 and the first gap regions 71 and a dam pattern 78 may be formed to fill the fine trench 52 and the second gap region 72, as illustrated in FIGS. 20A and 20B. For example, a sacrificial layer may be formed on the mask pattern 60 to fill the gap regions 71 and 72, the first holes 51, and the fine trench 62, and then the sacrificial layer may be planarized until the top surface of the mask pattern 60 is exposed, thereby forming the sacrificial pillars 77 and the dam pattern 78. The mask pattern 60 may be removed after the formation of the sacrificial pillars 77 and the dam pattern 78.

Next, a block copolymer layer 80 may be formed on the buffer mask layer 50 to cover the first and second spacer patterns 73 and 74, the sacrificial pillars 77, and the dam pattern 78. The block copolymer layer 80 may include two or more polymer blocks of which first ends are connected to each other by covalent bonding, as described with reference to FIGS. 5A and 5B. Second ends of the polymer blocks may have repulsive forces to each other.

Figure 21A:
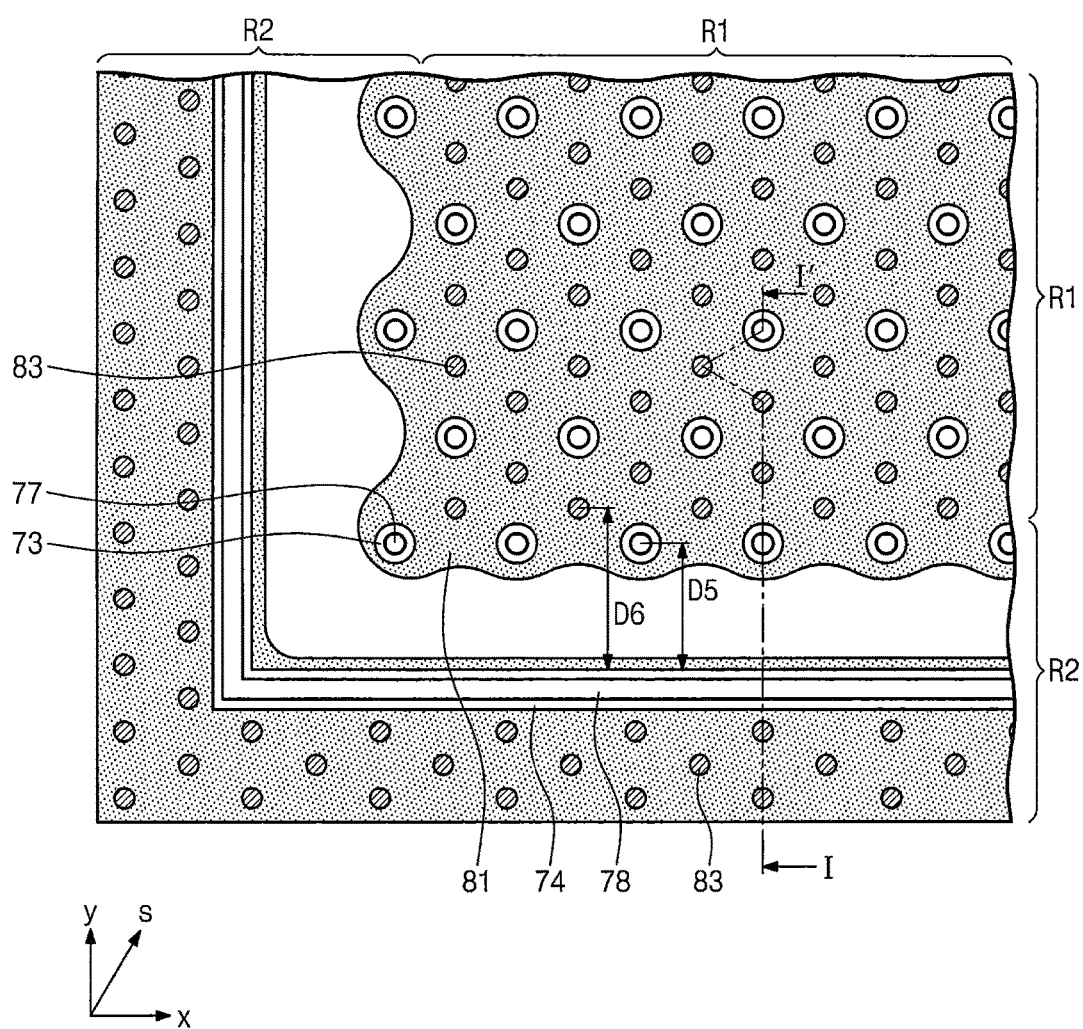
Figure 21B:
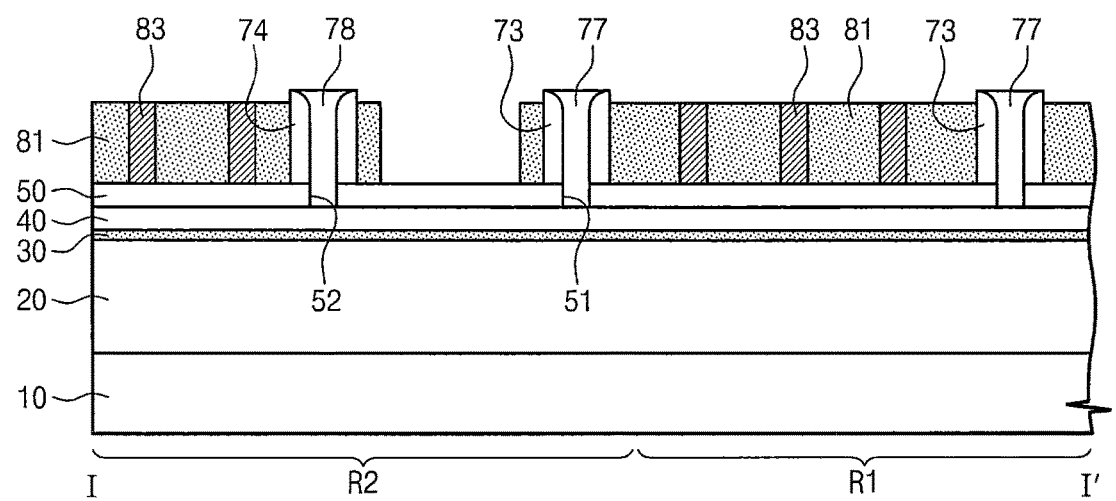

Referring to FIGS. 21A and 21B, the polymer blocks of the block copolymer layer 80 may be phase-separated by self-assembly to form first block patterns 81 and second block patterns 83. For example, an annealing process may be performed on the block copolymer layer 80 by means of ultraviolet (UV) or heat to form the first block patterns 81 and the second block patterns 83.

According to the present embodiment, because the density of the first spacer patterns 73 is high in a central region of the first region R1 during the annealing process of the block copolymer layer 80, a force of the first spacer patterns 73, which induces the self-assembly of the polymer blocks, may be greater in the central region of the first region R1 than in a boundary region of the first and second regions R1 and R2.

In addition, the dam pattern 78 of the second region R2 may be formed to surround the first spacer patterns 73, so the force inducing the self-assembly may be more concentrated in the central region of the first region R1. As a result, the first block pattern 81 and the second block patterns 83 may be formed in the central region of the first region R1 in proportion to the force of the first spacer patterns 73 inducing the self-assembly. In the first region R1, the first block pattern 81 may be in contact with sidewalls of the first spacer patterns 73 and the second block patterns 83 may be spaced apart from the sidewalls of the first spacer patterns 73. The second block patterns 83 may have cylindrical shapes and may be spaced apart from each other by the first block pattern 81. Because the force including the self-assembly is concentrated to the central region of the first region R1 during the annealing process of the block copolymer layer 80, the polymer blocks of the block copolymer layer 80 in an edge region of the first region R1 may be moved toward the central region of the first region R1. Thus, the first and second block patterns 81 and 83 may not be formed in the boundary region of the first and second regions R1 and R2, and the buffer mask layer 50 may be exposed in the boundary region of the first and second regions R1 and R2.

According to the present embodiment, the first spacer pattern 73 (or the sacrificial pillar 77) adjacent to the dam pattern 78 may be disposed at a first distance D5 from the dam pattern 78, and the second block pattern 83 adjacent to the dam pattern 78 may be disposed at a second distance D6 from the dam pattern 78. Here, the second distance D6 may be greater than the first distance D5. Each of the second block patterns 83 may be disposed among at least three first spacer patterns 73 adjacent to each other. A width of the second block patterns 83 may be substantially equal to the width of the sacrificial pillars 77 (i.e., the width of the first holes 51).

In some embodiments, the polymer blocks disposed outside the dam pattern 78 may be self-assembled during the annealing process of the block copolymer layer 80, so first and second block patterns 81 and 83 may be irregularly formed outside the dam pattern 78.

Figure 22A:
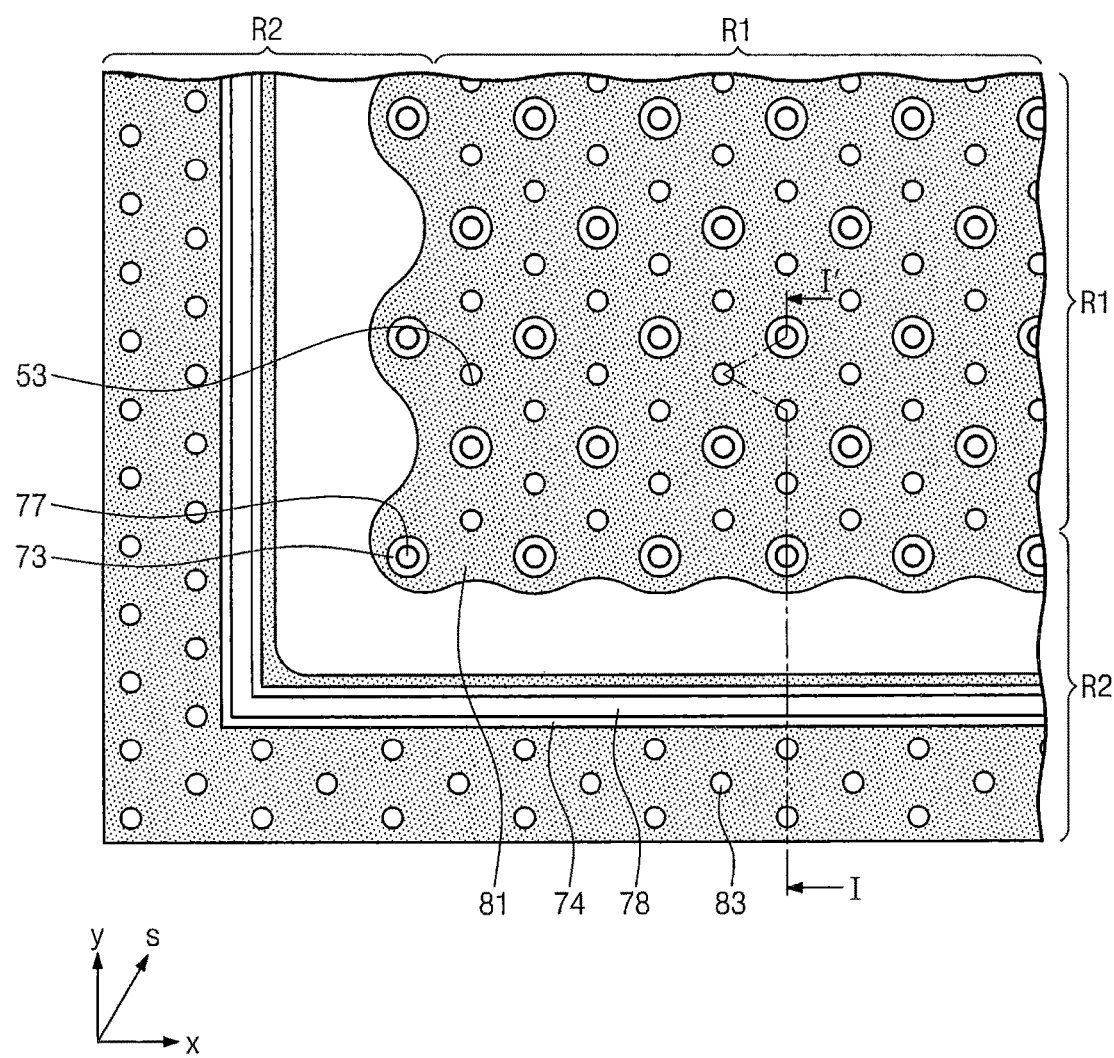
Figure 22B:
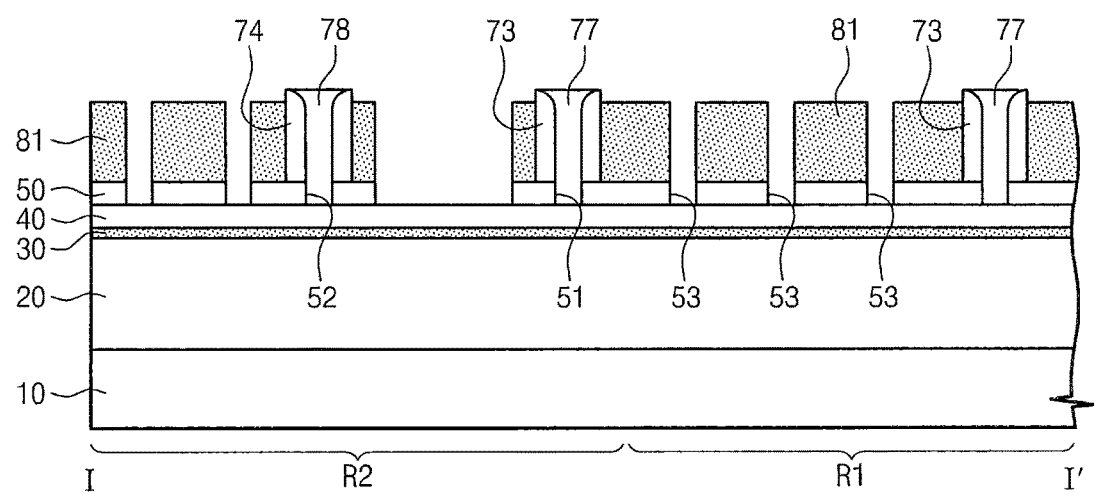

Referring to FIGS. 22A and 22B, the second block patterns 83 may be removed to expose portions of the buffer mask layer 50, and the exposed portions of the buffer mask layer 50 may be etched to form second holes 53, as described with reference to FIGS. 7A and 7B. According to an embodiment, in the first region R1, the second holes 53 may be aligned with the first holes 51 in the diagonal direction s and each of the second holes 53 may be disposed among three first holes 51 adjacent to each other. Widths of the second holes 53 may be substantially equal to the widths of the first holes 51.

Figure 23A:
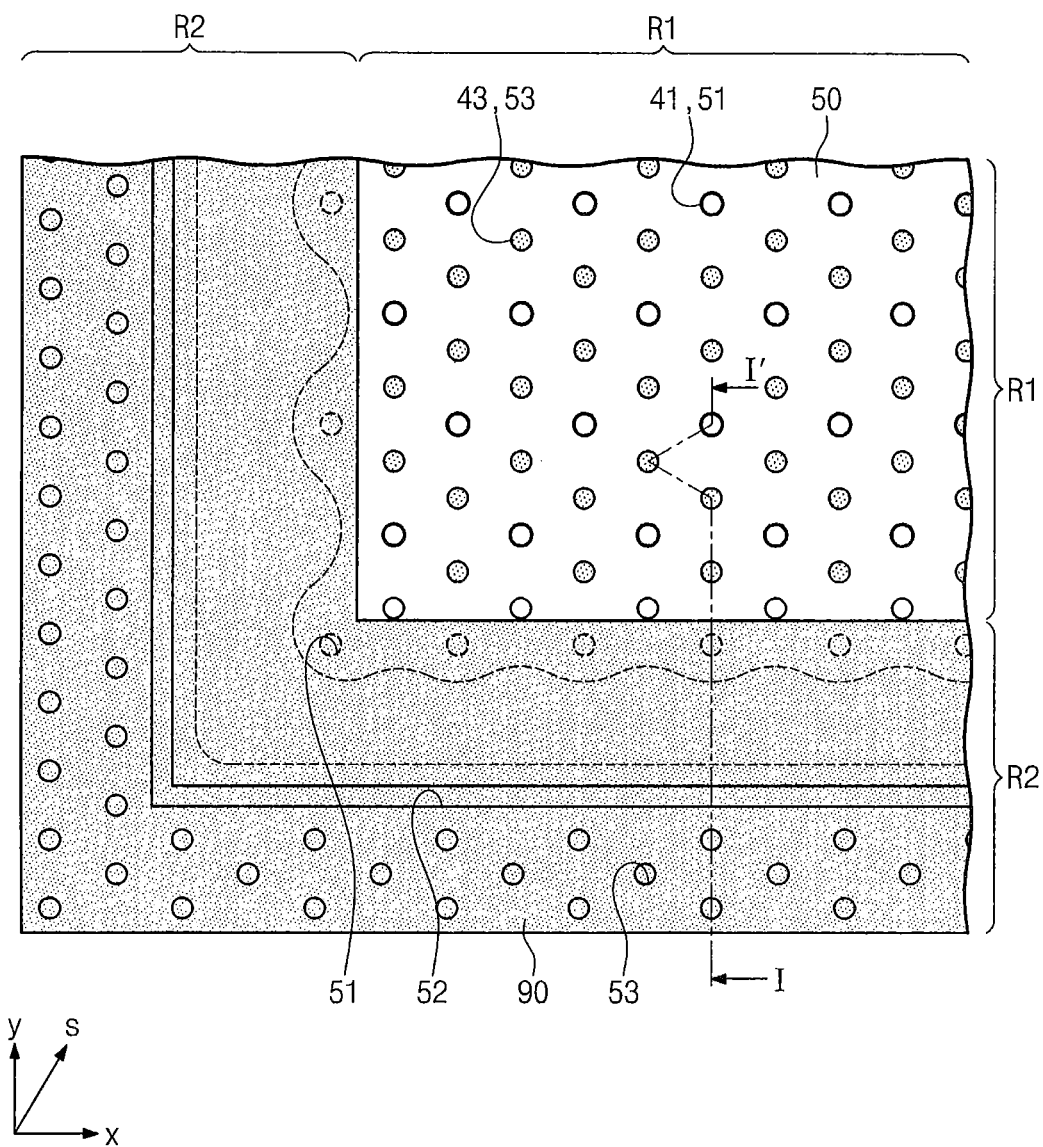
Figure 23B:
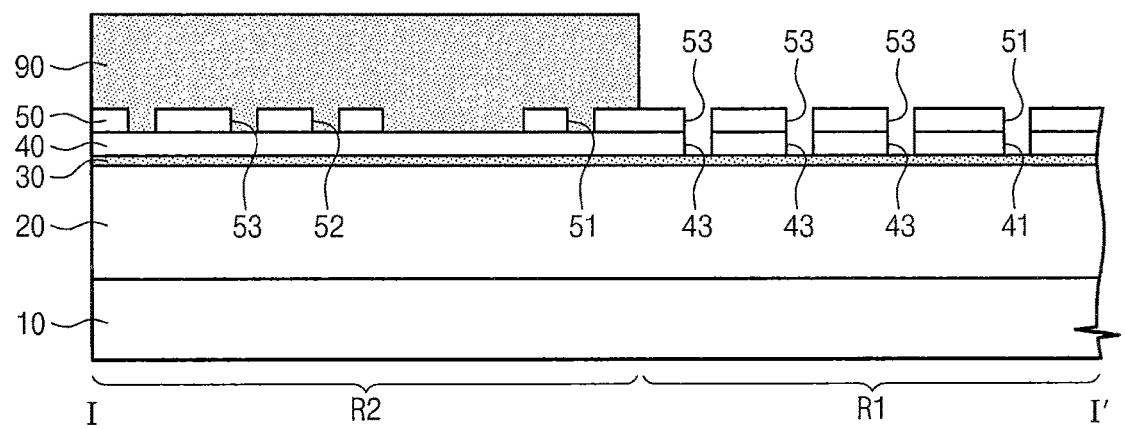

Referring to FIGS. 23A and 23B, the first block pattern 81, the first and second spacer patterns 73 and 74, the sacrificial pillars 77, and the dam pattern 78 may be removed after the formation of the second holes 53 in the buffer mask layer 50. Thus, the first and second holes 51 and 53 and the fine trench 52 of the buffer mask layer 50 may be exposed.

Next, a trimming mask pattern 90 may be formed on the buffer mask layer 50. In some embodiments, the trimming mask pattern 90 may fill the fine trench 52 formed in the second region R2 and may cover the buffer mask layer 50 of the second region R2. In addition, the trimming mask pattern 90 may fill the first holes 51 formed in the boundary region of the first and second regions R1 and R2. According to the present embodiment, because a distance between the fine trench 52 and the first or second holes 51 or 53 adjacent to the fine trench 52 is greater than a distance between the first and second holes 51 and 53 of the first region R1, it is possible to improve an alignment margin of the trimming mask pattern 90 defining a boundary of the first and second regions R1 and R2.

After the formation of the trimming mask pattern 90, the hard mask layer 40 exposed by the first and second holes 51 and 53 in the first region R1 may be anisotropically etched to form first and second fine holes 41 and 43 in the hard mask layer 40 of the first region R1.

Subsequently, the trimming mask pattern 90 and the buffer mask layer 50 may be removed, and the lower layer 20 may be anisotropically etched using the hard mask layer 40 having the first and second fine holes 41 and 43 as an etch mask in the first region R1.

FIGS. 24A to 29A are plan views illustrating a method for forming a fine pattern according to a fourth embodiment of the inventive concept. FIGS. 24B to 29B are cross-sectional views taken along lines I-I' of FIGS. 24A to 29A, respectively.

Figure 24A:
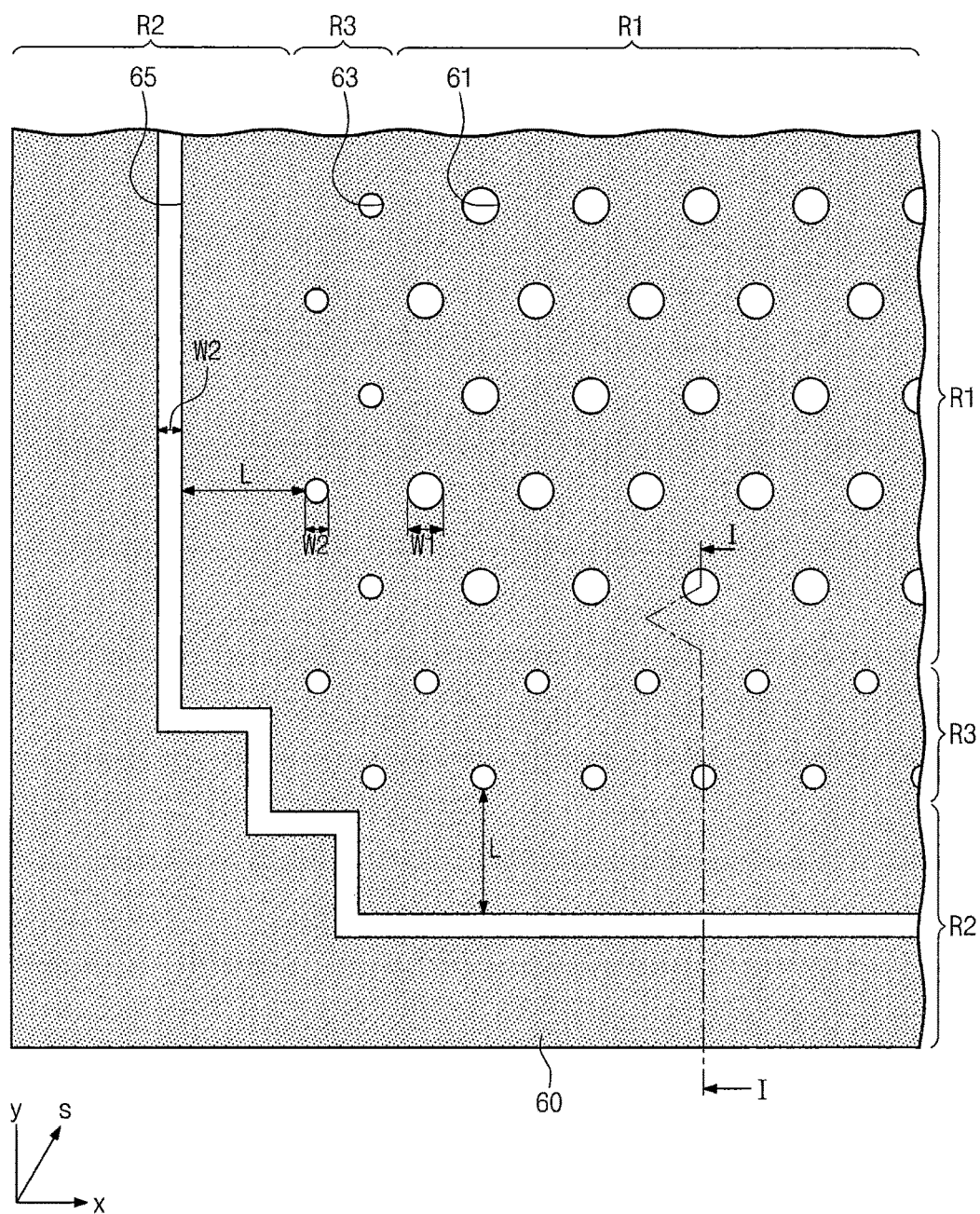
Figure 24B:
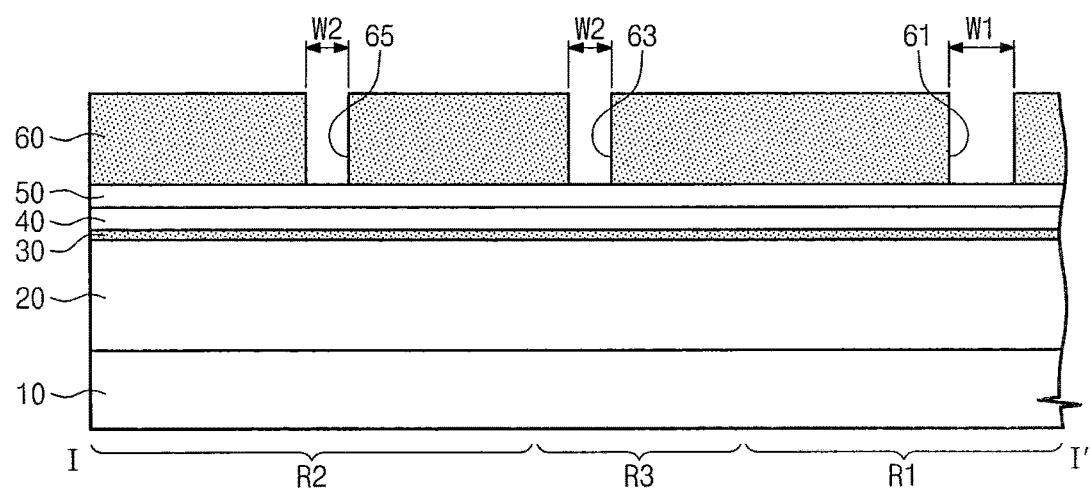

Referring to FIGS. 24A and 24B, a substrate 10 may include a first region R1, a second region R2 around the first region R1, and a third region R3 between the first and second regions R1 and R2. A lower layer 20, an etch stop layer 30, a hard mask layer 40, and a buffer mask layer 50 may be sequentially formed on the substrate 10, and a mask pattern 60 may be formed on the buffer mask layer 50.

The mask pattern 60 may have first openings 61 formed in the first region R1 and second openings 63 formed in the third region R3. In addition, the mask pattern 60 may further have a trench 65, which is formed in the second region R2 and surrounds the first region R1. The first and second openings 61 and 63 and the trench 65 of the mask pattern 60 may expose portions of the buffer mask layer 50, respectively.

In the present embodiment, each of the first openings 61 may have a first width W1, and each of the second openings 63 may have a second width W2 smaller than the first width W1. A width W2 of the trench 65 may be substantially equal to the second width W2 of the second openings 63.

In some embodiments, the first openings 61 of the first region R1 may be arranged in lines along the diagonal direction s to the first and second directions x and y perpendicular to each other. As described with reference to FIGS. 1A and 1B, the distance between the first openings 61 in the first direction x may be smaller than the distance between the first openings 61 in the second direction y. The distance between the first openings 61 in the diagonal direction s may be substantially equal to the distance between the first openings 61 in the first direction x. The minimum distance between the first openings 61 may be greater than the width W1 of the first openings 61. The first openings 61 may be arranged in the honeycomb form or the zigzag from when viewed from a plan view.

In other embodiments, in the first region R1, the first openings 61 may be arranged along the first and second directions x and y, and the distance between the first openings 61 in the first direction x may be substantially equal to the distance between the first openings 61 in the second direction y, as described with reference to FIG. 10A. In other words, the first openings 61 may be arranged in a square form in the first region R1.

In the present embodiment, the distance between the second openings 63 in the first direction x may be substantially equal to the distance between the first openings 61 in the first direction x, and the distance between the second openings 63 in the second direction y may be substantially equal to the distance between the first openings 61 in the second direction y.

Figure 25A:
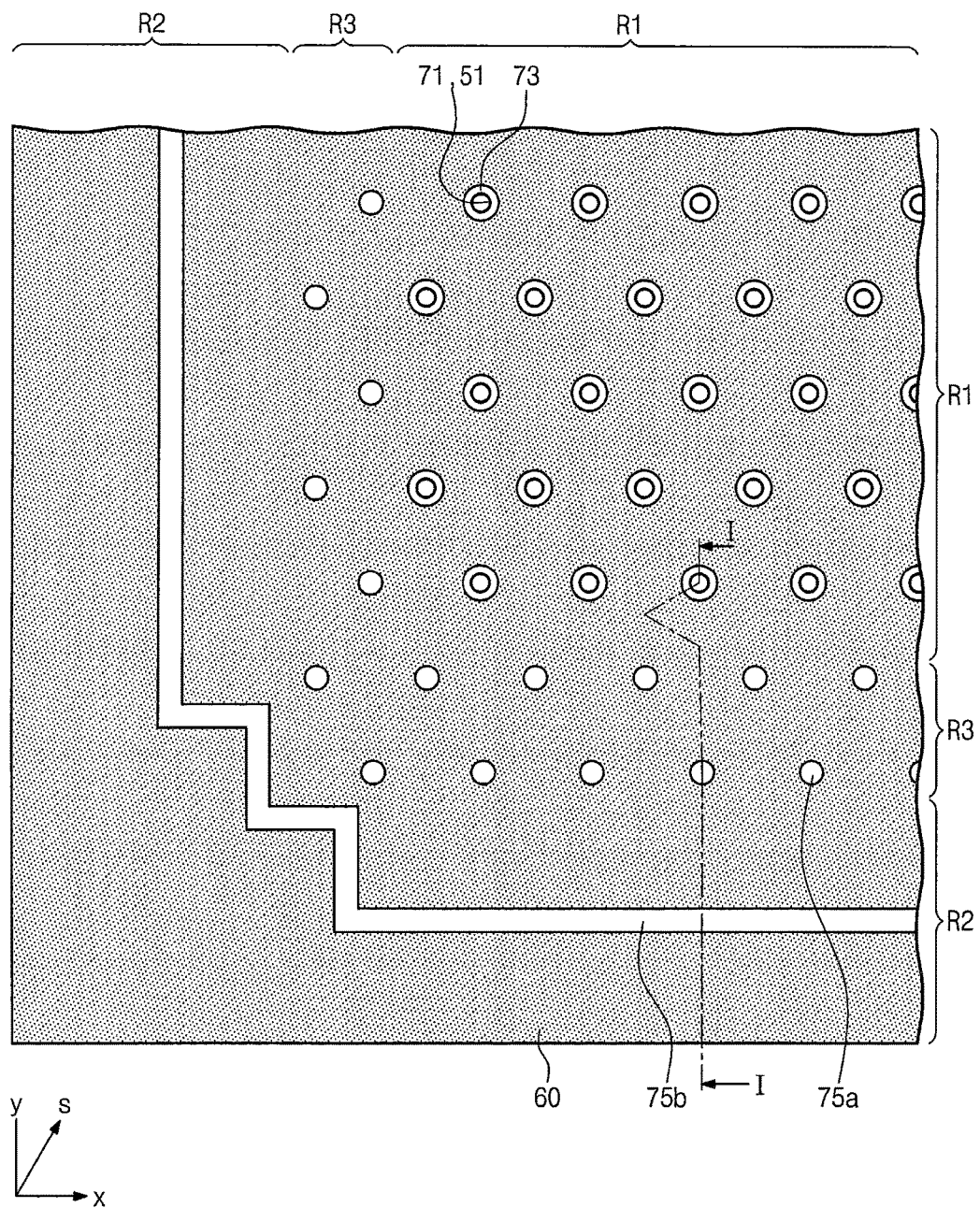
Figure 25B:
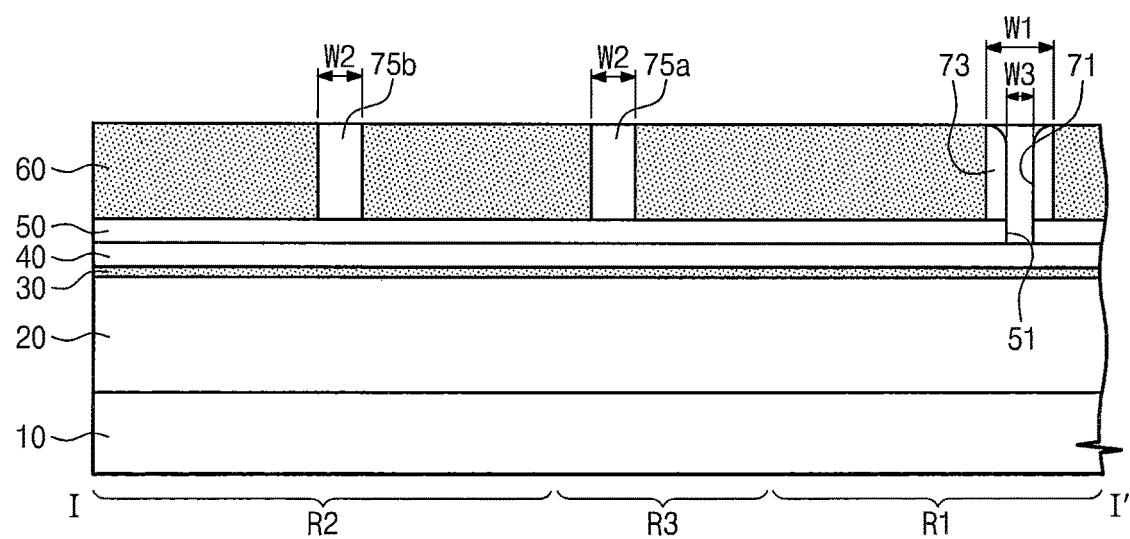

Referring to FIGS. 25A and 25B, a spacer pattern 73 which has a gap region 71 exposing a portion of the buffer mask layer 50 may be formed in each of the first openings 61. A spacer pillar 75a may be formed to fill each of the second openings 63, and a dam pattern 75b may be formed to fill the trench 65.

In some embodiments, a width W3 of the gap region 71 of the spacer pattern 73 may be smaller than the width W1 of the first openings 61. For example, the width W3 of the gap region 71 may be in the range of about one-third to about one-fifth of the width W1 of the first openings 61.

In the present embodiment, a spacer layer may be conformally deposited on the mask pattern 60 having the first and second openings 61 and 63 and the trench 65, and the deposited spacer layer may be anisotropically etched by a blanket anisotropic etching process until the top surface of the mask pattern 60 is exposed, thereby forming the spacer patterns 73, the spacer pillars 75a, and the dam pattern 75b. Here, a thickness of the deposited spacer layer may be smaller than about half the width of the first openings 61 and greater than about half the width of the second openings 63. In other words, the spacer layer may be deposited with a generally uniform thickness on inner sidewalls and bottom surfaces of the first openings 61 and may fill the second openings 63 and the trench 65.

Subsequently, the buffer mask layer 50 exposed by the gap regions 71 may be anisotropically etched to form first holes 51 in the buffer mask layer 50 of the first region R1. Because the buffer mask layer 50 of the second and third regions R2 and R3 are not exposed during the formation of the first holes 51, the first holes 51 may be locally formed in the first region R1.

Figure 26A:
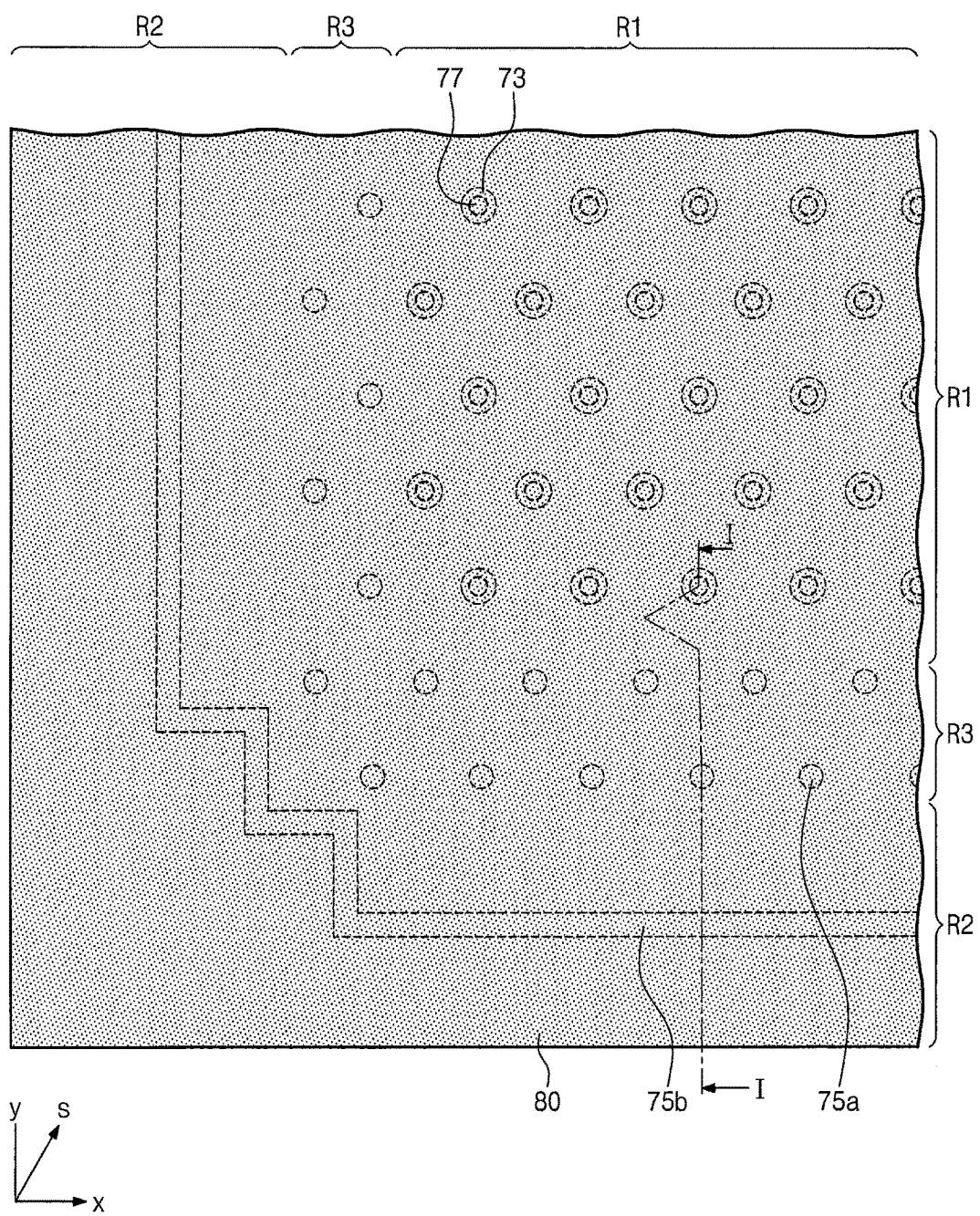
Figure 26B:
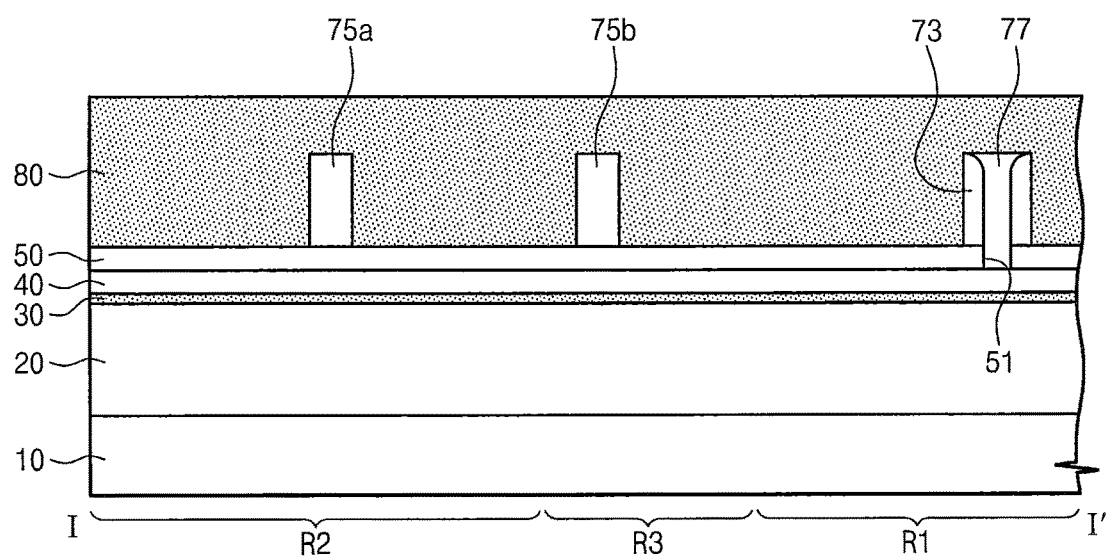

After the formation of the first holes 51, sacrificial pillars 77 may be formed to fill the first holes 51 and the gap regions 71, as illustrated in FIGS. 26A and 26B. For example, a sacrificial layer may be formed on the mask pattern 60 to fill the gap regions 71 and the first holes 51, and then the sacrificial layer may be planarized until the top surface of the mask pattern 60 is exposed, thereby forming the sacrificial pillars 77. The mask pattern 60 may be removed after the formation of the sacrificial pillars 77.

Next, a block copolymer layer 80 may be formed on the buffer mask layer 50 to cover the spacer patterns 73, the sacrificial pillars 77, the spacer pillars 75a, and the dam pattern 75b. The block copolymer layer 80 may include two or more polymer blocks of which first ends are connected to each other by covalent bonding, as described with reference to FIGS. 5A and 5B. Second ends of the polymer blocks may have repulsive forces to each other.

Figure 27A:
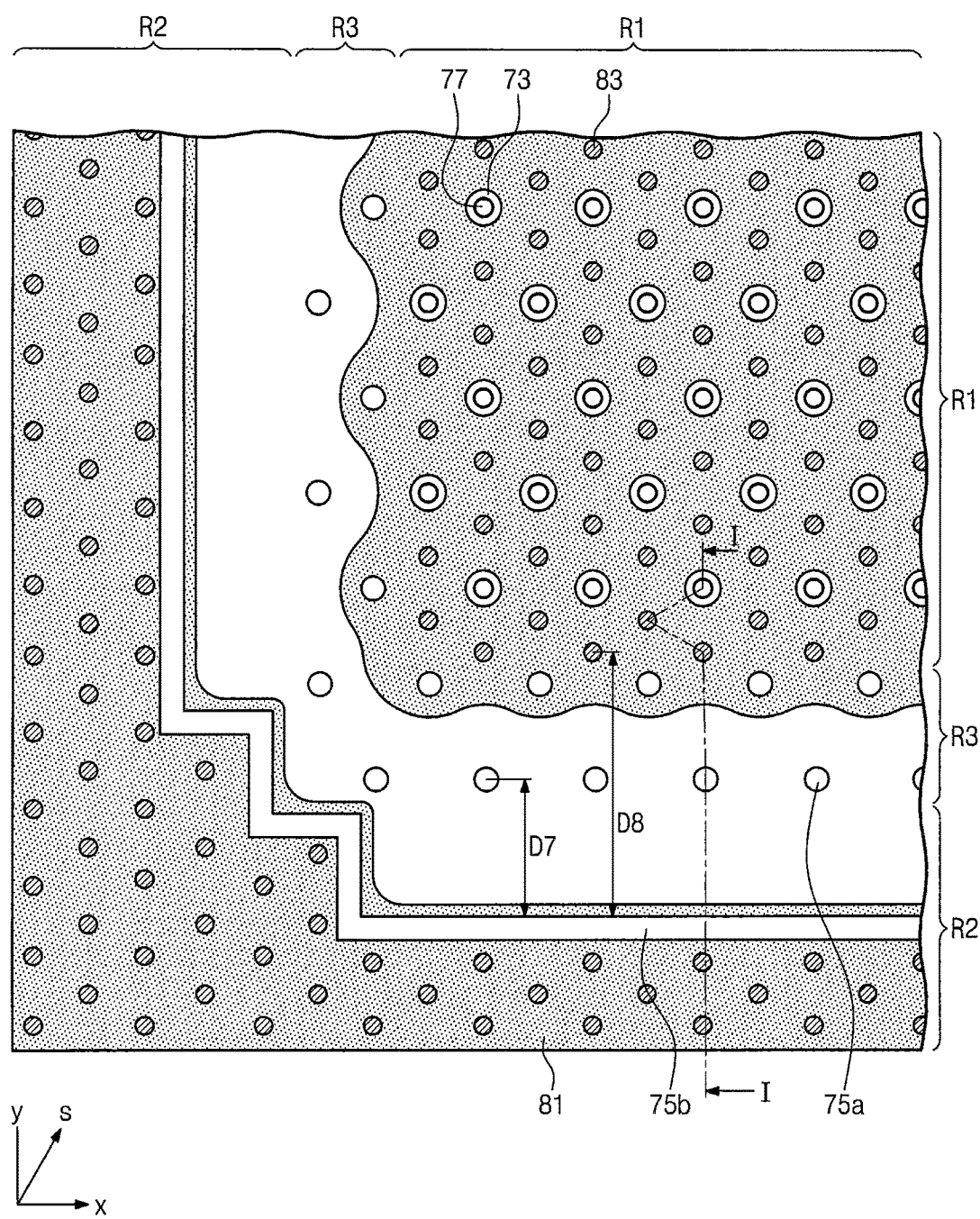
Figure 27B:
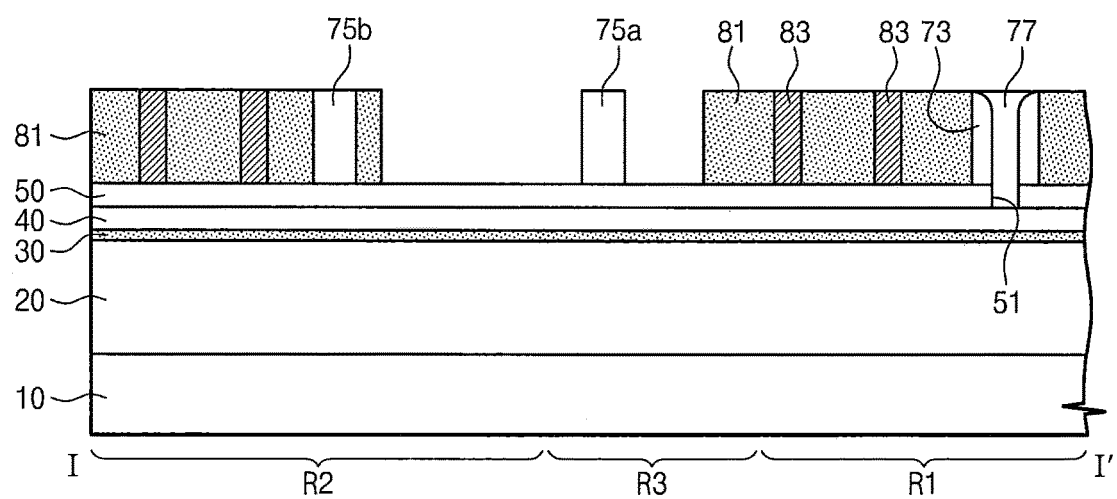

Referring to FIGS. 27A and 27B, as described with reference to FIGS. 21A and 21B, the annealing process may be performed on the block copolymer layer 80, so the polymer blocks of the block copolymer layer 80 may be self-assembled to form first block patterns 81 and second block patterns 83.

The first block pattern 81 may be in contact with sidewalls of the spacer patterns 73 and the spacer pillars 75a and the second block patterns 83 may be spaced apart from the sidewalls of the spacer patterns 73 and the spacer pillars 75a in the first region R1. The second block patterns 83 may have cylindrical shapes and may be spaced apart from each other by the first block pattern 81.

According to the present embodiment, as described with reference to FIGS. 21A and 21B, because a density of the spacer patterns 73 is high in the central region of the first region R1, the force of the spacer patterns 73 inducing the self-assembly of the polymer block may be greater in the central region of the first region R1 than in the second and third regions R2 and R3.

In addition, the dam pattern 75b of the second region R2 may be formed to surround the spacer patterns 73 and the spacer pillars 75a, so the force inducing the self-assembly may be more concentrated in the central region of the first region R1. As a result, the first block pattern 81 and the second block patterns 83 may be formed in the central region of the first region R1 in proportion to the force of the spacer patterns 73 inducing the self-assembly.

According to the present embodiment, the spaced pillar 75a adjacent to the dam pattern 75b may be disposed at a first distance D7 from the dam pattern 75b, and the second block pattern 83 adjacent to the dam pattern 75b may be disposed at a second distance D8 from the dam pattern 75b. Here, the second distance D8 may be greater than the first distance D7. Each of the second block patterns 83 may be formed among at least three sacrificial pillars 77 in the first region R1. Widths of the second block patterns 83 may be substantially equal to the width of the sacrificial pillars 77 (i.e., the width of the first holes 51). The second block patterns 83 may also be formed between the spacer pillars 75a of the third region R3.

In addition, because the force including the self-assembly is concentrated to the central region of the first region R1 during the annealing process of the block copolymer layer 80, the polymer blocks of the block copolymer layer 80 in the second and third regions R2 and R3 inside the dam pattern 75b may be moved toward the central region of the first region R1. Thus, in a region between the dam pattern 75b and the outermost spacer pillars 75a, the first and second blocks patterns 81 and 83 may not be formed but the buffer mask layer 50 may be exposed.

In some embodiments, the polymer blocks disposed outside the dam pattern 75b may be self-assembled during the annealing process of the block copolymer layer 80, so first and second block patterns 81 and 83 may be irregularly formed outside the dam pattern 75b when viewed from a plan view.

Figure 28A:
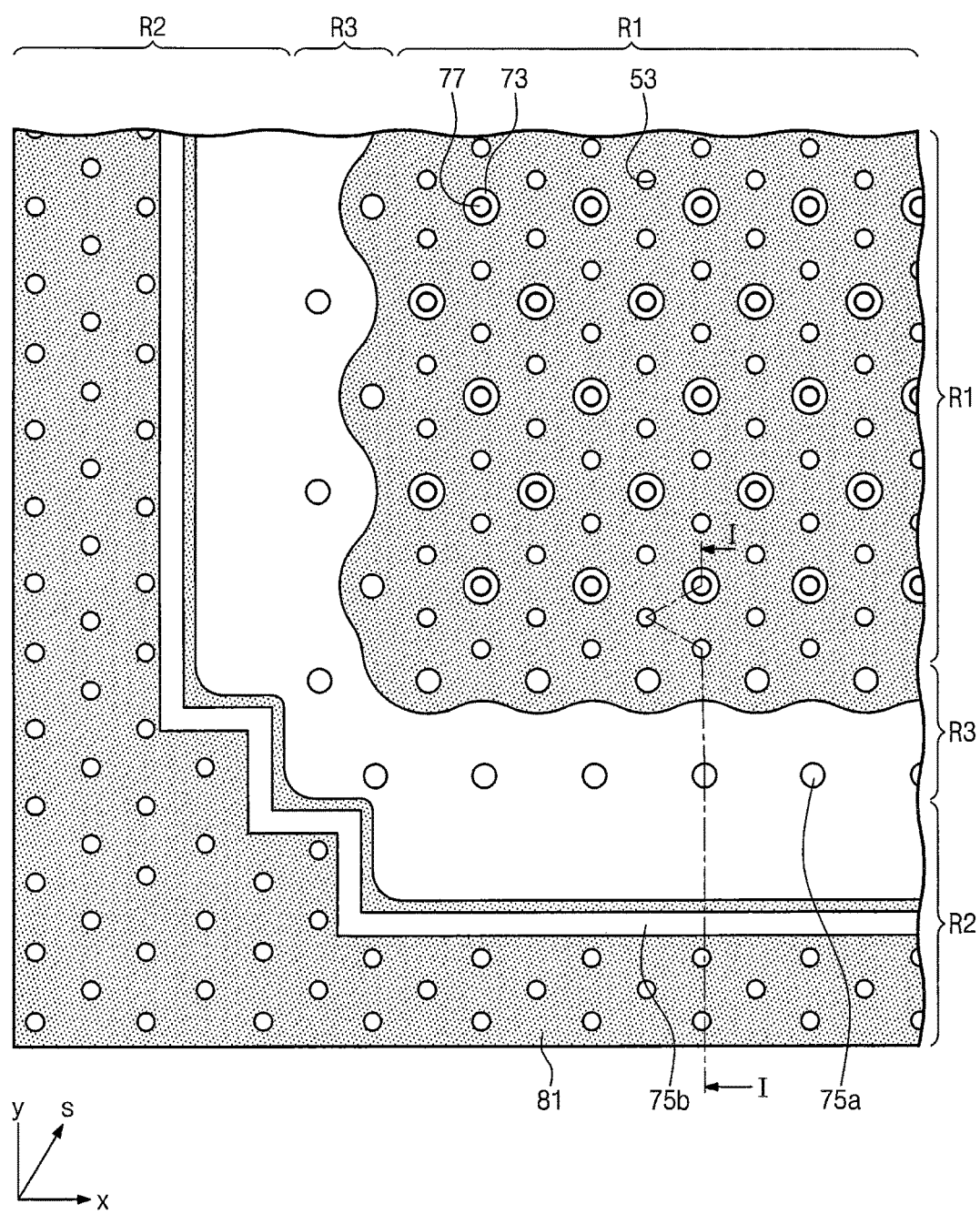
Figure 28B:
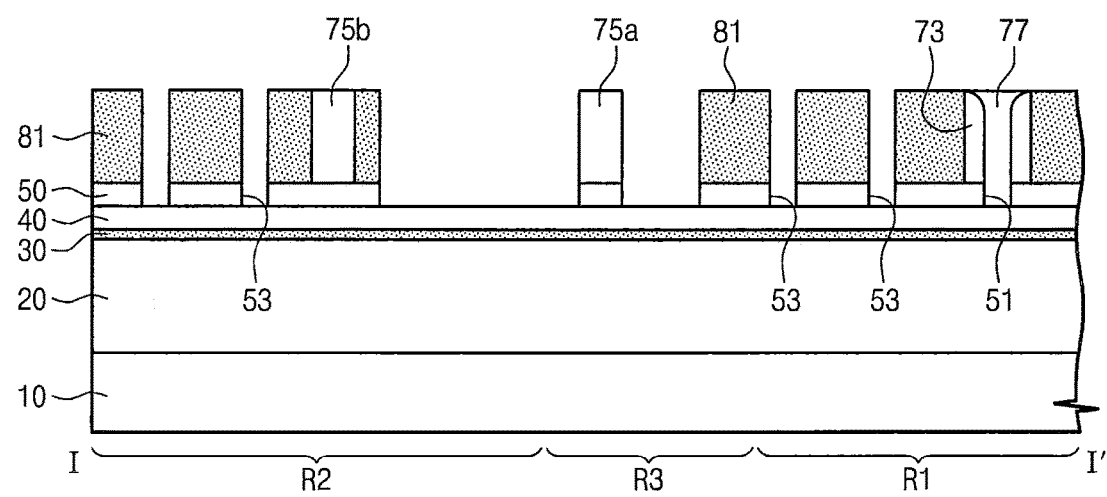

Referring to FIGS. 28A and 28B, the second block patterns 83 may be removed to expose portions of the buffer mask layer 50, and the exposed portions of the buffer mask layer 50 may be etched to form second holes 53.

In some embodiments, in the first region R1, the second holes 53 may be aligned with the second holes 53 in the diagonal direction s and each of the second holes 53 may be disposed among three first holes 51 adjacent to the first holes 51. A width of the second holes 53 may be substantially equal to the width of the first holes 51.

Meanwhile, the second holes 53 may also be formed in the third region R3. In this case, a distance between the second hole 53 of the first region R2 and the second hole 53 of the third region R3 adjacent to each other may be greater than a distance between the second holes 53 adjacent to each other in the first region R1.

The first block patterns 81, the spacer patterns 73, the spacer pillars 75a, the sacrificial layers 77, and the dam pattern 75b may be removed after the second holes 53 are formed in the buffer mask layer 50. Thus, the first and second holes 51 and 53 of the buffer mask layer 50 may be exposed.

Figure 29A:
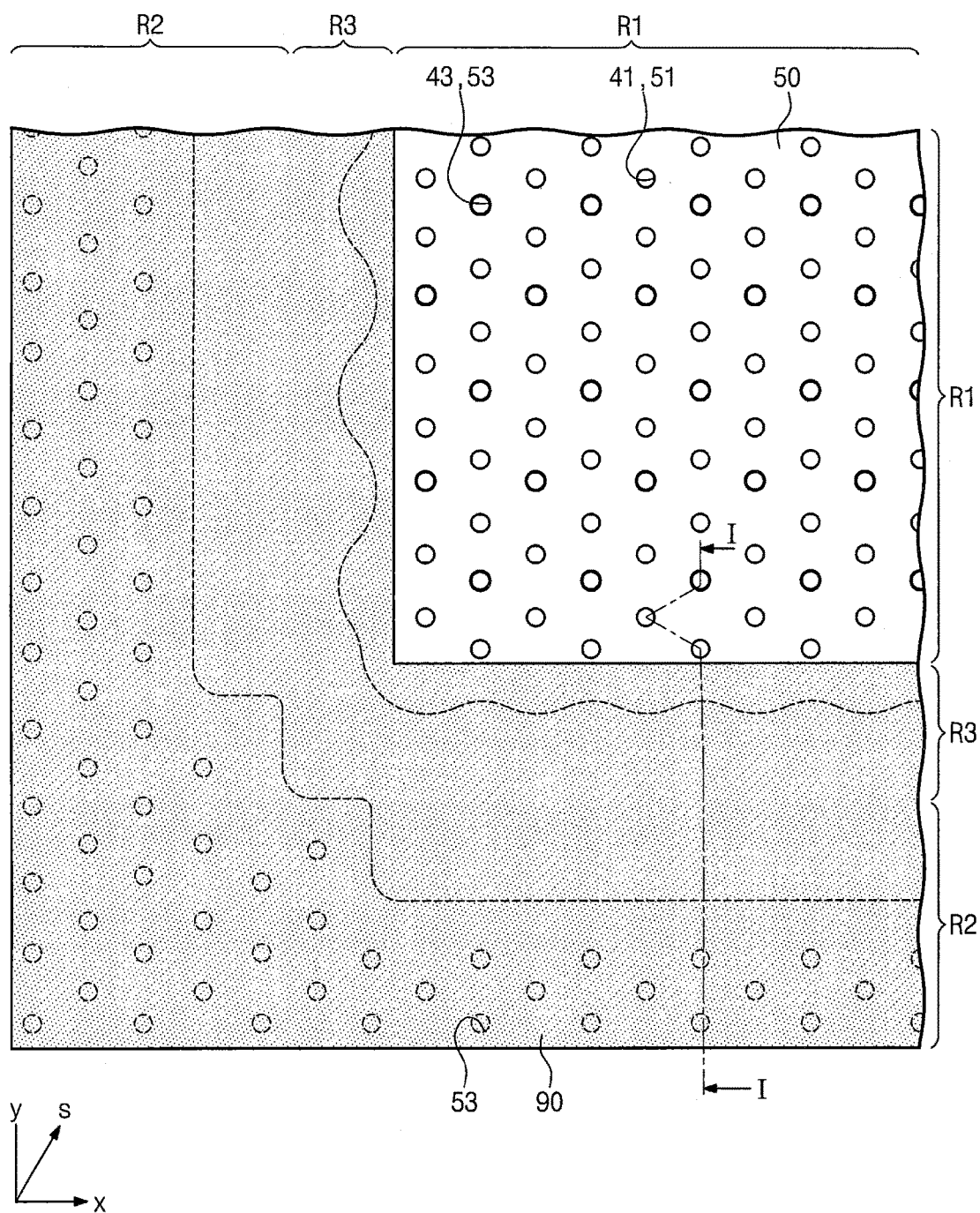
Figure 29B:
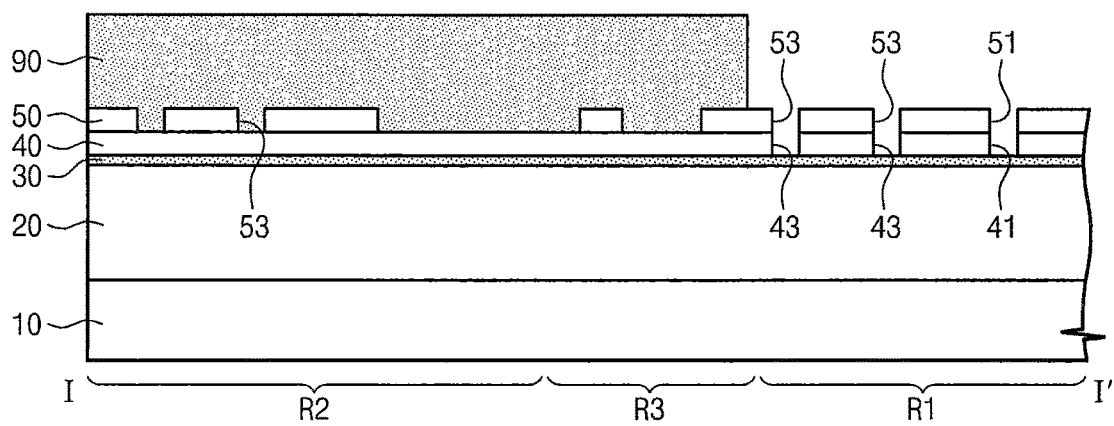

Referring to FIGS. 29A and 29B, a trimming mask pattern 90 defining a boundary of the first and third regions R1 and R3 may be formed on the buffer mask layer 50 having the first and second holes 51 and 53.

According to the present embodiment, the trimming mask pattern 90 may cover the buffer mask layer 50 of the second and third regions R2 and R3 and may expose the first and second holes 51 and 53 formed in the first region R1. In the present embodiment, because the first and second holes 51 and 53 are locally and regularly formed in the first region R1, it is possible to improve a process margin of the trimming mask pattern 90 covering the second and third regions R2 and R3. If the second holes 53 are formed in the buffer mask layer 50 in the third region R3, the trimming mask pattern 90 may fill the second holes 53 of the third region R3.

After the formation of the trimming mask pattern 90, the hard mask layer 40 exposed by the first and second holes 51 and 53 of the first region R1 may be anisotropically etched to form first and second fine holes 41 and 43 in the hard mask layer 40 of the first region R1.

Next, the trimming mask pattern 90 and the buffer mask layer 50 may be removed, and the lower layer 20 of the first region R1 may be anisotropically etched using the hard mask layer 40 having the first and second fine holes 41 and 42 as an etch mask.

A method of manufacturing a semiconductor device using the fine pattern forming method described above will be described hereinafter. The semiconductor device according to embodiments of the inventive concept may include a highly integrated semiconductor memory device (e.g., a dynamic random access memory (DRAM) device, a static RAM (SRAM) device, a phase change RAM (PRAM) device, a resistance RAM (RRAM) device, a magnetic RAM (MRAM) device, a ferroelectric RAM (FRAM) device, or a flash memory device), a micro-electro mechanical system (MEMS) device, an optoelectronic device, or a processor (e.g., a central processing unit (CPU) or a digital signal processor (DSP)). In addition, the semiconductor device may consist of the same kind of semiconductor devices or a single chip data processing device. For example, the single chip data processing device may be a system-on-chip (SoC) which consists of different kinds of semiconductor devices to provide one complete function.

Hereinafter, a semiconductor memory device formed using the fine pattern forming method according to the aforementioned embodiments will be described with reference to FIGS. 30A and 30B.

Figure 30A:
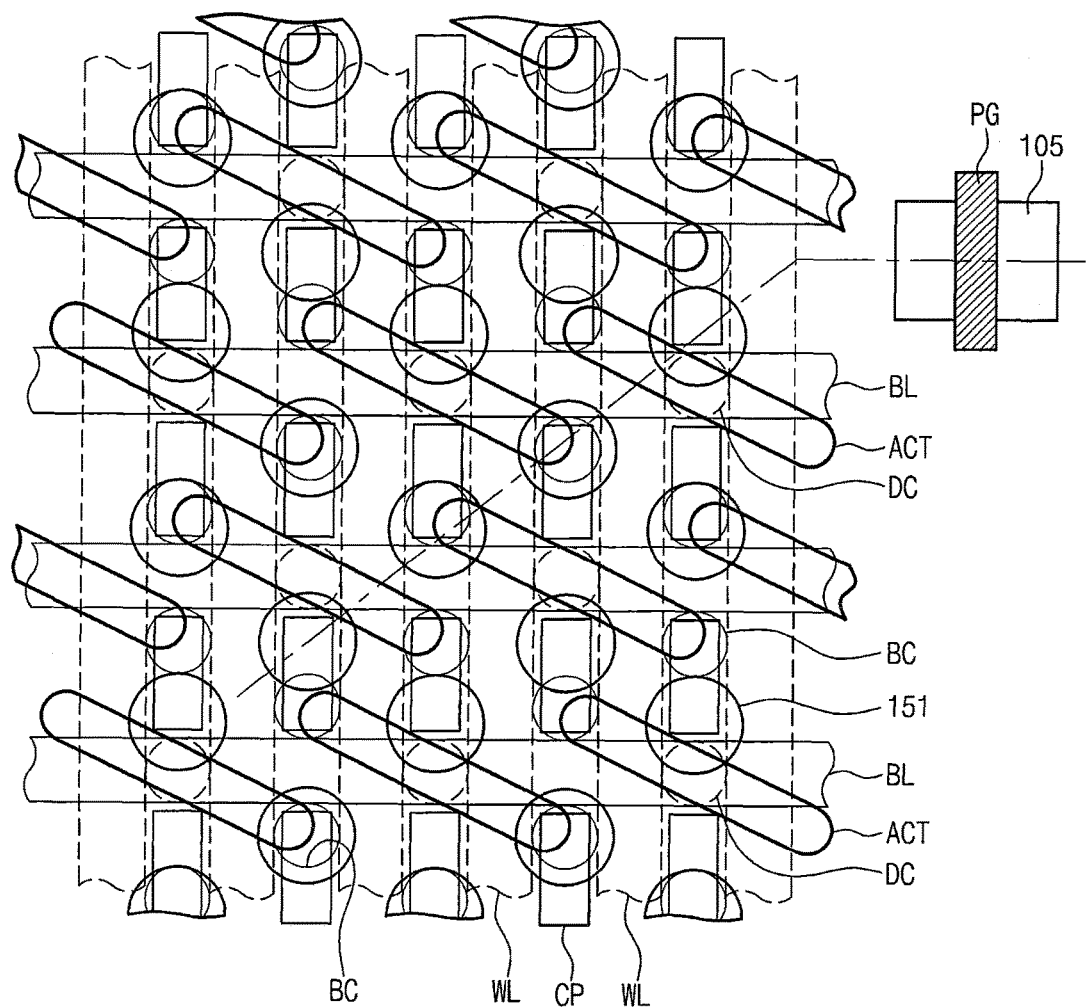
FIG. 30A is a plan view illustrating a semiconductor memory device formed using a method for forming a fine pattern according to embodiments of the inventive concept.

FIG. 30A is a plan view illustrating a semiconductor memory device formed using a method for forming a fine pattern according to embodiments of the inventive concept. FIG. 30B is a cross-sectional view taken along a line I-I' of FIG. 30A.

Figure 30B:
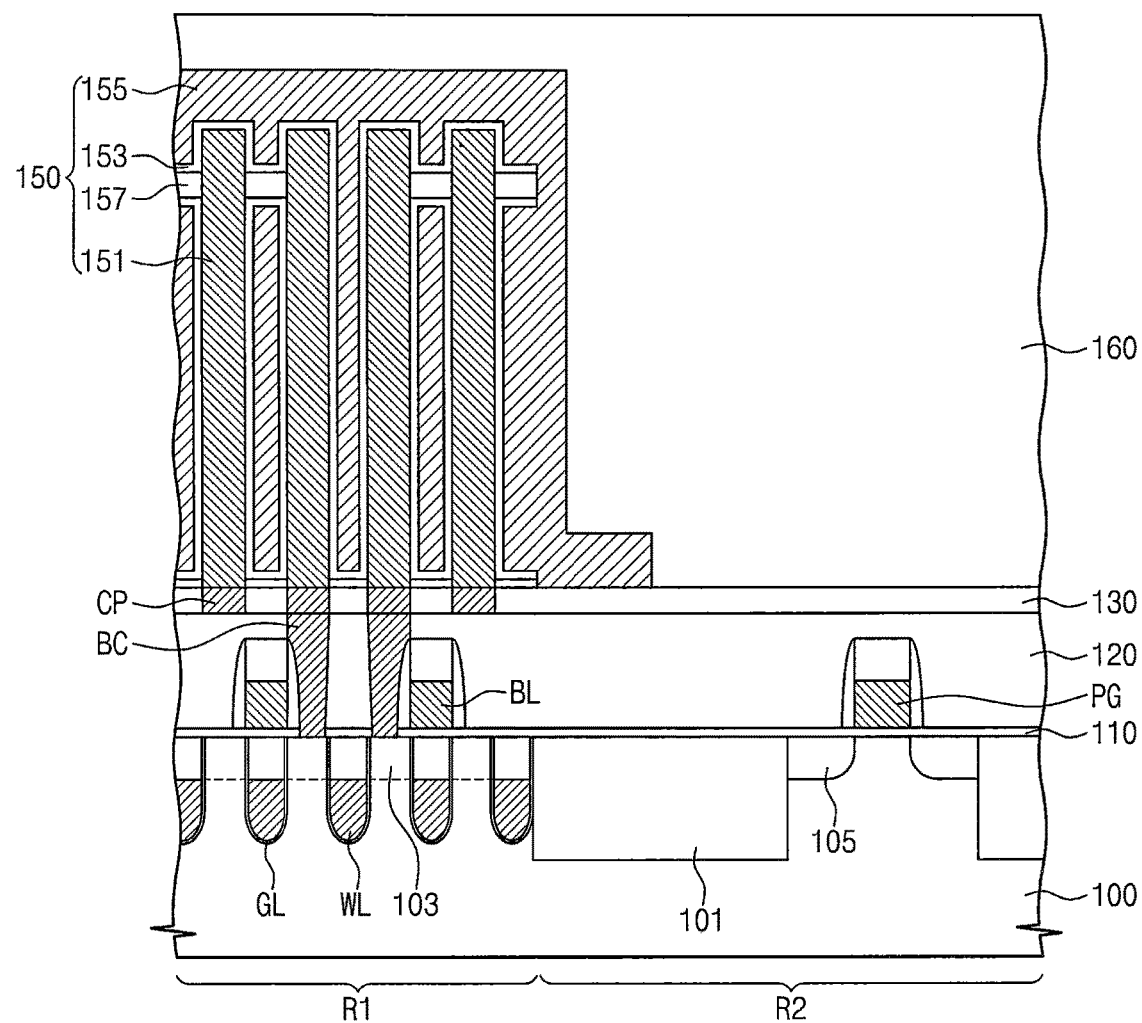
FIG. 30B is a cross-sectional view taken along a line I-I' of FIG. 30A.

Referring to FIGS. 30A and 30B, a semiconductor substrate 100 may include a first region R1 and a second region R2 around the first region R1. In some embodiments, the first region R1 may be a cell array region, and the second region R2 may be a peripheral circuit region.

A memory cell array including a plurality of memory cells may be disposed on the semiconductor substrate 100 in the first region R1. The memory cell array may further include a plurality of word lines WL and a plurality of bit lines BL electrically connected to the memory cells. In some embodiments, each of the memory cells may include a capacitor 150 including a lower electrode 151, an upper electrode 155, and a dielectric layer 153 disposed between the lower and upper electrodes 150 and 151. In addition, a support pattern 157 may horizontally connect the lower electrodes 151 of the memory cells 151 to each other to prevent or reduce the likelihood of the lower electrodes 151 from leaning.

A peripheral circuit including row and column decoders, a page buffer, and an input/output circuit may be disposed on the semiconductor substrate 100 in the second region R2. In some embodiments, the peripheral circuit may include complementary metal-oxide-semiconductor (CMOS) transistors, a resistor, and a capacitor, which are electrically connected to the memory cell array.

In more detail, a device isolation layer 101 may be formed in the semiconductor substrate 100 of the first region R1 to define active regions ACT. Here, the active regions ACT may have bar shapes when viewed from a plan view. A long axis of each of the active regions WL may be parallel to a diagonal direction to the word lines WL and the bit lines BL.

The word lines WL may intersect the active regions ACT. In some embodiments, the word lines WL may be formed in recess regions that are recessed from a top surface of the semiconductor substrate 100 by a predetermined depth. A gate insulating layer may be disposed between each of the word lines WL and an inner surface of each of the recess regions. In addition, top surfaces of the word lines WL may be lower than the top surface of the semiconductor substrate 100, and an insulating material may fill each of the recess regions on the word line WL.

Source/drain regions 103 may be formed in each of the active regions ACT at both sides of the word line WL. The source/drain regions 103 may be dopant regions doped with dopants. The word lines WL and the source/drain regions 103 may be formed to realize a plurality of MOS transistors on the semiconductor substrate 100 of the first region R1.

Bit lines BL may be disposed on the semiconductor substrate 100 of the first region R1 to cross over the word lines WL. A first interlayer insulating layer 110 may be disposed between the semiconductor substrate 100 and the bit lines BL, and bit line contact plugs DC may be formed in the first interlayer insulating layer 110. The bit line contact plug DC may electrically connect the bit line BL to the source/drain region 103.

The device isolation layer 101 in the semiconductor substrate 100 of the second region R2 may define a peripheral active region. A peripheral gate electrode PG may cross over the peripheral active region, and peripheral source/drain regions 105 may be formed in the peripheral active region at both sides of the peripheral gate electrode PG.

A second interlayer insulating layer 120 may cover the bit lines BL of the first region R1 and the peripheral gate electrode PG of the second region R2. Contact plugs BC may be formed in the second interlayer insulating layer 120 of the first region R1. The contact plugs BC may electrically connect data storage elements (e.g., the lower electrodes 151) to the source/drain regions 103. In some embodiments, the contact plugs BC may be disposed on the active region ACT at both sides of the bit line BL. The contact plugs BC may be arranged in a honeycomb form or a zigzag form when viewed from a plan view. In other words, the contact plugs BC may be formed using the fine pattern forming method according to the aforementioned embodiments in the first region R1.

Contact holes exposing the source/drain regions 103 may be formed in the second interlayer insulating layer 120, and a conductive layer may be deposited on the second interlayer insulating layer 120 to fill the contact holes. The conductive layer may be planarized to form the contact plugs BC. The contact plug BC may be formed of at least one of a poly-silicon layer doped with dopants, a metal layer, a metal nitride layer, or a metal silicide layer.

In some embodiments, contact pads CP may be formed on the contact plugs BC, respectively. The contact pads CP may be two-dimensionally arranged on the second interlayer insulating layer 120 of the first region R1. The contact pad CP may increase a contact area between the contact plug BC disposed under the contact pad CP and the lower electrode 151 formed on the contact pad CP. In detail, two contact patterns CP that are adjacent to each other with the bit line BL interposed therebetween may be enlarged in opposite direction to each other. A space between the contact pads CP may be filled with a third interlayer insulating layer 130.

The lower electrode 151 of the capacitor 150 may be formed on each of the contact pads CP. In some embodiments, the lower electrodes 151 may be arranged in a honeycomb form or a zigzag form when viewed from a plan view. In other words, the lower electrodes of the first region R1 may be formed using the fine pattern forming method according to the aforementioned embodiments.

After the formation of the lower electrodes 151, the dielectric layer 153 may be formed to conformally cover surfaces of the lower electrodes 151, and the upper electrode 155 may be formed on the dielectric layer 153. After the capacitors 150 are formed in the first region R1, a filling insulating layer 160 may be formed to cover the first and second regions R1 and R2.

Figure 31:
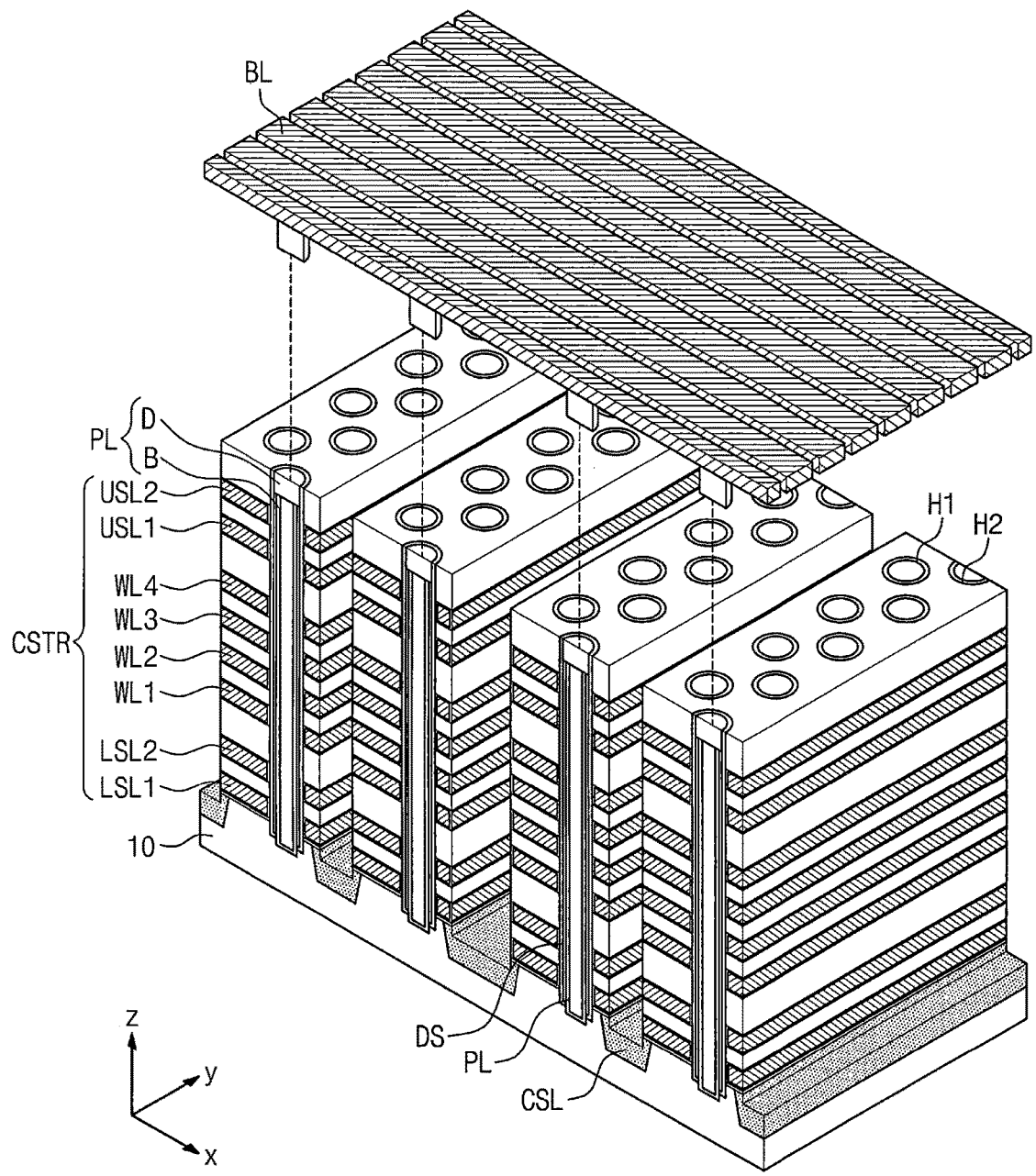
FIG. 31 is a perspective view illustrating a three-dimensional (3D) semiconductor memory device formed using a method for forming a fine pattern according to embodiments of the inventive concept.

FIG. 31 is a perspective view illustrating a three-dimensional (3D) semiconductor memory device formed using a method for forming a fine pattern according to embodiments of the inventive concept.

Referring to FIG. 31, a substrate 10 may include a first region and a second region, like the semiconductor substrate 100 of FIGS. 30A and 30B. A memory cell array may be formed in the first region. The memory cell array of the 3D semiconductor memory device according to an embodiment may include common source lines CSL, bit lines BL, and cell strings CSTR connected between the common source lines CSL and the bit lines BL.

The common source line CSLs may each be a conductive thin layer disposed on the substrate 10 or a dopant region formed in the substrate 10. The bit lines BL may be conductive patterns (e.g., metal lines) that are vertically spaced apart from the substrate 10. The bit lines BL may be two-dimensionally arranged and a plurality of the cell strings CSTR may be connected in parallel to each of the bit lines BL. When viewed from a plan view, the cell strings CSTR may be two-dimensionally arranged on the substrate 10.

Each of the cell strings CSTR may include a plurality of lower selection lines LSL1 and LSL2, a plurality of word lines WL1 to WL4, and a plurality of upper selection lines USL1 and USL, which are disposed between the common source line CSL and the bit lines BL. The lower selection lines LSL1 and LSL2, the word lines WL1 to WL4, and the upper selection lines USL1 and USL2 may be conductive patterns that are stacked on the substrate 10 with insulating layers interposed therebetween.

Each of the cell strings CSTR may further include a semiconductor pillar PL that vertically extends from the substrate 10 so as to be connected to the bit line BL. The semiconductor pillars PL may penetrate the lower selection lines LSL1 and LSL2, the word lines WL1 to WL4, and the upper selection lines USL1 and USL2. In other words, the semiconductor pillars PL may penetrate a plurality of conductive patterns stacked on the substrate 10. The semiconductor pillar PL may include a body portion B and a dopant region formed in one end portion or both end portions of the body portion B. For example, a drain region D may be formed in a top end portion of the semiconductor pillar PL. In other words, the drain region D may be disposed between the body portion B and the bit line BL.

A data storage layer DS may be disposed between each of the semiconductor pillars PL and the word lines WL1 to WL4. In some embodiments, the data storage layer DS may include a charge storage layer. For example, the data storage layer DS may include one of a trap insulating layer, a floating gate electrode, or an insulating layer including conductive nano dots.

A dielectric layer used as a gate insulating layer of a transistor may be disposed between the semiconductor pillar PL and the lower selection lines LSL1 and LSL2 and/or between the semiconductor pillar PL and the upper selection lines USL1 and USL2. In some embodiments, the dielectric layer may be formed of the same material as the data storage layer DS. Alternatively, the dielectric layer may be a gate dielectric layer (e.g., a silicon oxide layer) as used in a MOS field effect transistor.

In the structure described above, the semiconductor pillar PL, the lower selection lines LSL1 and LSL2, the word lines WL1 to WL4, and the upper selection lines USL1 and USL2 may constitute MOS field effect transistors (MOSFETs) using the semiconductor pillar PL as channel regions. Alternatively, the semiconductor pillar PL, the lower selection lines LSL1 and LSL2, the word lines WL1 to WL4, and the upper selection lines USL1 and USL2 may constitute MOS capacitors. In other words, the cell string CSTR may include lower selection transistors realized by the lower selection lines LSL1 and LSL2, cell transistors realized by the word lines WL1 to WL4, and upper selection transistors realized by the upper selection lines USL1 and USL2, which are connected in series to each other.

In the 3D semiconductor memory device described above, the semiconductor pillars PL may be formed using the fine pattern forming method according to the aforementioned embodiments.

In more detail, a stack structure may be formed on the substrate 10. The stack structure may include insulating layers and conductive layers that are alternately and repeatedly stacked. The conductive layers may be used for the formation of the lower selection lines LSL1 and LSL2, the word lines WL1 to WL4, and the upper selection lines USL1 and USL2. The stack structure may correspond to the lower layer 20 described in the aforementioned embodiments. The lower holes H of FIGS. 9A and 9B arranged in the zigzag form may be formed in the stack structure. Thereafter, the data storage layer DS and the semiconductor pillar PL may be formed in each of the lower holes H of FIGS. 9A and 9B.

Figure 32:
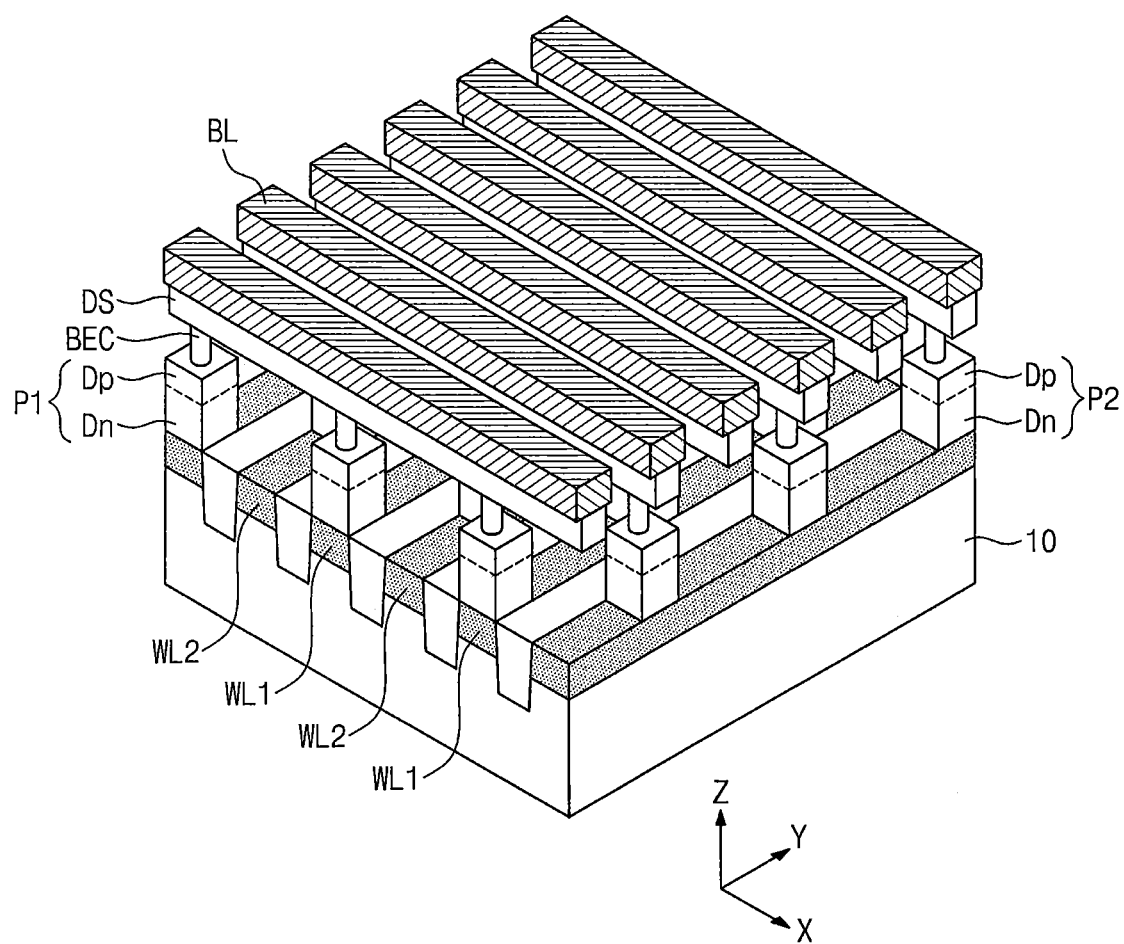
FIG. 32 is a perspective view illustrating a variable resistance memory device formed using a method for forming a fine pattern according to embodiments of the inventive concept.

FIG. 32 is a perspective view illustrating a variable resistance memory device formed using a method for forming a fine pattern according to embodiments of the inventive concept.

Referring to FIG. 32, a substrate 10 may include a first region and a second region like the semiconductor substrate 100 of FIGS. 30A and 30B. A memory cell array may be formed in the first region. The substrate 10 may be a semiconductor substrate. The memory cell array of the variable resistance memory device according to an embodiment may include lower interconnections WL1 and WL2 on the substrate 10, upper interconnections BL intersecting the lower interconnections WL1 and WL2, a selection element disposed in each of the intersection regions of the upper interconnections BL and the lower interconnections WL1 and WL2, and a memory element disposed between each of the selection elements and each of the upper interconnections BL. The selection elements may be two-dimensionally arranged on the substrate 10. The selection element may control a flow of a current passing through the memory element.

In more detail, the lower interconnections WL1 and WL2 may have line shapes extending in a y-axis direction. In some embodiments, the lower interconnections WL1 and WL2 may be dopant regions that are formed by injecting dopants into the substrate 10. A conductivity type of the lower interconnections WL1 and WL2 may be opposite to that of the substrate 10.

In the present embodiment, the selection elements may include semiconductor patterns P1 and P2. The semiconductor patterns P1 and P2 may be formed in the lower holes H of FIGS. 9A and 9B formed by the fine pattern forming method described above. Thus, the semiconductor patterns P1 and P2 may be arranged in a zigzag form on the substrate 10.

In more detail, the selection elements may include first semiconductor patterns P1 disposed on odd-numbered lower interconnections WL1 and second semiconductor patterns P2 disposed on even-numbered lower interconnections WL2. A pitch of the first and second semiconductor patterns P1 and P2 in an x-axis direction may be two or more times greater than a pitch of the lower interconnections WL1 and WL2 in the x-axis direction. The second semiconductor patterns P2 may be disposed on the even-numbered interconnections WL2 and may be aligned with the first semiconductor patterns P1 in a diagonal direction to the x-axis and y-axis directions.

Each of the first and second semiconductor patterns P1 and P2 may include an upper dopant region Dp and a lower dopant region Dn that have opposite conductivity types to each other. For example, the lower dopant region Dn may have the same conductivity type as the lower interconnections WL1 and WL2, and the conductivity type of the upper dopant region Dp may be opposite to that of the lower dopant region Dn. Thus, a PN may be formed in each of the first and second semiconductor patterns P1 and P2. Alternatively, an intrinsic region may be disposed between the upper dopant region Dp and the lower dopant region Dn so that a PIN junction may be formed in each of the first and second semiconductor patterns P1 and P2. A bipolar transistor having a PNP or NPN structure may be realized by the substrate 10, the lower interconnection WL1 or WL2, and the semiconductor pattern P1 or P2.

Bottom electrodes BEC, the memory elements DS, and the upper interconnections BL may be disposed on the first and second semiconductor patterns P1 and P2. The upper interconnections BL may cross over the lower interconnections WL1 and WL2 and may be disposed on the memory elements DS. The upper interconnections BL may be electrically connected to the memory elements DS.

In some embodiments, each of the memory elements DS may be parallel to the upper interconnections BL and may be connected to a plurality of bottom electrodes BEC. Alternatively, the memory elements DS may be two-dimensionally arranged and may be spaced apart from each other in the x-axis and y-axis directions. In other words, the memory elements DS may be disposed on the first and second semiconductor patterns P1 and P2, respectively. Each of the memory elements DS may be a variable resistance pattern that is switchable between two resistance states by an electrical pulse applied thereto. In some embodiments, the memory element DS may include a phase-change material of which a phase is changed depending on a supplied current amount. In other embodiments, the memory element DS may include a perovskite compound or a transition metal oxide. In still other embodiments, the memory element DS may include a magnetic material or a ferromagnetic material. If the memory element DS includes the magnetic or ferromagnetic material, the memory element DS may further include anti-ferromagnetic material.

Each of the bottom electrodes BEC may be disposed between each of the first and second semiconductor patterns P1 and P2 and one of the memory elements DS. A planar area of the bottom electrode BEC may be smaller than a planar area of each of the first and second semiconductor patterns P1 and P2 or a planar area of the memory element DS.

In some embodiments, each of the bottom electrodes BEC may have a pillar shape. In other embodiments, a shape of the bottom electrode BEC may be variously modified to reduce a cross-sectional area of the bottom electrode BEC. For example, the bottom electrode BEC may have a U-shaped cross section, an L-shaped cross section, a hollow cylindrical shape, a ring shape, or a cup shape.

In addition, an ohmic layer for reducing a contact resistance may be disposed between each of the bottom electrodes BEC and each of the first and second semiconductor patterns P1 and P2. For example, the ohmic layer may include a metal silicide, such as titanium silicide, cobalt silicide, tantalum silicide, or tungsten silicide.

Figure 33:
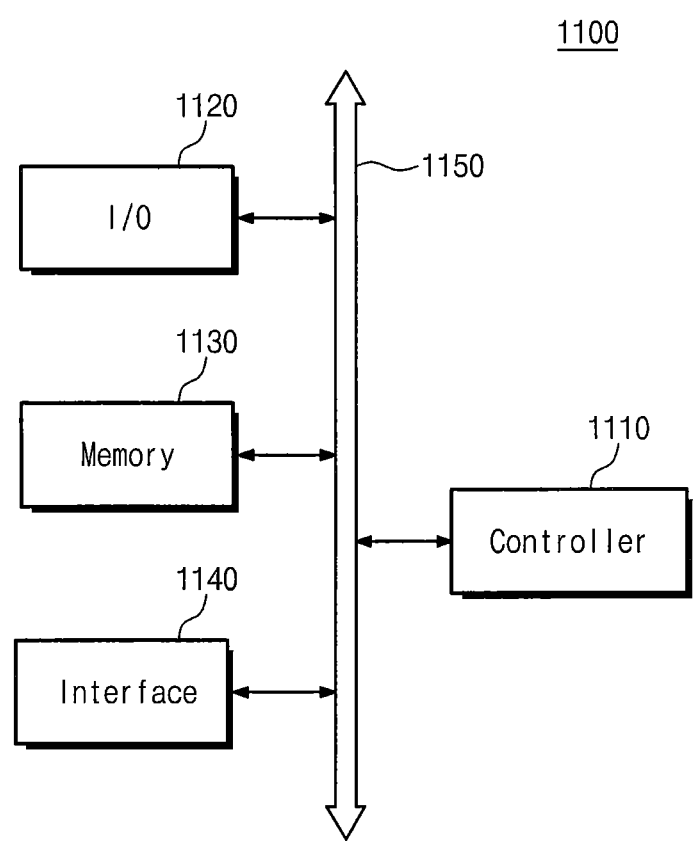
FIG. 33 is a schematic block diagram illustrating an example of an electronic system including a semiconductor device formed using a method for forming a fine pattern according to embodiments of the inventive concept.

FIG. 33 is a schematic block diagram illustrating an example of an electronic system including a semiconductor device formed using a method for forming a fine pattern according to embodiments of the inventive concept.

Referring to FIG. 33, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. At least one of the controller 1110, the I/O unit 1120, the memory device 1130, and the interface unit 1140 may include at least one of the semiconductor devices according to the aforementioned embodiments of the inventive concept.

The controller 1110 may include at least one of a microprocessor, a digital signal processor, a microcontroller or other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a wireless/cable transceiver. Although not shown in the drawings, the electronic system 1100 may further include a fast dynamic random access memory (DRAM) device and/or a fast static random access memory (SRAM) device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 34:
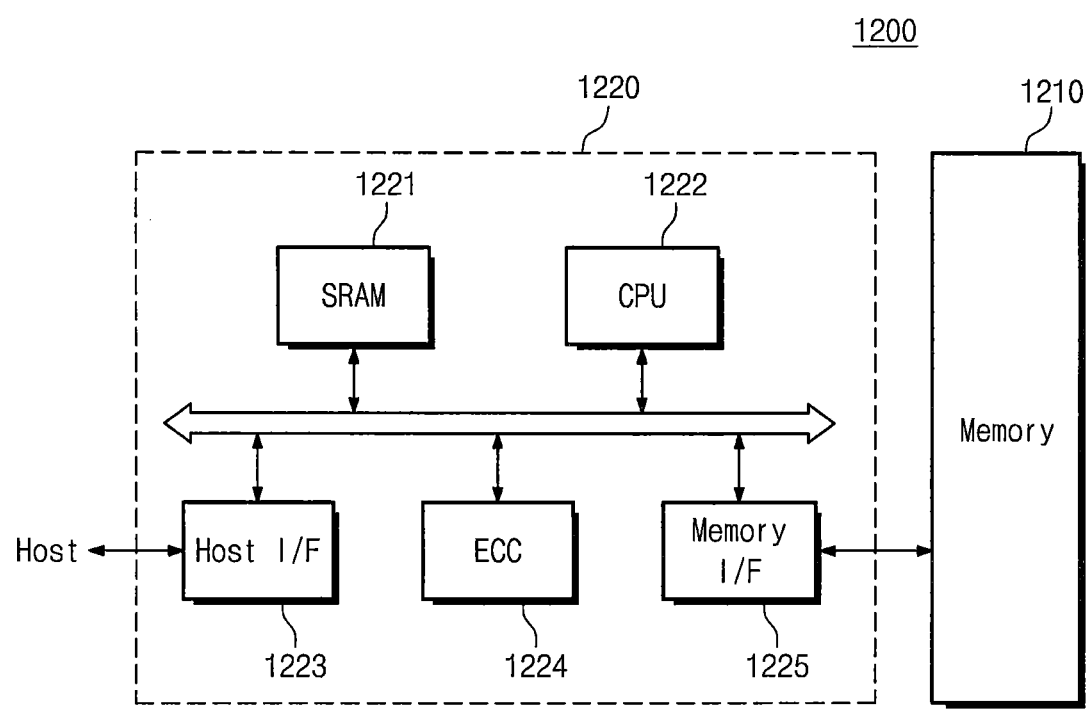
FIG. 34 is a schematic block diagram illustrating another example of an electronic system including a semiconductor device formed using a method for forming a fine pattern according to embodiments of the inventive concept.

FIG. 34 is a schematic block diagram illustrating another example of an electronic system including a semiconductor device formed using a method for forming a fine pattern according to embodiments of the inventive concept.

Referring to FIG. 34, a memory card 1200 for storing massive data may include a memory device 1210 implemented with at least one of the semiconductor memory devices according to the aforementioned embodiments of the inventive concept. The memory card 1200 may further include a memory controller 1220 that controls data communication between a host and the memory device 1210. The memory controller 1220 may include at least one the semiconductor devices according to the aforementioned embodiments of the inventive concept.

A SRAM device 1221 may be used as a working memory of a central processing unit (CPU) 1222. A host interface unit 1223 may be configured to include a data communication protocol between the memory card 1200 and the host. An error check and correction (ECC) block 1224 may detect and correct errors of data, which are read out from the memory device 1210. A memory interface unit 1225 may interface with the flash memory device 1210. The CPU 1222 may control overall operations of the memory controller 1220 for exchanging data. Even though not shown in the drawings, the memory card 1200 may further include a read only memory (ROM) storing code data for interfacing with the host.

Figure 35:
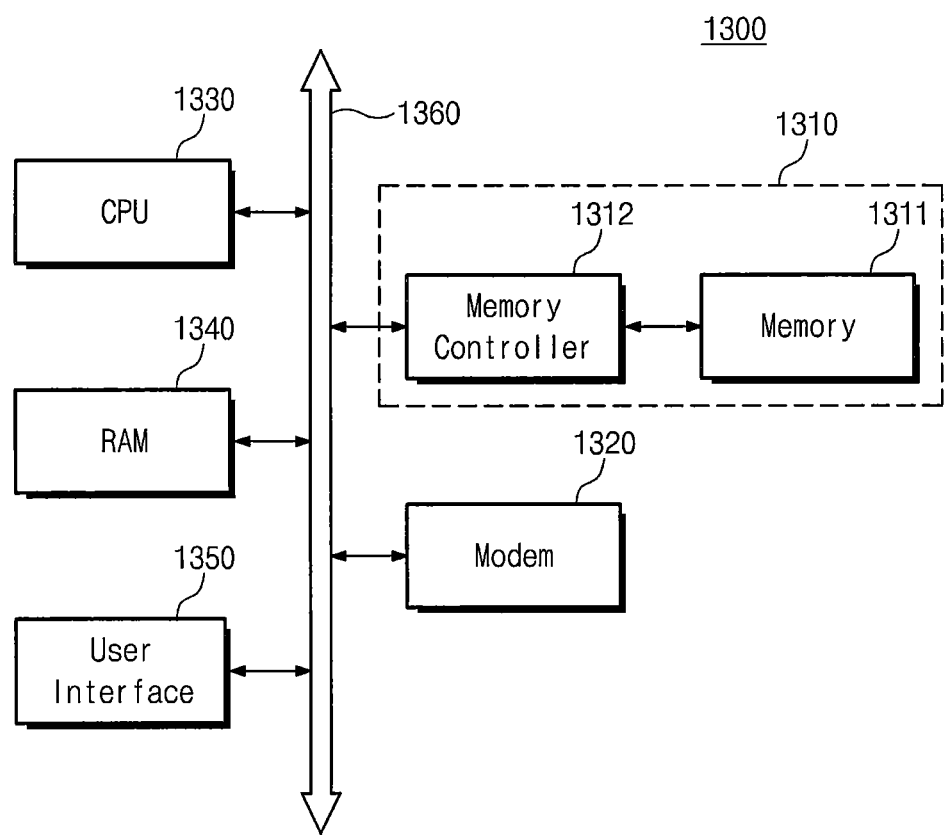
FIG. 35 is a schematic block diagram illustrating still another example of an electronic system including a semiconductor device formed using a method for forming a fine pattern according to embodiments of the inventive concept.

FIG. 35 is a schematic block diagram illustrating still another example of an electronic system including a semiconductor device formed using a method for forming a fine pattern according to embodiments of the inventive concept.

Referring to FIG. 35, an information processing system 1300 (e.g., a mobile device or a desk top computer) may include a memory system 1310 implemented with at least one of the semiconductor devices according to the above embodiments of the inventive concept. The information processing system 1300 may further include a modem 1320, a central processing unit (CPU) 1330, a RAM device 1340, and a user interface unit 1350 which are electrically connected to the memory system 1310 through a system bus 1360. The memory system 1310 may include a memory device 1311 and a memory controller 1312. In some embodiments, the memory system 1310 may be substantially the same as the memory card described above. The memory system 1310 may store data input from an external system and/or data processed by the CPU 1330. In some embodiments, the memory system 1310 may be realized as a solid state disk (SSD). In this case, the information processing system 1300 may stably store massive data into the memory system 1310. In addition, as reliability of the memory system 1310 increases, the memory system 1310 may reduce a resource consumed for correcting errors to provide a fast data exchange function to the information processing system 1300. Even though not shown in the drawings, an application chipset, a camera image processor (CIS), and an input/output unit may further be provided in the information processing system 1300.

In the method for forming the fine patterns according to embodiments of the inventive concept, sizes of the pillars inducing the self-assembly of the block patterns in the first region may be different from those of the pillars inducing the self-assembly of the block patterns in the second region when the fine patterns are formed using the block copolymer layer. Thus, a pattern density of the block patterns in the first region may be different from that of the block patterns in the boundary region of the first and second regions after the formation of the block patterns. This means that an overlay margin of the trimming mask pattern covering the second region may be improved when the fine patterns are formed, using the block patterns, in the first region.

In addition, a density of the pillars inducing the self-assembly in the first region may be different from that of the pillars including the self-assembly in the second region. Since the force inducing the self-assembly is varied depending on the density of the pillars, it is possible to confinedly form the block patterns in the first region. In other words, the fine patterns may be selectively formed in the first region by the block patterns confinedly formed in the first region.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept are to be determined by the broadest permissible interpretation of the following claims and their equivalents, and shall not be restricted or limited by the foregoing description.

What is claimed is:

1. A method for forming fine patterns of a semiconductor device, the method comprising:
   forming a buffer mask layer on a hard mask layer including a first region and a second region around the first region, the buffer mask layer having first holes in the first region;
   forming first pillars and second pillars, the first pillars filling the first holes and disposed on the buffer mask layer in the first region, the second pillars disposed on the buffer mask layer in the second region, the first pillars having a first width, and the second pillars having a second width smaller than the first width;
   forming a block copolymer layer covering the first and second pillars on the buffer mask layer;
   phase-separating the block copolymer layer to form first block patterns spaced apart from the first and second pillars and a second block pattern surrounding the first and second pillars and the first block patterns; and
   removing the first block patterns and forming second holes in the buffer mask layer under the first block patterns.

2. The method of claim 1, wherein each of the first pillars comprises: a sacrificial pillar of which a lower portion fills each of the first holes of the buffer mask layer; and a spacer pattern surrounding an upper portion of the sacrificial pillar on the buffer mask layer.

3. The method of claim 1, wherein each of the first block patterns is disposed among at least three of the first pillars, which are adjacent to each other.

4. The method of claim 1, wherein one of the second holes is disposed at a first distance from one of the first holes adjacent thereto in a diagonal direction, in the first region,
   wherein one of the second holes disposed in an edge region of the second region is disposed at a second distance from one of the second holes disposed in an edge region of the first region in the diagonal direction, and
   wherein the second distance is greater than the first distance.

5. The method of claim 1, wherein widths of the first and second holes are smaller than the first and second widths of the first and second pillars.

6. The method of claim 1, wherein forming the buffer mask layer having the first holes comprises:
   forming a mask pattern on the buffer mask layer, the mask pattern including first openings having the first width in the first region;
   forming a spacer pattern having a gap region in each of the first openings, the gap region exposing a portion of the buffer mask layer; and
   etching the portions of the buffer mask layer exposed by the gap regions to form the first holes.

7. The method of claim 1, further comprising:
   forming a trimming mask pattern filling the second holes in the second region and covering the buffer mask layer second region, a sidewall of the trimming mask pattern being disposed between the second holes in the second region and the second holes disposed in an edge region of the first region when viewed from a plan view; and
   transferring the first and second holes of the buffer mask layer to the hard mask layer using the trimming mask pattern and the buffer mask layer as etch masks.

8. A method for forming fine patterns of a semiconductor device, the method comprising:
   forming a buffer mask layer on a hard mask layer including a first region and a second region around the first region, the buffer mask layer having first holes in the first region and second holes in the first and second regions;
   forming a trimming mask pattern filling the second holes in the second region and covering the buffer mask layer in the second region, a sidewall of the trimming mask pattern being disposed between the second holes in the second region and the second holes disposed in an edge region of the first region when viewed from a plan view; and
   forming first and second fine holes by transferring the first and second holes of the buffer mask layer to the hard mask layer, respectively, using the trimming mask pattern and the buffer mask layer as etch masks.

9. The method of claim 8, wherein the first and second fine holes are arranged in a zigzag form in the first region.

10. The method of claim 8, wherein widths of the first and second fine holes are substantially equal to widths of the first and second holes, respectively.

11. The method of claim 8, wherein a distance between adjacent second holes formed in the first and second regions is greater than a distance between second holes adjacent to each other in the first region.

12. The method of claim 8, further comprising:
   forming first pillars and second pillars, the first pillars filling the first holes and disposed on the buffer mask layer in the first region, the second pillars disposed on the buffer mask layer in the second region, the first pillars having a first width, and the second pillars having a second width smaller than the first width;
   forming a block copolymer layer covering the first and second pillars on the buffer mask layer;
   phase-separating the block copolymer layer to form first block patterns spaced apart from the first and second pillars and a second block pattern surrounding the first and second pillars and the first block patterns; and
   removing the first block patterns to form the second holes in the buffer mask layer under the first block patterns.

* * * * *